United States Patent
Jang et al.

(10) Patent No.: US 11,082,052 B2
(45) Date of Patent: Aug. 3, 2021

(54) FREQUENCY LOCK LOOP CIRCUITS, LOW VOLTAGE DROPOUT REGULATOR CIRCUITS, AND RELATED METHODS

(71) Applicant: Texas Instruments Incorporated, Dallas, TX (US)

(72) Inventors: Byungchul Jang, Allen, TX (US); Adam Lee Shook, Carrollton, TX (US); Pankaj Pandey, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/854,584

(22) Filed: Apr. 21, 2020

(65) Prior Publication Data
US 2021/0111726 A1    Apr. 15, 2021

Related U.S. Application Data

(60) Provisional application No. 62/923,324, filed on Oct. 18, 2019, provisional application No. 62/913,895, filed on Oct. 11, 2019.

(51) Int. Cl.
| | | |
|---|---|---|
| G06F 1/04 | (2006.01) | |
| G06F 3/041 | (2006.01) | |
| H03K 3/00 | (2006.01) | |
| H03K 3/012 | (2006.01) | |
| H03L 7/099 | (2006.01) | |

(Continued)

(52) U.S. Cl.
CPC .............. *H03L 7/099* (2013.01); *G05F 1/575* (2013.01); *G05F 1/59* (2013.01); *H03K 17/567* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 8,711,119 B2* | 4/2014 | Liu | ........................ | G06F 3/0416 345/173 |
| 9,698,728 B2* | 7/2017 | Kamath | .............. | H04L 25/0268 |
| 10,116,286 B2* | 10/2018 | Lee | ...................... | H03K 3/0231 |

OTHER PUBLICATIONS

Rod Burt and Joy Zhang, "A Micropower Chopper-Stabilized Operational Amplifier Using a SC Notch Filter With Synchronous Integration Inside the Continuous-Time Signal Path," IEEE Journal of Solid-State Circuits, vol. 41, No. 12, Dec. 2006, pp. 2729-2736 (8 pages).

* cited by examiner

*Primary Examiner* — Kenneth B Wells
(74) *Attorney, Agent, or Firm* — Lawrence J. Bassuk; Charles A. Brill; Frank D. Cimino

(57) ABSTRACT

Frequency lock loop (FLL) circuits, low voltage dropout regulator circuits, and related methods are disclosed. An example gate driver integrated circuit includes a first die including a FLL circuit to generate a first clock signal having a first phase and a first frequency, a second clock signal having the first frequency and a second phase different from the first phase, and control a plurality of switching networks to increase the first frequency to a second frequency, and generate a feedback voltage based on the second frequency, and a second die coupled to the first die, the second die including a low dropout (LDO) circuit and a driver, the driver configured to control a transistor based on the first frequency, the second die configured to be coupled to the transistor, the LDO circuit to generate a pass-gate voltage based on an output current of the LDO circuit satisfying a current threshold.

16 Claims, 24 Drawing Sheets

(51) Int. Cl.
  *G05F 1/59*     (2006.01)
  *G05F 1/575*    (2006.01)
  *H03K 17/687*   (2006.01)
  *H03K 17/567*   (2006.01)

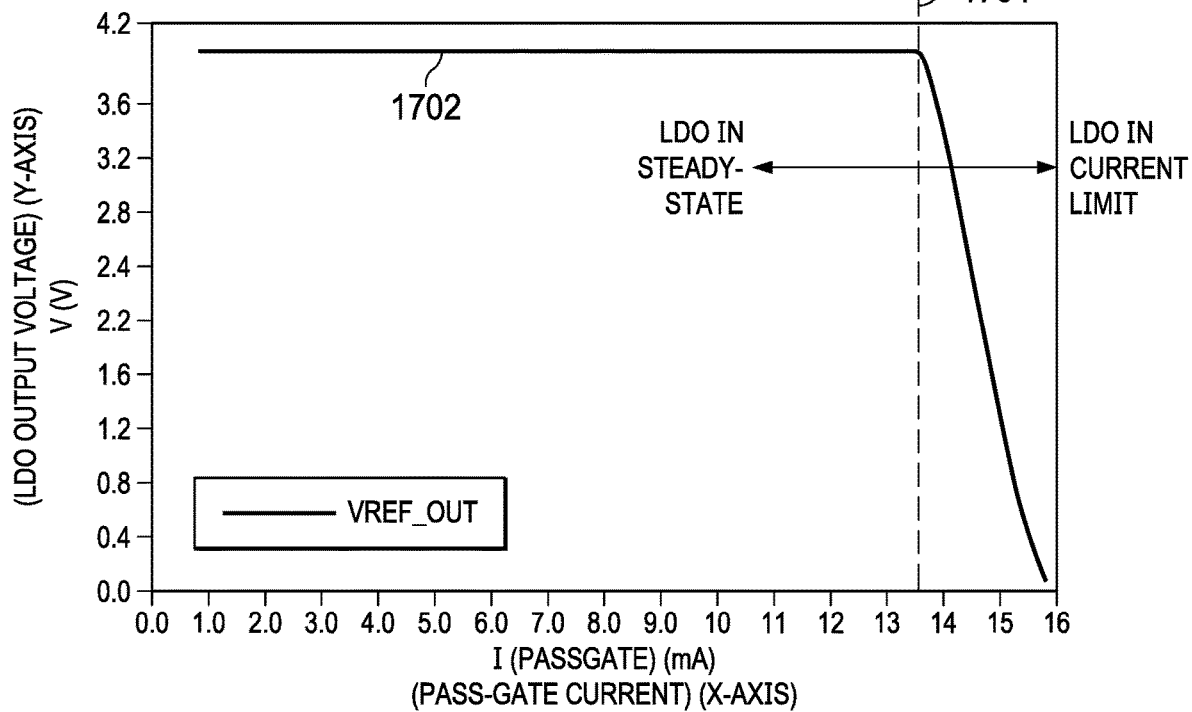

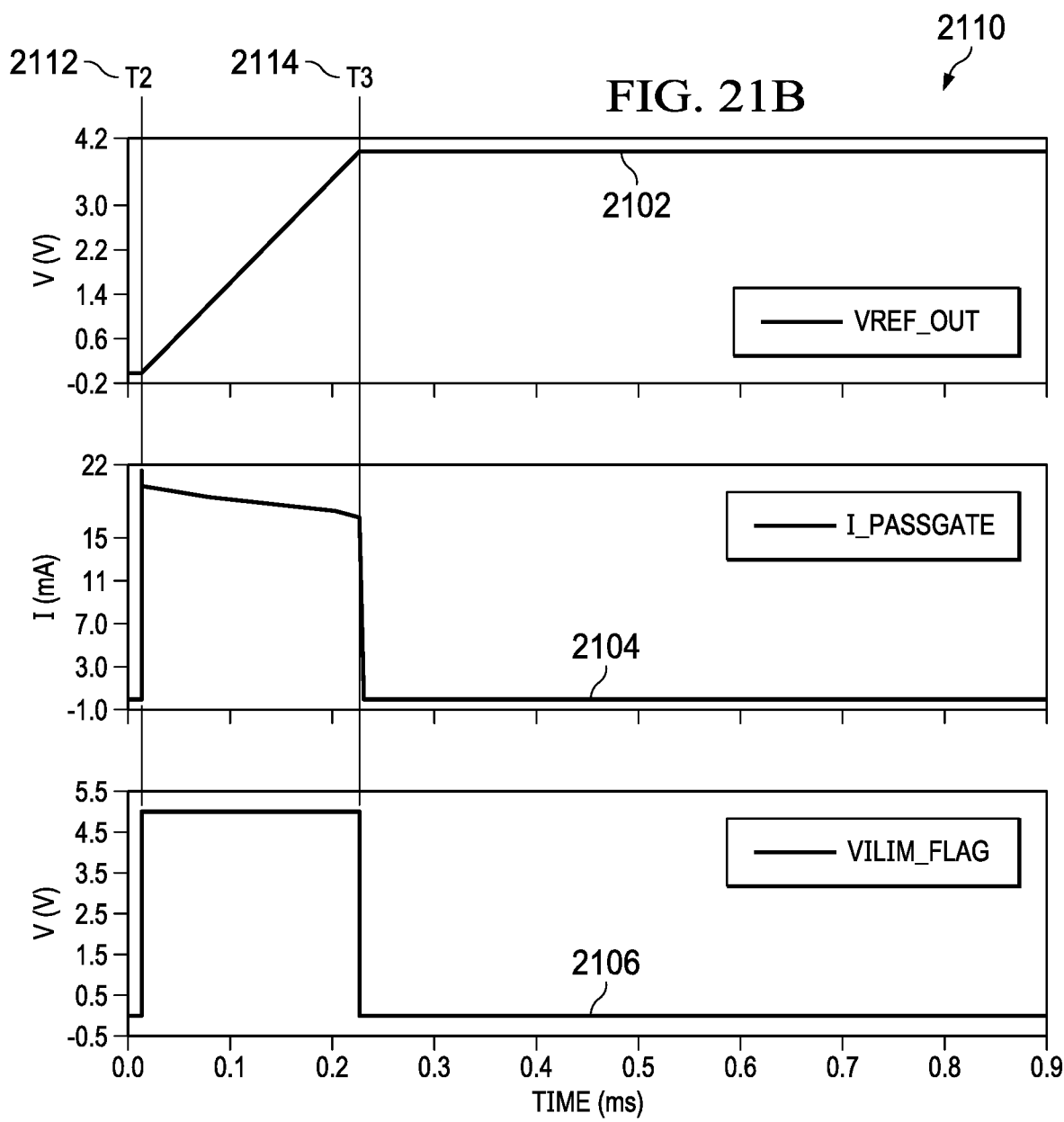

FREQUENCY LOCK LOOP CIRCUITS, LOW VOLTAGE DROPOUT REGULATOR CIRCUITS, AND RELATED METHODS

RELATED APPLICATION

This patent arises from an application claiming the benefit of U.S. Provisional Patent Application No. 62/913,895, which was filed on Oct. 11, 2019, and U.S. Provisional Patent Application No. 62/923,324, which was filed on Oct. 18, 2019. U.S. Provisional Patent Application No. 62/913,895 and U.S. Provisional Patent Application No. 62/923,324 are hereby incorporated herein by reference in their entireties. Priority to U.S. Provisional Patent Application No. 62/913,895 and U.S. Provisional Patent Application No. 62/923,324 is hereby claimed.

FIELD OF THE DISCLOSURE

This disclosure relates generally to circuits and, more particularly, to frequency lock loop circuits, low voltage dropout regulator circuits, and related methods.

BACKGROUND

Frequency Lock Loop (FLL) is a technique used to implement an accurate oscillator to generate clock signals with increased robustness over process, voltage, and temperature variation in an integrated circuit. Many base-band communication applications, such as Universal Serial Bus (USB) applications, and clock-data recovery (CDR) circuits benefit from a clock reference having an accurate clock frequency.

In recent years, demand for low-dropout (LDO) regulators has been increasing because of their efficient power management in portable, automotive, and industrial applications. Many of external capacitor based LDOs have a current limit to reduce power consumption, improve integrated circuit and/or system reliability, and improve safety in related applications. When LDOs are being driven relatively close to their limit and/or are otherwise in limit mode, it is desirable for LDOs to have predictable behavior(s) so that an integrated chip or circuit (IC) and the corresponding system including the IC are protected.

BRIEF DESCRIPTION OF THE DRAWINGS

FIG. 17 depicts a graph of an example LDO output voltage waveform associated with the LDO circuit of FIGS. 1, 15A-15C, and/or 16A-16C.

FIGS. 21A-21B depict graphs of an example voltage waveform and an example current waveform associated with the LDO circuit of FIGS. 1, 15A-15C, and/or 16A-16C during an example transition operation.

DETAILED DESCRIPTION

Figure 1:
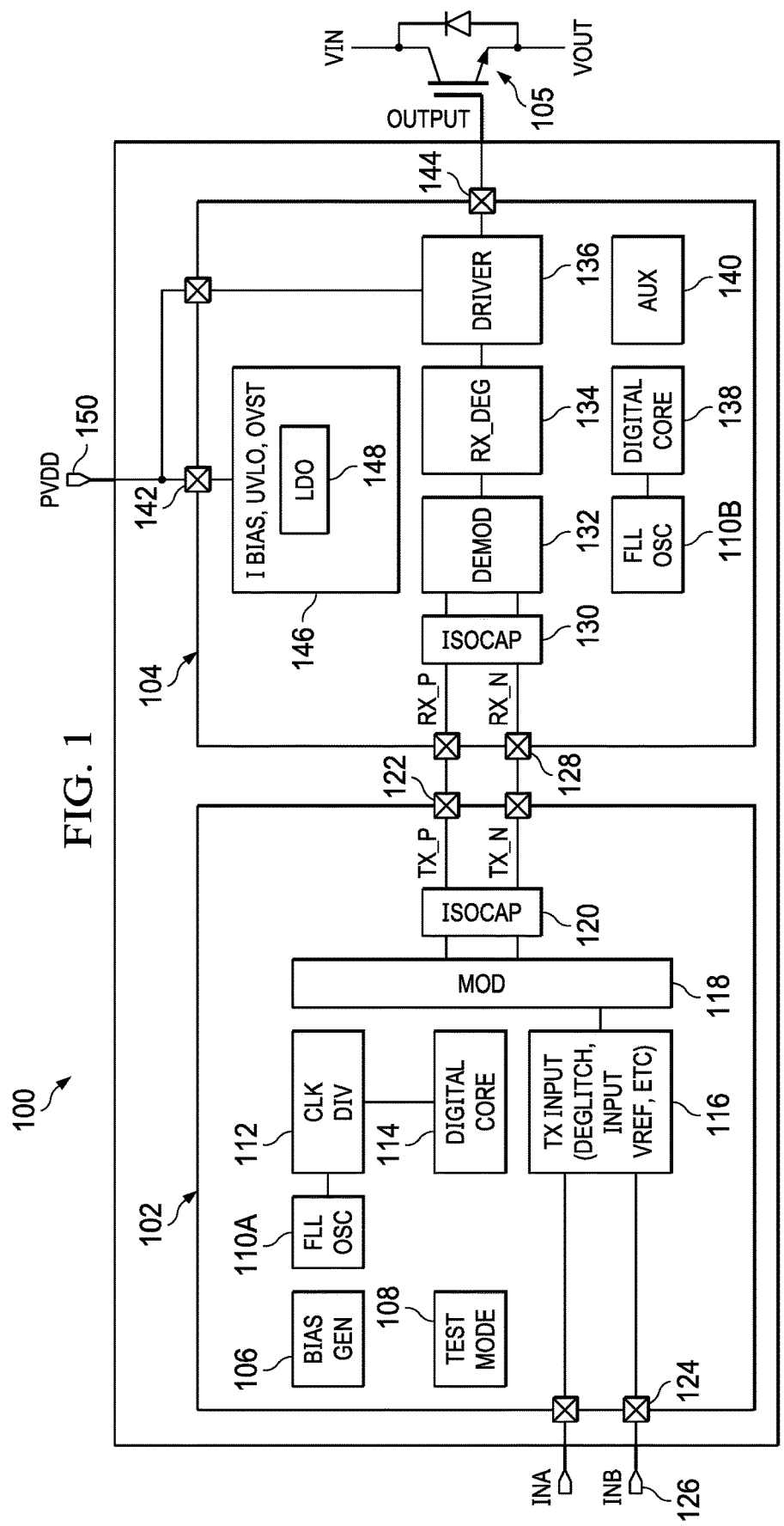
FIG. 1 is a schematic illustration of an example isolated gate driver integrated device including an example frequency lock loop (FLL) circuit and an example low-dropout (LDO) circuit.

The figures are not to scale. In general, the same reference numbers will be used throughout the drawing(s) and accompanying written description to refer to the same or like parts. As used herein, connection references (e.g., attached, coupled, connected, and joined) are to be construed in light of the specification and, when pertinent, the surrounding claim language. Construction of connection references in the present application shall be consistent with the claim language and the context of the specification, which describes the purpose for which various elements are connected or coupled. As such, connection references do not necessarily infer that two elements are directly connected or directly coupled and in fixed relation to each other.

The term "couple" is used throughout the specification. The term may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" purports to describe the structural and functional characteristics of one or more tangible non-transitory components. For example, a device that is "configured to" perform a function can be understood to mean that the device has a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this should not be understood as requiring that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

Descriptors "first," "second," "third," etc., are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

A circuit that utilizes frequency lock loop (FLL) (e.g., frequency locked loop) can generate a signal that is locked and/or otherwise mapped to a frequency of an input or reference signal. For example, a FLL can generate a signal based on a comparison of a first frequency of an output signal and a second frequency of the input or reference signal.

Because FLL is typically associated with a negative feedback loop, FLL can require a reference generator, an operational amplifier (op-amp), a voltage controlled oscillator (VCO), and a frequency-to-voltage (F2V) converter. Typically, a circuit that includes an F2V converter may include relatively large (e.g., large in physical size) passive filtering components, such as capacitors, to minimize the relatively large output ripples of the F2V converter. For example, a ripple, such as a ripple voltage, can be a residual periodic variation of a direct-current (DC) voltage that has been derived from an alternating-current (AC) source. In such examples, the ripple can be generated in response to an incomplete suppression of the alternating waveform after rectification. However, the relatively large size of the passive filtering components can cause correspondingly relatively large usage of silicon area. In some instances, the passive filtering components can cause a relatively slow loop response or may require a low frequency zero. In some instances, the passive filtering components can cause unfiltered harmonics to invoke frequency fluctuation associated with an output of the FLL.

Examples discussed herein include FLL circuits with low and/or otherwise minimized ripple. In some discussed examples, the FLL circuits at least double a quantity of switched-capacitor circuits to at least double an effective switching frequency of typical FLL circuits. In some discussed examples, the FLL circuits include a switched capacitor notched filter to reduce and/or otherwise remove all harmonics of the ripple. Thus, the FLL circuits can cause only a DC component to remain after filtering by the switched capacitor notched filter to feed and/or otherwise drive an op-amp included in the FLL circuits. Advantageously, the FLL circuits discussed herein reduce a quantity and/or a size of one(s) of filtering components typically used in FLL circuits, which, in turn, reduce an area (e.g., a silicon area, a semiconductor area, etc.) of the FLL circuits discussed herein when compared to typical FLL circuits.

A linear voltage regulator is a circuit that receives, as an input, a variable input voltage, and provides, as an output, a continuously controlled, steady, low-noise DC output voltage. Typically, linear voltage regulators require a relatively large voltage drop between the input and the output to function as desired. Such a relatively large voltage drop may require a relatively high-voltage input power supply and, thus, may result in low-power efficiency. A low-dropout (LDO) regulator (e.g., an LDO linear regulator, an LDO linear voltage regulator, etc.) is a type of linear voltage regulator (e.g., a linear voltage regulator circuit) that can operate in instances when the output voltage is relatively close to the input voltage and, thus, can be used to improve power efficiency.

Typical LDOs include external capacitors. Such LDOs have a main regulation loop to implement a voltage limit (e.g., a voltage limit circuit, a voltage limit control loop, etc.) and a current regulation loop to implement a current limit (e.g., a current limit circuit, a current limit control loop, etc.). LDOs can include the current regulation loop to save power, improve integrated circuit (IC) and/or system reliability, and improve safety of related applications.

The current limit in LDOs can control a pass-gate of the LDOs and, in some instances, can counteract the main regulation loop. Thus, the two control loops (e.g., the main regulation loop and the current regulation loop) of the LDOs can significantly interact and cause one loop to overcome the other loop. Such interactions can cause inaccurate and/or oscillatory behavior, which can cause overall control instability. In some LDOs, comparator-based current limits are used to mitigate the control instability from the interactions of the two control loops. However, the comparator-based current limits do not provide smooth handoffs, or transition operations, from one loop to the other loop. As a result, the comparator-based current limits can cause relatively large voltage spikes during such transitions between loops. In some comparator-based current limits, depending on comparator delay, the loop associated with the comparator-based current limits may not be regulated at startup and can cause undesirable startup circuit behaviors.

Examples discussed herein include LDOs (e.g., low-voltage LDOs) that limit current to effectuate a well-behaved current limit control loop and smooth handoff from a main regulation control loop. In some discussed examples, the LDOs employ frequency compensation (e.g., Miller-compensated regulation) to implement the well-behaved current limit control loop and/or the smooth handoff. In some discussed examples, the LDOs utilize a ratio-based current-sensing loop with forcing drain-to-source voltage (VDS) of one or more field-effect transistors (FETs) to be substantially similar and/or otherwise the same. In some discussed examples, the LDOs rescale a current limit to generate a current limit reference to implement different current limit settings. In some discussed examples, the LDOs include a first stage of a current limit amplifier that drives a second stage of the current limit amplifier while a compensation capacitor is between an output of the first stage and a buffer output of the current limit amplifier, which can be configured as an input of a pass-gate of the current limit amplifier.

FIG. 1 is a schematic illustration of an example isolated gate driver integrated device 100 including a first example die 102 and a second example die 104. In the example of FIG. 1, the isolated gate driver integrated device 100 is a gate driver integrated circuit (e.g., an isolated gate driver integrated circuit) that includes one or more integrated circuits. The isolated gate driver integrated device 100 of FIG. 1 is coupled to an example FET 105. For example, the FET 105 can be a Silicon Carbide (SiC) FET, a Silicon (Si) FET, a metal-oxide-semiconductor FET (MOSFET) (e.g., a SiC MOSFET, a Si MOSFET, etc.). Alternatively, the FET 105 may be any other type of transistor, such as an insulated-gate bipolar transistor (IGBT).

The FET 105 can be a pass-gate transistor coupled to one or more loads. In some examples, the load(s) can be automotive electrical component(s) and/or system(s). For example, the isolated gate driver integrated device 100 can be included in a high-voltage and/or high-current isolated gate driver environment and/or application, such as a traction inverter in an electric vehicle (EV), a hybrid-electric vehicle (HEV), etc., to efficiently deliver power at elevated temperatures. In such examples, the FET 105 can deliver power to the load(s), which can be one or more batteries (e.g., lithium-ion batteries), an electronic control unit (ECU), a motor (e.g., an electric motor), a traction inverter, etc. In other examples, the FET 105 can deliver power to the load(s), which can be one or more processors of a computing device (e.g., a gaming console, a server, a workstation, etc.). Alternatively, the FET 105 may deliver power to any other type of electrical load.

In the illustrated example of FIG. 1, the first die 102 includes an example bias generator circuit (BIAS GEN) 106, an example test mode circuit (TEST MODE) 108, a first instance of an example frequency lock loop (FLL) circuit (FLL OSC) 110A, an example clock divider circuit (CLK DIV) 112, a first example digital core circuit (DIGITAL CORE) 114, an example transmit input circuit (TX INPUT) 116, an example modulator circuit (MOD) 118, a first example isolation capacitor circuit (ISOCAP) 120, example transmit terminals 122, and example input terminals 124. For example, one or more of the bias generator circuit 106, the test mode circuit 108, the first FLL circuit 110A, the clock divider circuit 112, the first digital core circuit 114, the transmit input circuit 116, the modulator circuit 118, and/or the first isolation capacitor circuit 120 can be implemented using one or more integrated circuits. In FIG. 1, the input terminals 124 are coupled to and/or otherwise configured to be coupled to example inputs (e.g., input signals) 126.

In the illustrated example of FIG. 1, the first die 102 includes the bias generator circuit 106 to generate one or more biasing currents, voltages, etc., to be used by different component(s) of the first die 102. In FIG. 1, the first die 102 includes the test mode circuit 108 to operate one or more components of the first die 102 under a manufacturing, testing, or any other controlled environment or set of operating conditions. In FIG. 1, an output of the first FLL circuit 110A is coupled to an input of the clock divider circuit 112. In FIG. 1, an output of the clock divider circuit 112 is coupled to an input of the first digital core circuit 114.

In the illustrated example of FIG. 1, the first die 102 includes the first FLL circuit 110A to generate a signal that is locked to a reference signal. For example, the first FLL circuit 110A can generate a locked signal and transmit the locked signal to the clock divider circuit 112. In FIG. 1, the first die 102 includes the clock divider circuit 112 to receive an input signal having a first frequency and generate an output signal having a second frequency, where the second frequency is based on a ratio of the first frequency and an integer. For example, the clock divider circuit 112 can receive the locked signal having a first frequency (FIN) from the first FLL circuit 110A, generate an output signal having a second frequency (FOUT), where FOUT is based on FIN an integer (N) (e.g., FOUT=FIN/N).

In the illustrated example of FIG. 1, the first die 102 includes the first digital core circuit 114 to provide and/or otherwise effectuate the handling of startup and shutdown sequences of various blocks or components depicted in the first die 102. The first digital core circuit 114 can be configured to act and/or otherwise execute as a communication hub between one or more of the blocks, components, logic circuitry, etc., depicted in the first die 102. In FIG. 1, the first die 102 includes the transmit input circuit 116 to receive signal(s) from the inputs 126 at the input terminals 124, process the received signal(s), and transmit the processed signal(s) to the modulator circuit 118. For example, the transmit input circuit 116 can execute a deglitch function or process on the signal(s) from the inputs 126.

In the illustrated example of FIG. 1, the first die 102 includes the modulator circuit 118 to receive signal(s) from the transmit input circuit 116 and modulate the received signal(s) to generate modulated signal(s). The modulator circuit 118 can deliver the modulated signal(s) to the first isolation capacitor circuit 120. In FIG. 1, the first die 102 includes the first isolation capacitor circuit 120 to provide isolation between the first die 102 and the second die 104 to allow for different voltage to be used on the respective sides of the isolated gate driver integrated circuit 100. For example, the first isolation capacitor circuit 120 can include one or more capacitors (e.g., Silicon Dioxide (SiO2) capacitors) and/or any other type of electrical components to isolate the input side (e.g., the first die 102) from the output side (e.g., the second die 104) of the isolated gate driver integrated circuit 100. In FIG. 1, the first die 102 includes the transmit terminals 122 to transmit signal(s) from the modulator circuit 118 to example receive terminals 128 of the second die 104.

In the illustrated example of FIG. 1, the second die 104 includes a second example FLL circuit (FLL OSC) 110B, which is a second instance of the first FLL circuit 110A of the first die 102. The second die 104 includes the receive terminals 128, a second example isolation capacitor circuit 130, an example demodulator circuit (DEMOD) 132, an example receiver deglitch circuit (RX DEG) 134, an example driver circuit 136, a second example digital core circuit 138, example auxiliary circuit(s) (AUX) 140, example input voltage terminals 142, an example output voltage terminal 144, and example voltage processing circuit(s) 146 that include an example LDO (e.g., a low dropout circuit, an LDO circuit, an LDO integrated circuit, an LDO logic circuit, etc.) 148. For example, one or more of the second FLL circuit 110B, the second isolation capacitor circuit 130, the demodulator circuit 132, the receiver deglitch circuit 134, the driver circuit 136, the second digital core circuit 138, the auxiliary circuit(s) 140, the voltage processing circuit(s) 146, and/or the LDO 148 can be implemented by one or more integrated circuits.

In the illustrated example of FIG. 1, the input voltage terminals 142 are coupled to and/or otherwise configured to be coupled to an example voltage source (PVDD) 150. In FIG. 1, the input voltage terminals 142 are coupled to an input of the driver circuit 136 and an input of the voltage processing circuitry 146. In the second die 104, an output of the second FLL circuit 110B is coupled to an input of the second digital core circuit 138.

In the illustrated example of FIG. 1, the second die 104 includes the second isolation capacitor circuit 130 to receive signal(s) from the first die 102 at the receive terminals 128 and transmit the received signal(s) to the demodulator circuit 132. In FIG. 1, the second die 104 includes the demodulator circuit 132 to receive the signal(s) from the second isolation capacitor circuit 130, demodulate the received signal(s), and transmit the demodulated signal(s) to the receiver deglitch circuit 134. In FIG. 1, the second die 104 includes the receiver deglitch circuit 134 to remove glitches from signals coming from the demodulator 132. In FIG. 1, the receiver deglitch circuit 134 transmits the demodulated signal(s) (e.g., the de-glitched, demodulated signal(s)) to the driver circuit 136.

In the illustrated example of FIG. 1, the second die 104 includes the driver circuit 136 to control the IGBT 105. For example, the driver circuit 136 can effectuate the switching operations of one or more transistors. In FIG. 1, the second die 104 includes the second FLL circuit 110B to generate frequency-locked loop signals to the second digital core circuit 138. In FIG. 1, the second digital core circuit 138 can be the same as the first digital core circuit 114. Alternatively, the first digital core circuit 114 may be different from the second digital core circuit 138. In FIG. 1, the auxiliary circuit(s) 140 can include one or more circuits that can execute tasks (e.g., logic functions, hardware-logic functions, etc.), such as power supply monitoring, clock monitoring, reference voltage monitoring, desaturation protection, built-in self-test (BIST) monitoring, etc., and/or a combination thereof.

In the illustrated example of FIG. 1, the second die 104 includes the voltage processing circuit(s) 146 to adjust, modify, and/or otherwise process a voltage from the voltage source 150. For example, the voltage processing circuit(s) 146 can include one or more bias current generator circuits (I BIAS), undervoltage lockout (UVLO) circuits, and/or over-voltage stress test (OVST) circuits.

In the illustrated example of FIG. 1, the voltage processing circuit(s) 146, and/or, more generally, the second die 104, includes the LDO 148 to deliver power to one or more components of the second die 104. In some examples, the LDO 148 delivers stable and predictable power by executing one or more regulation control loops, such as a voltage regulation control loop, a current regulation control loop, etc., and/or a combination thereof.

In the illustrated example of FIG. 1, the first FLL circuit 110A is implemented on the first die 102 and the second FLL circuit 110B is implemented on the second die 104. Alternatively, the first FLL circuit 110A and/or the second FLL circuit 110B may be implemented on a plurality of dies and/or in a plurality of integrated circuits.

In the illustrated example of FIG. 1, the LDO 148 is implemented in the voltage processing circuit(s) 146, and/or, more generally, the second die 104. Alternatively, the LDO 148 may be implemented separately from the voltage processing circuit(s) 146. Alternatively, the LDO 148 may be implemented on the first die 102. Alternatively, the LDO 148 may be implemented on both the first die 102 and the second die 104. Alternatively, the LDO 148 may be implemented on a plurality of dies and/or a plurality of integrated circuits.

While an example manner of implementing the isolated gate driver integrated device 100 is illustrated in FIG. 1, one or more of the elements, processes and/or devices illustrated in FIG. 1 may be combined, divided, re-arranged, omitted, eliminated and/or implemented in any other way. Further, the example bias generator circuit 106, the example test mode circuit 108, the first example FLL circuit 110A, the second example FLL circuit 110B, the example clock divider circuit 112, the first example digital core circuit 114, the example transmit input circuit 116, the example modulator circuit 118, the first example isolation capacitor circuit 120, the second example isolation capacitor circuit 130, the example demodulator circuit 132, the example receiver deglitch circuit 134, the example driver circuit 136, the second example digital core circuit 138, the example auxiliary circuit(s) 140, the example voltage processing circuit(s) 146, the LDO 148, and/or, more generally, the isolated gate driver integrated device 100 of FIG. 1 may be implemented by hardware, software, firmware and/or any combination of hardware, software and/or firmware. Thus, for example, any of the example bias generator circuit 106, the example test mode circuit 108, the first example FLL circuit 110A, the second example FLL circuit 110B, the example clock divider circuit 112, the first example digital core circuit 114, the example transmit input circuit 116, the example modulator circuit 118, the first example isolation capacitor circuit 120, the second example isolation capacitor circuit 130, the example demodulator circuit 132, the example receiver deglitch circuit 134, the example driver circuit 136, the second example digital core circuit 138, the example auxiliary circuit(s) 140, the example voltage processing circuit(s) 146, the LDO 148, and/or, more generally, the isolated gate driver integrated device 100 of FIG. 1 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example bias generator circuit 106, the example test mode circuit 108, the first example FLL circuit 110A, the second example FLL circuit 110B, the example clock divider circuit 112, the first example digital core circuit 114, the example transmit input circuit 116, the example modulator circuit 118, the first example isolation capacitor circuit 120, the second example isolation capacitor circuit 130, the example demodulator circuit 132, the example receiver deglitch circuit 134, the example driver circuit 136, the second example digital core circuit 138, the example auxiliary circuit(s) 140, the example voltage processing circuit(s) 146, and/or the LDO 148 is/are hereby expressly defined to include a non-transitory computer or hardware readable storage device or storage disk such as non-volatile memory (e.g., ROM, EEPROM, flash memory, etc.), volatile memory (e.g., SDRAM, DRAM, etc., and/or any other type of RAM device), etc., including the software and/or firmware. Further still, the example isolated gate driver integrated device 100 of FIG. 1 may include one or more elements, processes and/or devices in addition to, or instead of, those illustrated in FIG. 1, and/or may include more than one of any or all of the illustrated elements, processes and devices.

Figure 2:
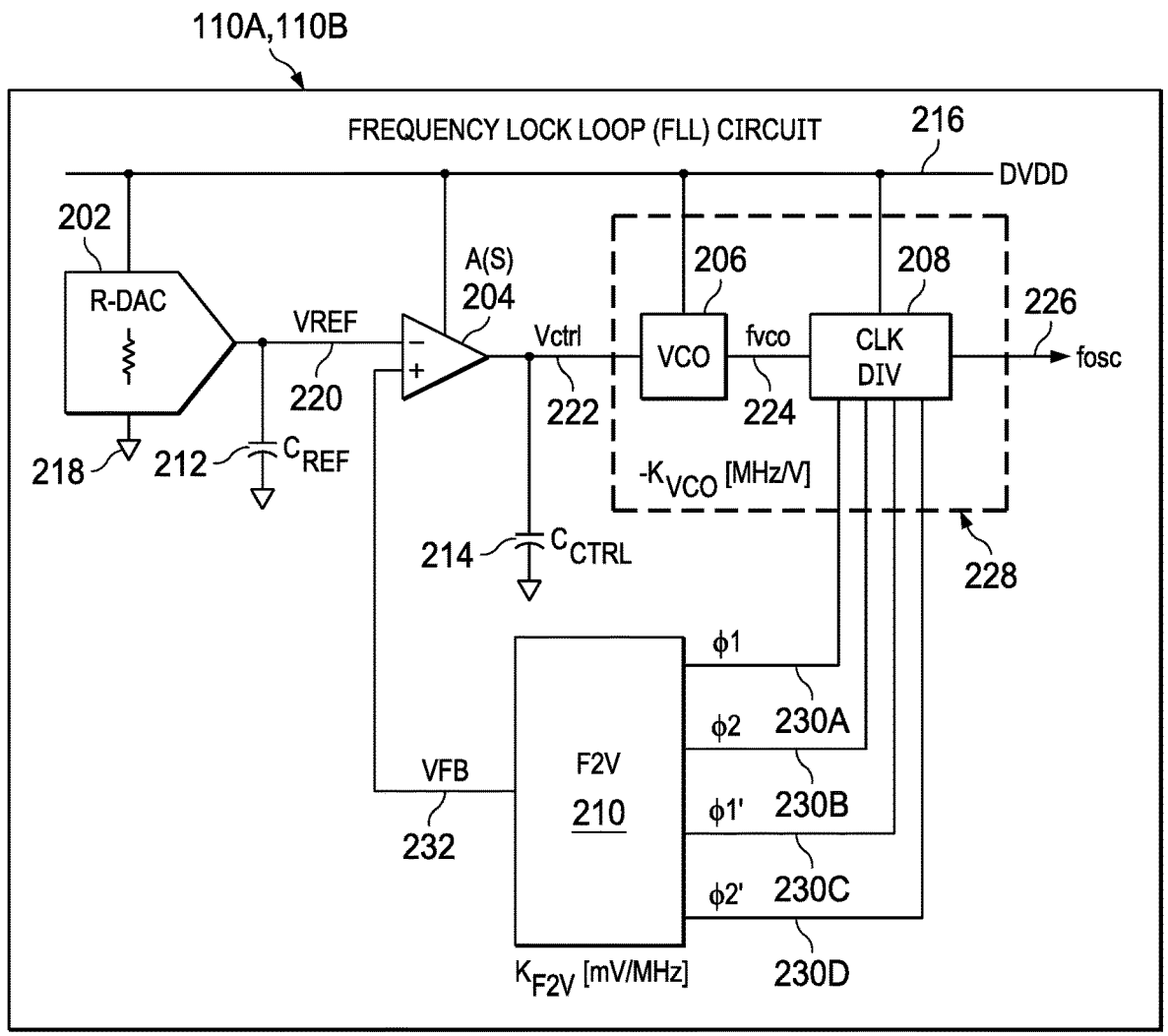
FIG. 2 is a schematic illustration of an example implementation of the FLL circuit of FIG. 1 including a frequency-to-voltage (F2V) converter.

FIG. 2 is a schematic illustration of an example implementation of the first FLL circuit 110A and/or the second FLL circuit 110B of FIG. 1. In FIG. 2, the FLL circuit 110A, 110B includes an example reference generator (R-DAC) 202, an example amplifier 204, an example voltage controlled oscillator (VCO) 206, an example clock divider (CLK DIV) circuit 208, an example frequency-to-voltage (F2V) converter 210, a first example capacitor (CREF) 212, and a second example capacitor CCTRL) 214.

In the illustrated example of FIG. 2, an example voltage rail (DVDD) 216 is coupled to a respective input of the reference generator 202, the amplifier 204, the VCO 206, and the clock divider circuit 208. For example, the voltage rail 216 can be a positive voltage rail (e.g., a 1.8 Volt (V), a 2.2 Volt (V) voltage rail, a 3.3 V voltage rail, etc.). In FIG. 2, an example reference voltage rail 218 is coupled to the reference generator 202, the first capacitor 212, and the second capacitor 214. For example, the reference voltage rail 218 can be a ground rail.

In the illustrated example of FIG. 2, the reference generator 202 is a trim circuit. For example, the reference generator 202 can include two or more resistors in series. The FLL circuit 110A, 110B includes the reference generator 202 to generate an example reference voltage (VREF) 220.

In the illustrated example of FIG. 2, the amplifier 204 is an op-amp. The FLL circuit 110A, 110B includes the amplifier 204 to provide low-frequency gain for the negative feedback loop of the FLL circuit 110A, 110B. Alternatively, the amplifier 204 may be a different type of amplifier. The amplifier 204 of FIG. 2 includes a first input (designated with a '+' symbol) coupled to an output of the F2V converter 210 and a second input (designated with a '−' symbol) coupled to an output of the reference generator 202 and the first capacitor 212. In FIG. 2, an output of the amplifier 204 is coupled to the second capacitor 214 and an input of the VCO 206.

In the illustrated example of FIG. 2, the FLL circuit 110A, 110B includes the VCO 206 to generate an example control voltage (Vctrl) (e.g., a control voltage signal) 222. In FIG. 2, the VCO 206 is an electronic oscillator whose oscillation frequency is controlled by the control voltage 222. For example, the control voltage 222 can determine an instantaneous oscillation frequency of the VCO 206 to generate an example VCO output signal 224 having a first example frequency (fvco). In FIG. 2, the VCO output signal 224 is a clock signal having the first frequency. In FIG. 2, the VCO 206 is a current starved ring oscillator, such as a chain of a plurality of inverters (e.g., inverter logic gates). Alternatively, the VCO 206 may be a relaxation oscillator, a tank oscillator, or any other type of voltage controlled oscillator.

In the illustrated example of FIG. 2, the output of the VCO 206 is coupled to an input of the clock divider circuit 208. In FIG. 2, the clock divider circuit 208 is a clock circuit (e.g., a clock generating circuit, a clock signal generating circuit, etc.). In FIG. 2, the FLL circuit 110A, 110B includes the clock divider circuit 208 to receive the VCO output signal 224 from the VCO 206, which has the first frequency, and generate an example FLL output signal 226, which has a second example frequency (fosc), where the second frequency is based on a ratio of the first frequency and an integer (e.g., an integer N, where N=1, 2, 3, etc.). For example, fosc can be less than fvco by a factor of 2, 4, 8, etc. In FIG. 2, the clock divider circuit 208 is a D-Type frequency divider circuit that includes one or more D-flip-flops to divide the clock signal (e.g., the VCO output signal 224) having the first frequency (fvco) to a lower frequency (e.g., fosc). In some examples, the clock divider circuit 208 removes and/or otherwise reduces a jitter associated with the first frequency by dividing the first frequency into the second frequency. Alternatively, the clock divider circuit 208 may be any other type of frequency divider circuit and/or implemented using any other quantity and/or type of components.

The clock divider circuit 208 of FIG. 2 can correspond to the clock divider circuit 112 of FIG. 1. For example, the FLL output signal 226 can be transmitted from the first FLL circuit 110A to an input of the clock divider circuit 112 of FIG. 1, the first digital core circuit 114 of FIG. 1, etc., or any other component of the first die 102. In other examples, the FLL output signal 226 can be transmitted from the second FLL circuit 110B to an input of the second digital core circuit 138 of FIG. 1, or any other component of the second die 104 of FIG. 1. In such examples, one or more components of the first die 102 and/or the second die 104 can be triggered, invoked, etc., in response to receiving the FLL output signal 226 from a respective one of the FLL circuits 110A, 110B. In FIG. 2, the VCO 206 and the clock divider circuit 208 have a first example gain 228 of −KVCO, which has units of measure of megahertz (MHz) per V (MHZ/V). In FIG. 2, the F2V converter 210 has a second example gain of KF2V, which has units of measure of millivolts (mV) per MHz.

In the illustrated example of FIG. 2, outputs of the clock divider circuit 208 are coupled to inputs of the F2V converter 210. In FIG. 2, the outputs of the clock divider circuit 208 include a first output configured to generate a first example clock signal (Φ1) 230A, a second output configured to generate a second example clock signal (Φ2) 230B, a third output configured to generate a third example clock signal (Φ1') 230C, and a fourth output configured to generate a fourth example clock signal (Φ2') 230D. In some examples, each of the clock signals 230A-D have different phases from each other. Alternatively, one or more of the clock signals 230A-D may have the same phase.

In the illustrated example of FIG. 2, the FLL circuit 110A, 110B includes the F2V converter 210 to receive the clock signals 230A-D from the clock divider circuit 208 and generate an example F2V output signal (VFB) 232. In FIG. 2, the F2V output signal 230 is a voltage feedback signal. In FIG. 2, the F2V converter 210 transmits the F2V output signal 232 to the first input of the amplifier 204.

In the illustrated example of FIG. 2, the F2V converter 210 generates the F2V output signal 232 by increasing (e.g., doubling) a frequency of the FLL output signal 226 to generate an intermediate signal and removing one or more harmonics from the intermediate signal. Advantageously, by removing the one or more harmonics, the F2V converter 210 may transmit only a DC component of the FLL output signal 226 to the first input of the amplifier 204. Advantageously, by transmitting only the DC component, the F2V converter 210, and/or, more generally, the FLL circuit 110A, 110B of FIGS. 1 and/or 2, can include fewer filtering components, capacitors, etc., compared to prior FLL circuits and, thus, the FLL circuit 110A, 110B of FIGS. 1 and/or 2 can have a reduced area compared to the prior FLL circuits.

In example operation, the amplifier 204 can compare the F2V output signal 230 to the reference voltage 220 and can generate the control voltage 222 based on the comparison. For example, the amplifier 204 can increase or decrease the control voltage 222 to adjust a frequency of the FLL output signal 226. The VCO 206 can receive the control voltage 222 and generate the VCO output signal 224 based on the control voltage 222.

In example operation, the clock divider circuit 208 can pass on and/or otherwise transmit the VCO output signal 224 as the FLL output signal 226. Alternatively, the clock divider circuit 208 can generate the FLL output signal 226 based on the VCO output signal 224. In example operation, the F2V converter 210 converts the second frequency to a voltage represented by the F2V output signal 232 based on one(s) of the clock signals 230A-D. The amplifier 204 can adjust the control voltage 222 based on the F2V output signal 232. Advantageously, the F2V converter 210 and/or, more generally, the FLL circuit 110A, 110B, can adjust the FLL output signal 226 based on a negative feedback control loop implemented by at least one of the amplifier 204, the VCO 206, the clock divider circuit 208, or the F2V converter 210.

In the illustrated example of FIG. 2, the control voltage 222 is an amplifier output (e.g., an output of the amplifier 204) and an oscillator input (e.g., an input of the VCO 206). In the example of FIG. 2, the VCO output signal 224 is an oscillator output (e.g., an output of the VCO 206) and a clock divider circuit input (e.g., an input of the clock divider circuit 208). In the example of FIG. 2, output(s) of the clock divider circuit 208 (e.g., the FLL output signal 226, the clock signals 230A-D, etc.) is/are clock divider circuit output(s) (e.g., a clock divider circuit output, clock divider circuit outputs, etc., of the clock divider circuit 208).

Figure 3:
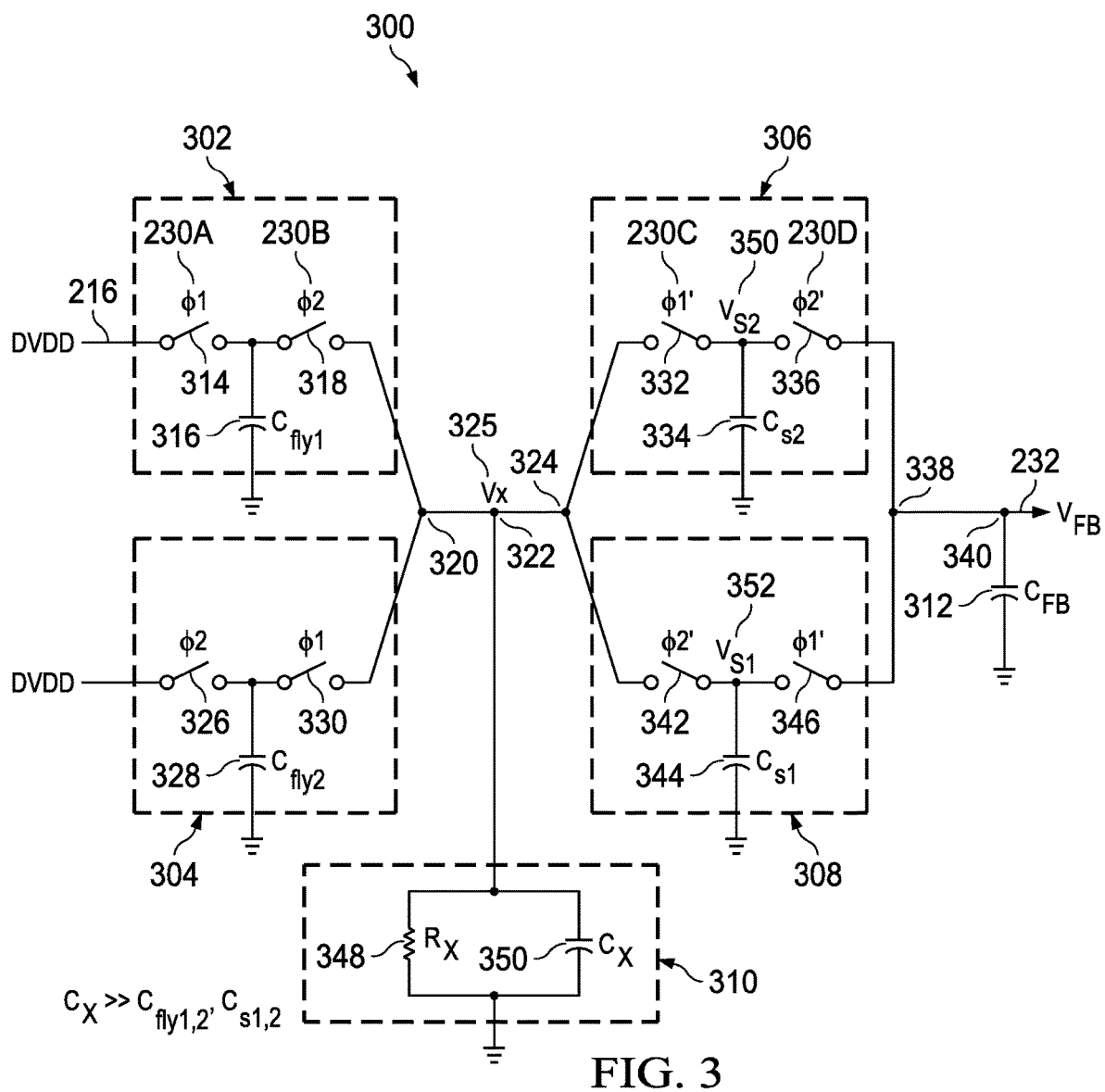
FIG. 3 is a schematic illustration of an example implementation of the F2V converter of FIG. 2.

FIG. 3 is a schematic illustration of a second example F2V converter 300. For example, the second F2V converter 300 can be an example implementation of the F2V converter 210 of FIG. 2. In FIG. 3, the second F2V converter 300 includes a first example switched capacitor circuit 302, a second example switched capacitor circuit 304, a third example switched capacitor circuit 306, a fourth example switched capacitor circuit 308, an example RC circuit 310, and an example feedback capacitor (CFB) 312. In FIG. 3, each of the switched capacitor circuits 302, 304, 306, 308 is a switching network or switching circuit. For example, the second F2V converter 300 includes a plurality of switching networks, which includes the switched capacitor circuits 302, 304, 306, 308 of FIG. 3.

In the illustrated example of FIG. 3, the first switched capacitor circuit 302 includes a first example switch 314, a first example capacitor (Cfly1) 316, and a second example switch 318. In the example of FIG. 3, the first switch 314 is coupled to the voltage rail 216, the first capacitor 316, and the second switch 318. In FIG. 3, the second switch 318 is coupled to the second switched capacitor circuit 304, the third switched capacitor circuit 306, the fourth switched capacitor circuit 308, and the RC circuit 310 at a first example node 320. In FIG. 3, the first switch 314 is configured to be controlled (e.g., opened, closed, enabled, disabled, etc.) by the first clock signal 230A. For example, the first switch 314 can be configured to switch (e.g., switch from open to closed, closed to open, etc.) in response to the first clock signal 230A. In FIG. 3, the second switch 318 is configured to be controlled by the second clock signal 230B. Further depicted in FIG. 3 are a second example node 322 and a third example node 324, where the first node 320, the second node 322, and the third node 324 are designated by Vx 325.

In the illustrated example of FIG. 3, Vx 325 can be, correspond to, and/or otherwise be representative of an intermediate signal, an intermediate voltage, etc., at the second node 322. In such examples, Vx 325 can be an intermediate signal, an intermediate voltage, etc., generated by at least one of the first switched capacitor circuit 302 or the second switched capacitor circuit 304.

In the illustrated example of FIG. 3, the second switched capacitor circuit 304 includes a third example switch 326, a second example capacitor (Cfly2) 328, and a fourth example switch 330. In the example of FIG. 3, the third switch 326 is coupled to the voltage rail 216, the second capacitor 328, and the fourth switch 330. In FIG. 3, the fourth switch 330 is coupled to the first switched capacitor circuit 302, the third switched capacitor circuit 306, the fourth switched capacitor circuit 308, and the RC circuit 310 at the first node 320. In FIG. 3, the third switch 326 is configured to be controlled by the second clock signal 230B. In FIG. 3, the fourth switch 330 is configured to be controlled by the first clock signal 230A.

In the illustrated example of FIG. 3, the third switched capacitor circuit 306 includes a fifth example switch 332, a third example capacitor (Cs2) 334, and a sixth example switch 336. In the example of FIG. 3, the fifth switch 332 is coupled to the first switched capacitor circuit 302, the second switched capacitor circuit 304, the fourth switched capacitor circuit 308, and the RC circuit 310 at the third node 324. In FIG. 3, the third capacitor 334 is coupled to the fifth switch 332 and the sixth switch 336. In FIG. 3, the sixth switch 336 is coupled to the fourth switched capacitor circuit 308 at a fourth example node 338. In FIG. 3, the sixth switch 336 is coupled to the feedback capacitor 312 at a fifth example node 340. In FIG. 3, the fifth switch 332 is configured to be controlled by the third clock signal 230C of FIG. 2. In FIG. 3, the sixth switch 336 is configured to be controlled by the fourth clock signal 230D of FIG. 2.

In the illustrated example of FIG. 3, the fourth switched capacitor circuit 308 includes a seventh example switch 342, a fourth example capacitor (Cs1) 344, and an eighth example switch 346. In the example of FIG. 3, the seventh switch 342 is coupled to the first switched capacitor circuit 302, the second switched capacitor circuit 304, the fourth switched capacitor circuit 308, and the RC circuit 310 at the third node 324. In FIG. 3, the fourth capacitor 344 is coupled to the seventh switch 342 and the eighth switch 346. In FIG. 3, the eighth switch 346 is coupled to the third switched capacitor circuit 306 at the fourth node 338. In FIG. 3, the eighth switch 346 is coupled to the feedback capacitor 312 at the fifth node 340. In FIG. 3, the seventh switch 342 is configured to be controlled by the fourth clock signal 230D. In FIG. 3, the eighth switch 346 is configured to be controlled by the third clock signal 230C.

In the illustrated example of FIG. 3, the second F2V converter 300 includes the RC circuit 310 to effectuate low-pass filtering and to generate the F2V output signal 232. In FIG. 3, the RC circuit 310 includes an example resistor (RX) 348 and a fifth example capacitor (CX) 350. In FIG. 3, the resistor 348 and the fifth capacitor 350 are coupled to the first switched capacitor circuit 302, the second switched capacitor circuit 304, the third switched capacitor circuit 306, and the fourth switched capacitor circuit 308 at the second node 322. In FIG. 3, the fifth capacitor 350 has a capacitance that is substantially greater than the capacitances of at least one of the first capacitor 316, the second capacitor 328, the third capacitor 334, or the fourth capacitor 344. For example, the fifth capacitor 350 can have a capacitance of 15 pico-Farads (pF) and one or more of the first capacitor 316, the second capacitor 328, the third capacitor 334, and/or the fourth capacitor 344 can have a capacitance of 1 pF.

In the illustrated example of FIG. 3, one or more of the first switch 314, the second switch 318, the third switch 326, the fourth switch 330, the fifth switch 332, the sixth switch 336, the seventh switch 342, and/or the eighth switch 346 are transistors. For example, at least one of the first switch 314, the second switch 318, the third switch 326, the fourth switch 330, the fifth switch 332, the sixth switch 336, the seventh switch 342, or the eighth switch 346 can be NMOS devices (e.g., N-channel FETs, N-channel MOSFETs, etc.), PMOS devices (e.g., P-channel FETs, P-channel MOSFETs, etc.), etc.

In the illustrated example of FIG. 3, the switches 314, 318, 326, 330, 332, 336, 342, 346 are three-terminal devices (e.g., three-terminal transistors). For example, the first switch 314 can have a first terminal (e.g., a first switch terminal), a second terminal (e.g., a second switch terminal), and a third terminal (e.g., a third switch terminal). Alternatively, one or more of the switches 314, 318, 326, 330, 332, 336, 342, 346 may have a different number of terminals.

In some examples, one of the terminals can be a control terminal, such as a gate terminal of a transistor. In some examples, one of the terminals can be a current terminal, such as a drain terminal or a source terminal where the transistor is a FET (e.g., a MOSFET). In some examples, one of the terminals can be a current terminal, such as a collector terminal or an emitter terminal where the transistor is a bipolar junction transistor (BJT).

In the illustrated example of FIG. 3, the clock signals 230A-D can be coupled to a control terminal (e.g., a gate, a gate terminal, etc.) of a respective switch (e.g., a transistor). For example, the first clock signal 230A can be coupled to a gate of a first transistor, which can be an example implementation of the first switch 314. In such examples, the second clock signal 230B can be coupled to a gate of a second transistor, which can be an example implementation of the second switch 318.

In some such examples, the first switch 314 can be a transistor having a first terminal, a second terminal, and a third terminal. For example, the first terminal can be a gate terminal of the transistor. In such examples, the first terminal can be coupled to the first clock signal 230A (e.g., coupled to an output of the clock divider circuit 208 of FIG. 2). In such examples, the second terminal can be a drain terminal of the transistor coupled to DVDD 216. In some such examples, the third terminal can be a source terminal of the transistor coupled to the first capacitor 316 and a terminal (e.g., a current terminal, a drain terminal, etc.) of the second switch 318.

In the illustrated example of FIG. 3, the first switched capacitor circuit 302 and the second switched capacitor circuit 304 can double the frequency of the FLL output signal 226. For example, the first switched capacitor circuit 302 and the second switched capacitor circuit 304 can double the frequency fosc of FIG. 2 using non-overlapping clock signals, such as the first clock signal 230A and the second clock signal 230B of FIG. 2. In FIG. 3, the first clock signal 230A and the second clock signal 230B are 180 degrees out-of-phase. Alternatively, the first clock signal 230A and the second clock signal 230B may be a different quantity of degrees out-of-phase.

In the illustrated example of FIG. 3, the third switched capacitor circuit 306 and the fourth switched capacitor circuit 308 can implement a sample-and-hold circuit. For example, the sample-and-hold circuit can implement and/or otherwise execute a filter, such as a notch filter, to remove one or more harmonics (e.g., a portion of the harmonics, all of the harmonics, an entirety of the harmonics, etc.) of Vx 325. In FIG. 3, the third clock signal 230C and the fourth clock signal 230D are 180 degrees out-of phase with each other and 90 degrees out-of-phase from the first clock signal 230A and the second clock signal 230B. Alternatively, the third clock signal 230C and the fourth clock signal 230D may be a different quantity of degrees out-of-phase from each other and/or from the first clock signal 230A and the second clock signal 230B.

In example operation, the first clock signal 230A can be asserted to close and/or otherwise enable the first switch 314 and the fourth switch 330 while the second clock signal 230B can be de-asserted to open and/or otherwise disable the second switch 318 and the third switch 326. In example operation, the first capacitor 316 can be charged to DVDD 216 and the second capacitor 328 can discharge and, thus, charge the fifth capacitor 350.

In example operation, the third clock signal 230C can be asserted to close and/or otherwise enable the fifth switch 332 and the eighth switch 346 while the fourth clock signal 230D can be de-asserted to open and/or otherwise disable the sixth switch 336 and the seventh switch 342. In example operation, the fifth capacitor 350 can discharge and, thus, charge the third capacitor 334 to a second example switch voltage (VS2) 350 stored by the fifth capacitor 350. In example operation, the fourth capacitor 344 can discharge and, thus, charge the feedback capacitor 312 to a first example switch voltage (VS1) 352 stored by the fourth capacitor 344.

Advantageously, the notch filter implemented by the third switched capacitor circuit 306 and the fourth switched capacitor circuit 308 can generate the F2V output signal 232 to only include a DC component of Vx 325. Advantageously, the third switched capacitor circuit 306 and the fourth switched capacitor circuit 308 and/or, more generally, the second F2V converter 300 of FIG. 3, can generate the F2V output signal 232 to be representative of an average value of Vx 325.

Figure 4:
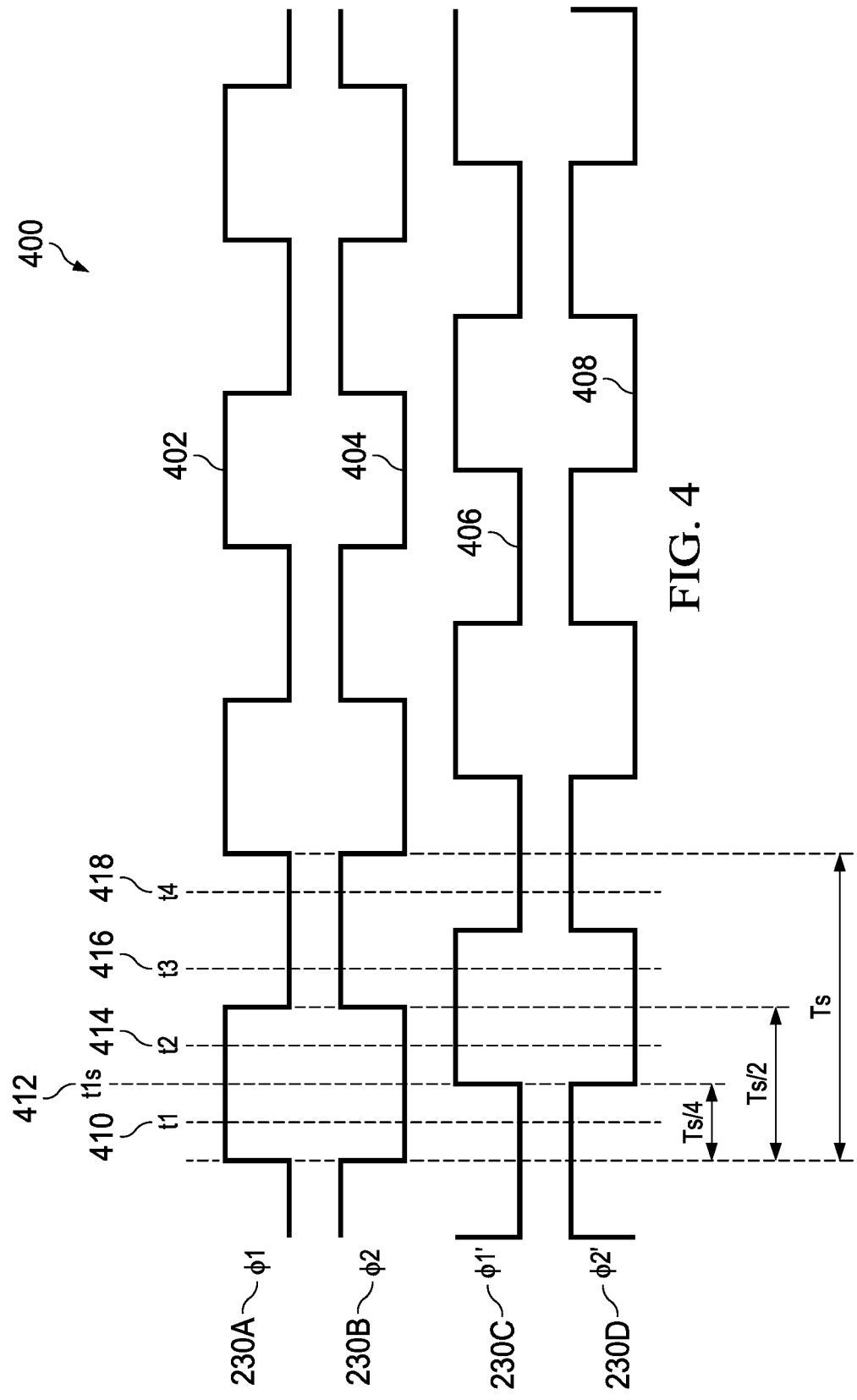
FIG. 4 depicts an example timing diagram including example clock signal waveforms associated with the F2V converter of FIGS. 2 and/or 3.

FIG. 4 depicts an example timing diagram 400 including example clock signal waveforms 402, 404, 406, 408 associated with the F2V converter 210 of FIG. 2 and/or the second F2V converter 300 of FIG. 3. In FIG. 4, the clock signal waveforms 402, 404, 406, 408 include a first example clock signal waveform 402, a second example clock signal waveform 404, a third example clock signal waveform 406, and a fourth example clock signal waveform 408.

In the illustrated example of FIG. 4, the first clock signal waveform 402 can correspond to a waveform of the first clock signal 230A of FIGS. 2-3. In the example of FIG. 4, the second clock signal waveform 404 can correspond to a waveform of the second clock signal 230B of FIGS. 2-3. In FIG. 4, the third clock signal waveform 406 can correspond to a waveform of the third clock signal 230C of FIGS. 2-3. In FIG. 4, the fourth clock signal waveform 408 can correspond to a waveform of the fourth clock signal 230D of FIGS. 2-3.

In the illustrated example of FIG. 4, the first clock signal waveform 402 and the second clock signal waveform 404 are 180 degrees out-of-phase from each other. In the example of FIG. 4, the third clock signal waveform 406 and the fourth clock signal waveform 408 are 180 degrees out-of-phase from each other. In FIG. 4, the first clock signal waveform 402 and the second clock signal waveform 404 are 90 degrees out-of-phase from the third clock signal waveform 406 and the fourth clock signal waveform 408.

In the timing diagram 400 of FIG. 4, at a first example time (t1) 410, the first clock signal 230A is asserted, the second clock signal 230B is de-asserted, the third clock signal 230C is de-asserted, and the fourth clock signal 230D is asserted. For example, at the first time 410, the first switch 314, the fourth switch 330, the sixth switch 336, and the seventh switch 342 of FIG. 3 can be closed while the remaining switches can be open. In such examples, the first capacitor 316 can charge to DVDD 216, the second capacitor 328 can charge the fifth capacitor 350, the third capacitor 334 can charge the feedback capacitor 312, and the fourth capacitor 344 can be charged by the fifth capacitor 350.

In the timing diagram 400 of FIG. 4, at an example intermediate time (t1s) 412, the first clock signal 230A is asserted, the second clock signal 230B is de-asserted, the third clock signal 230C is transitioning from a logic low signal (e.g., de-asserted) to a logic high signal (e.g., asserted), and the fourth clock signal 230D is transitioning from a logic high signal to a logic low signal. For example, at the intermediate time 412, the fifth switch 332 and the eighth switch 346 can switch from open to closed. In such examples, the sixth switch 336 and the seventh switch 342 can switch from closed to open.

In the timing diagram 400 of FIG. 4, at a second example time (t2) 414, the first clock signal 230A is asserted, the second clock signal 230B is de-asserted, the third clock signal 230C is asserted, and the fourth clock signal 230D is de-asserted. For example, at the second time 414, the first switch 314, the fourth switch 330, the fifth switch 332, and the eighth switch 346 of FIG. 3 can be closed while the remaining switches can be open.

In the timing diagram 400 of FIG. 4, at a third example time (t3) 416, the first clock signal 230A is de-asserted, the second clock signal 230B is asserted, the third clock signal 230C is asserted, and the fourth clock signal 230D is de-asserted. For example, at the third time 416, the second switch 318, the third switch 326, the fifth switch 332, and the eighth switch 346 of FIG. 3 can be closed while the remaining switches can be open. In such examples, the first capacitor 316 can discharge to the fifth capacitor 350, the second capacitor 328 can charge to DVDD 216, the third capacitor 334 can be charged by the fifth capacitor 350, and the fourth capacitor 344 can discharge to the feedback capacitor 312.

In the timing diagram 400 of FIG. 4, at a fourth example time (t4) 418, the first clock signal 230A is de-asserted, the second clock signal 230B is asserted, the third clock signal 230C is de-asserted, and the fourth clock signal 230D is asserted. For example, at the fourth time 418, the second switch 318, the third switch 326, the sixth switch 336, and the seventh switch 342 of FIG. 3 can be closed while the remaining switches can be open. In such examples, the third capacitor 334 can discharge to the feedback capacitor 312 and the fourth capacitor 344 can be charged by the fifth capacitor 350. Advantageously, the two clock signal path to update the DVDD signal can move a pole created in the second F2V converter 300 at twice a higher frequency, as depicted in the example of FIG. 4, to improve stability of the negative feedback loop depicted in FIG. 2.

Figure 5:
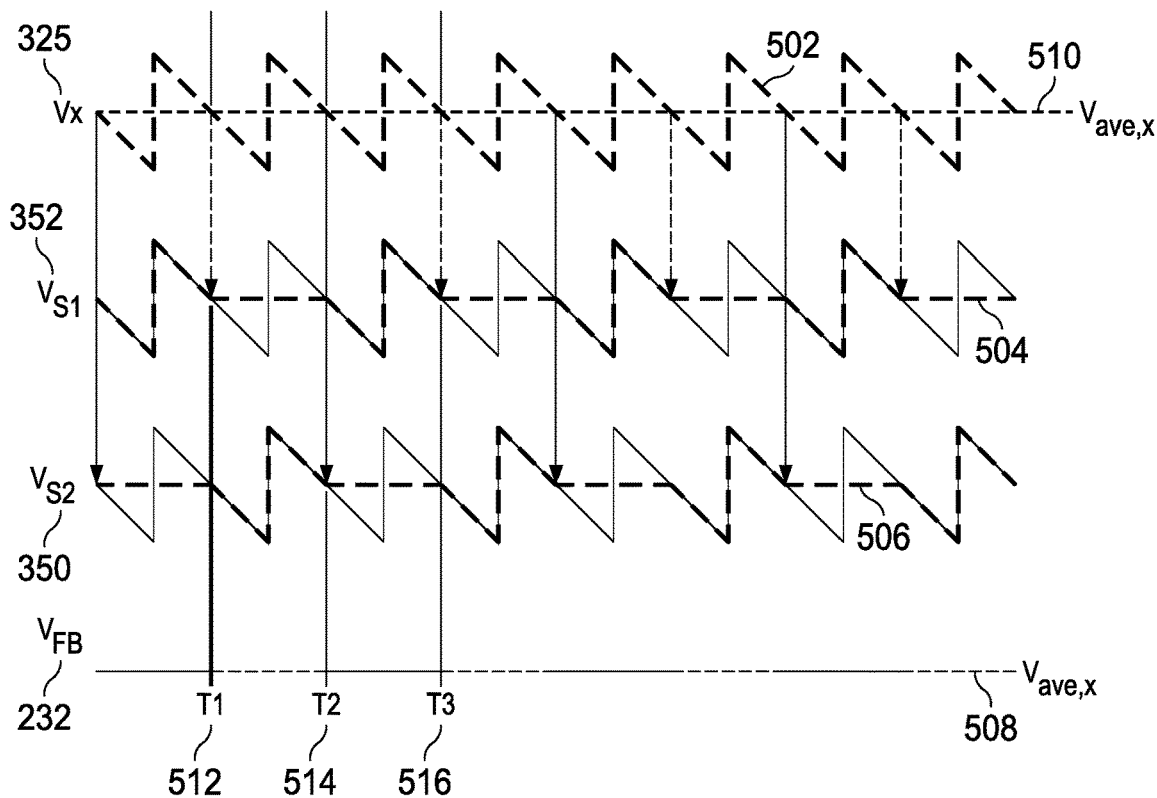
FIG. 5 depicts example voltage waveforms associated with the F2V converter of FIG. 3.

FIG. 5 depicts example voltage waveforms 502, 504, 506, 508 associated with the second F2V converter 300 of FIG. 3. In FIG. 5, the voltage waveforms 502, 504, 506, 508 include a first example voltage waveform 502, a second example voltage waveform 504, a third example voltage waveform 506, and a fourth example voltage waveform 508.

In the illustrated example of FIG. 5, the first voltage waveform 502 can correspond to a waveform of Vx 325 of FIG. 3 at the second node 322 of FIG. 3. In the example of FIG. 5, the second voltage waveform 504 can correspond to a waveform of VS1 352 of FIG. 3. In FIG. 5, the third voltage waveform 506 can correspond to a waveform of VS2 350 of FIG. 3. In FIG. 5, the fourth voltage waveform 508 can correspond to a waveform of the F2V output signal 232 of FIGS. 2 and/or 3. Further depicted in FIG. 5 is an example average voltage (Vave,x) 510.

In the illustrated example of FIG. 5, from a first example time (T1) 512 to a second example time (T2) 514, the F2V output signal 232 delivered to the amplifier 204 of FIG. 2 can correspond to VS1 352. In the example of FIG. 5, from the second time 514 to a third example time (T3) 516, the F2V output signal 232 delivered to the amplifier 204 can correspond to VS2 350. In FIG. 5, the F2V output signal 232 can be the average voltage 510.

Advantageously, the output signal to the amplifier 204, the F2V output signal 232, can effectively be the same as the DC (e.g., the average) value of Vx 325. Advantageously, as depicted in the example of FIG. 5, the notch filter implemented by at least one of the third switched capacitor circuit 306 or the fourth switched capacitor circuit 308 of FIG. 3 can remove a ripple (e.g., a voltage ripple) from the F2V output signal 232 and/or pass the DC signal from Vx 325 to the amplifier 204 as the F2V output signal 232.

Figure 6:
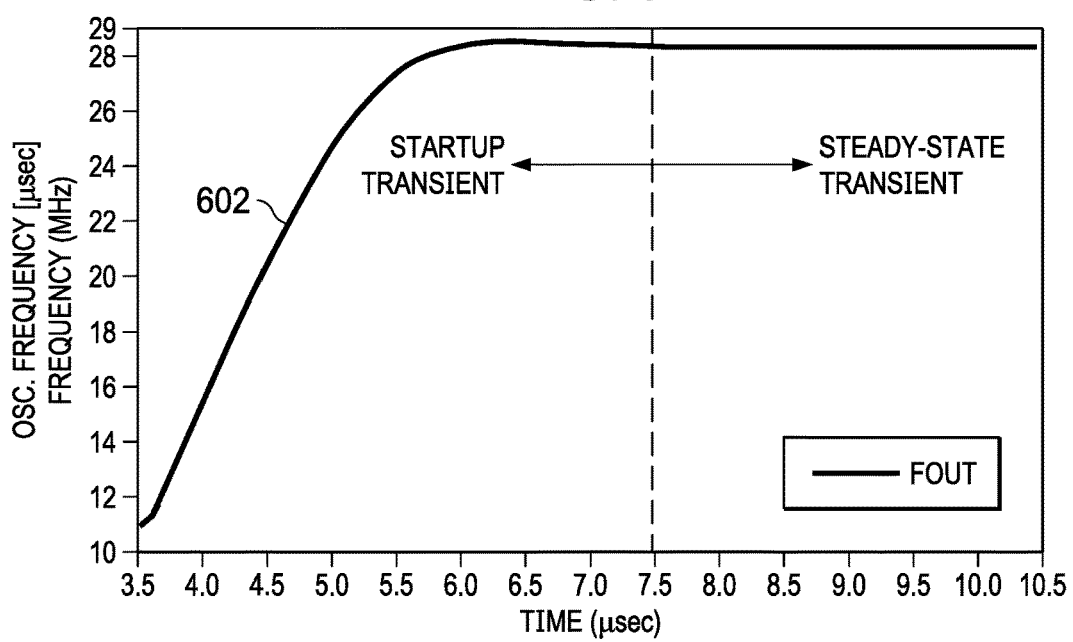
FIG. 6 depicts a graph of an example frequency waveform associated with the FLL circuit of FIGS. 1 and/or 2.

FIG. 6 depicts a graph 600 of an example frequency waveform 602 associated with the F2V converter 210 of FIG. 2 and/or the second F2V converter 300 of FIG. 3. The frequency waveform 602 can correspond to a waveform of the FLL output signal 226 of FIG. 2 generated by the FLL circuit 110A, 110B of FIGS. 1 and/or 2. Advantageously, the frequency waveform 602 generated by the FLL circuit 110A, 110B is ripple free and/or otherwise devoid of ripples. Advantageously, the frequency waveform 602 generated by the FLL circuit 110A, 110B is relatively immune from degradation during either the startup transient or steady-state transient periods depicted in the example of FIG. 6.

Figure 7:
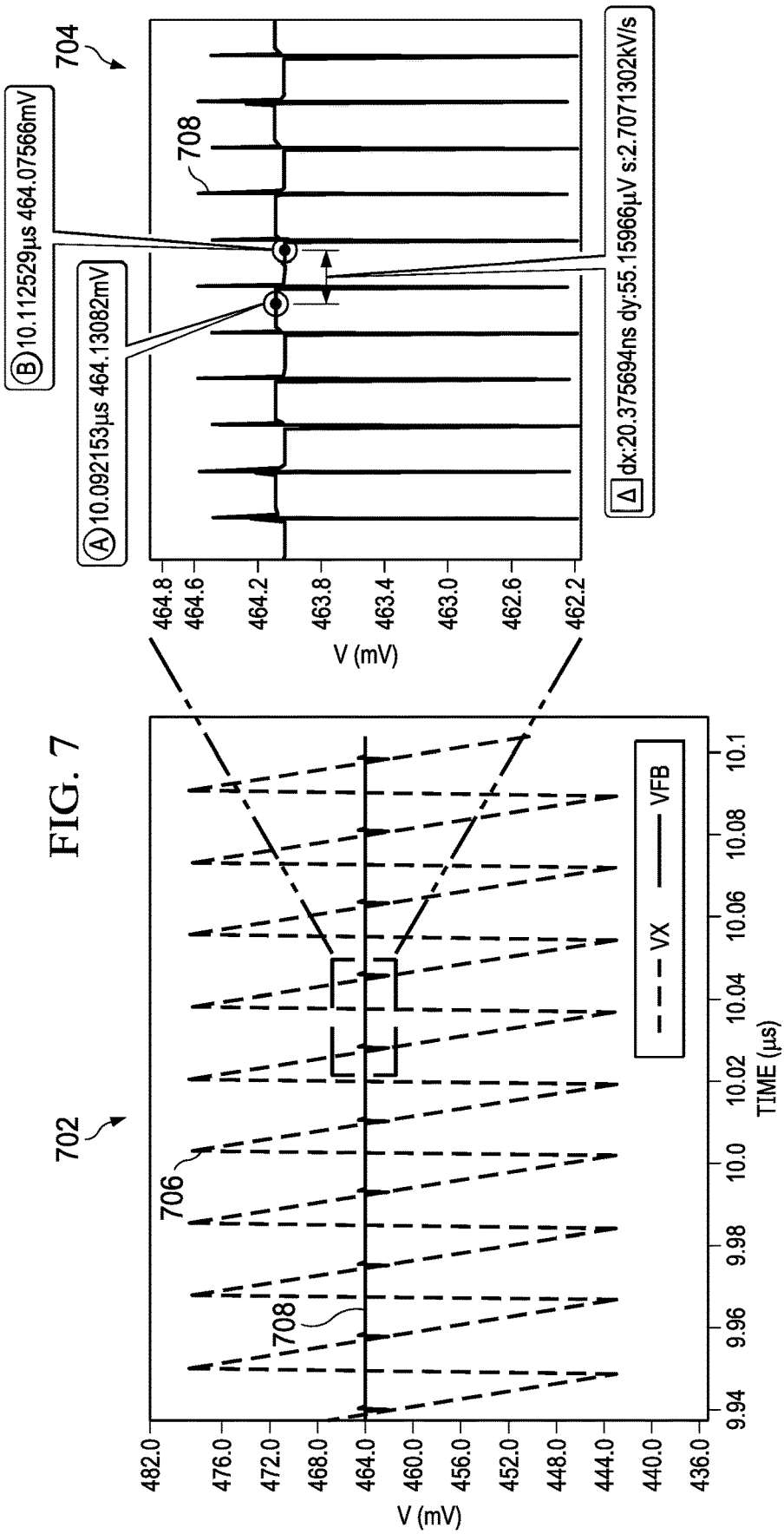
FIG. 7 depicts graphs of example output voltage waveforms associated with the F2V converter of FIGS. 2 and/or 3.

FIG. 7 depicts graphs 702, 704 of example output voltage waveforms 706, 708, associated with the F2V converter 210 of FIG. 2 and/or the second F2V converter 300 of FIG. 3. In the example of FIG. 7, the waveforms 706, 708 include a first example output voltage waveform 706 and a second example output voltage waveform 708. In FIG. 7, the first output voltage waveform 706 can correspond to a waveform of Vx 325 of FIG. 3. In FIG. 7, the second output voltage waveform 708 can correspond to a waveform of the F2V output signal 232 of FIGS. 2 and/or 3. In FIG. 7, the second graph 704 is an enlarged view of a portion of the first graph 702.

In the illustrated example of FIG. 7, first amplitudes of the first output voltage waveform 706 are greater (e.g., substantially greater) than second amplitudes of the second output voltage waveform 708. Advantageously, the second F2V converter 300 of FIG. 3 and/or, more generally, the FLL circuit 110A, 110B of FIGS. 1 and/or 2, can reduce (e.g., dramatically reduce, substantially reduce, etc.) voltage ripples associated with an input to the amplifier 204 of FIG. 2 as depicted in the example of FIG. 7.

Figure 8:
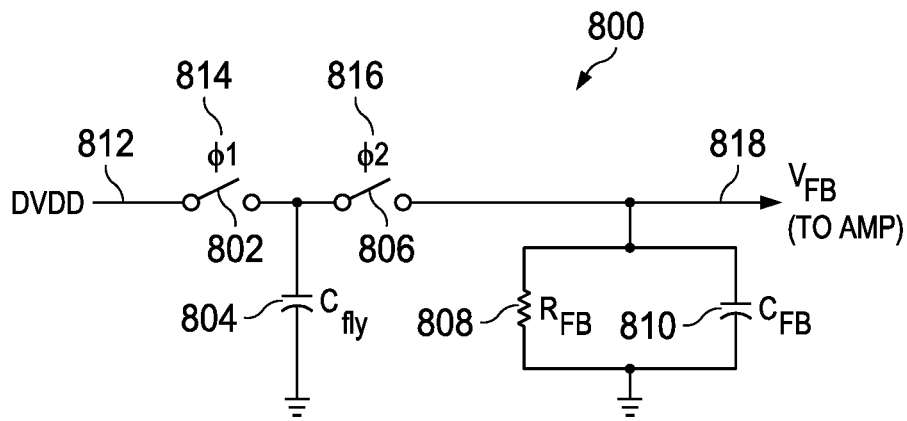
FIG. 8 is a schematic illustration of another example F2V converter.

FIG. 8 is a schematic illustration of a third example F2V converter 800. In FIG. 8, the third F2V converter 800 is a switched capacitor circuit that includes a first switch 802, a first example capacitor (Cfly) 804, a second example switch 806, an example resistor (RFB) 808, and a second example capacitor (CFB) 810. In FIG. 8, the first switch 802 is coupled to an example voltage rail (DVDD) 812, the first capacitor 804, and the second switch 806. In FIG. 8, the second switch 806 is coupled to the resistor 808 and the second capacitor 810. In some examples, the second switch 806, the resistor 808, and the second capacitor 810 are coupled to an input of an amplifier, such as the amplifier 204 of FIG. 2. In FIG. 8, the first switch 802 and the second switch 806 are transistors (e.g., NMOS transistors, PMOS transistors, etc.).

In operation, a first clock signal (Φ1) 814 can be asserted to close the first switch 802 and a second clock signal (Φ2) 816 can be de-asserted to open the second switch 806 to charge the first capacitor 804 to DVDD 812. In operation, the first clock signal 814 can be de-asserted to open the first switch 802 and the second clock signal 816 can be asserted to close the second switch 806 to transfer a voltage stored by the first capacitor 804 to the second capacitor 810 to convert frequency information (e.g., a frequency signal) to voltage information (e.g., a voltage signal). In operation, the first clock signal 814 can be asserted to close the first switch 802 and the second clock signal 816 can be de-asserted to open the second switch 806 to transfer a voltage stored by the second capacitor 810 to an output of the third F2V converter 800 as a second example F2V output signal (VFB) 818. In some examples, the second F2V output signal 818 can be delivered and/or otherwise transmitted to an input of an amplifier, such as the amplifier 204 of FIG. 2.

Advantageously, the second F2V converter 300 of FIG. 3 is an improvement over the third F2V converter 800 of FIG. 8 by including a plurality of switched capacitor circuits to deliver charge to a capacitor faster than the third F2V converter 800. For example, the second F2V converter 300 can deliver charge at least two times faster to the fifth capacitor 350 of FIG. 3 than the third F2V converter 300 charge to the second capacitor 810 of FIG. 8.

Advantageously, the second F2V converter 300 of FIG. 3 is an improvement over the third F2V converter 800 by including two input paths to increase a frequency of an input signal. For example, the first switched capacitor circuit 302 and the second switched capacitor circuit 304 of FIG. 3 can receive two or more input signals (e.g., the first clock signal 230A, the second clock signal 230B) to at least double the frequency fosc of FIG. 2. In such examples, the third F2V converter 800 includes only one input path and does not increase the frequency of an input signal when compared to the second F2V converter 300 of FIG. 3.

Figure 9:
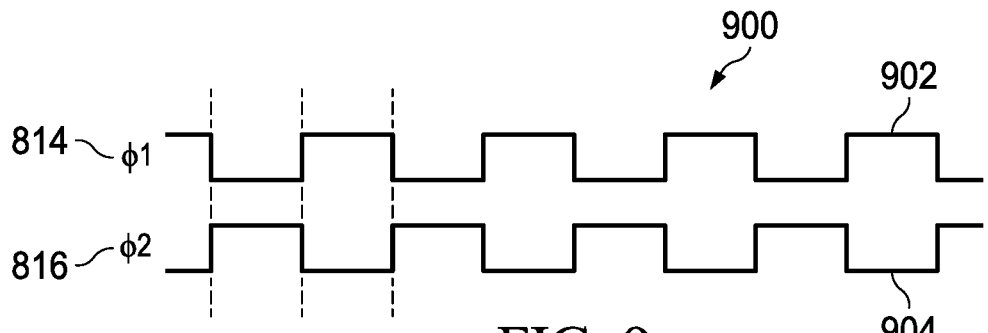
FIG. 9 depicts an example timing diagram including example clock signal waveforms associated with the F2V converter of FIG. 8.

FIG. 9 depicts an example timing diagram 900 including example clock signal waveforms 902, 904 associated with the third F2V converter 800 of FIG. 8. In FIG. 9, the clock signal waveforms 902, 904 include a first example clock signal waveform 902 and a second example clock waveform 904. In FIG. 9, the first clock signal waveform 902 can correspond to the first clock signal 814 of FIG. 8. In FIG. 9, the second clock signal waveform 904 can correspond to the second clock signal 816 of FIG. 8.

In the illustrated example of FIG. 9, the first clock signal 814 and the second clock signal 816 are 180 degrees out-of-phase based on a comparison of the first clock signal waveform 902 and the second clock signal waveform 904. Advantageously, the second F2V converter 300 of FIG. 3 is an improvement of the third F2V converter 800 of FIG. 8 because the second F2V converter 300 includes not only sets of 180 degrees out-of-phase clock signals (e.g., a first set including the first clock signal 230A and the second clock signal 230B of FIGS. 2-3, a second set including the third clock signal 230C and the fourth clock signal 230D of FIGS. 2-3, etc.), but also sets of 90 degrees out-of-phase clock signals (e.g., a first set including the first clock signal 230A and the third clock signal 230C, a second set including the second clock signal 230B and the fourth clock signal 230D, etc.). Advantageously, the sets of 180 degrees out-of-phase and 90 degrees out-of-phase clock signals associated with the second F2V converter 300 can be used to implement a sample-and-hold circuit, which can be used to implement a filter, such as a notch filter, to remove an entirety of the harmonics of Vx 325 of FIG. 3.

Figure 10:
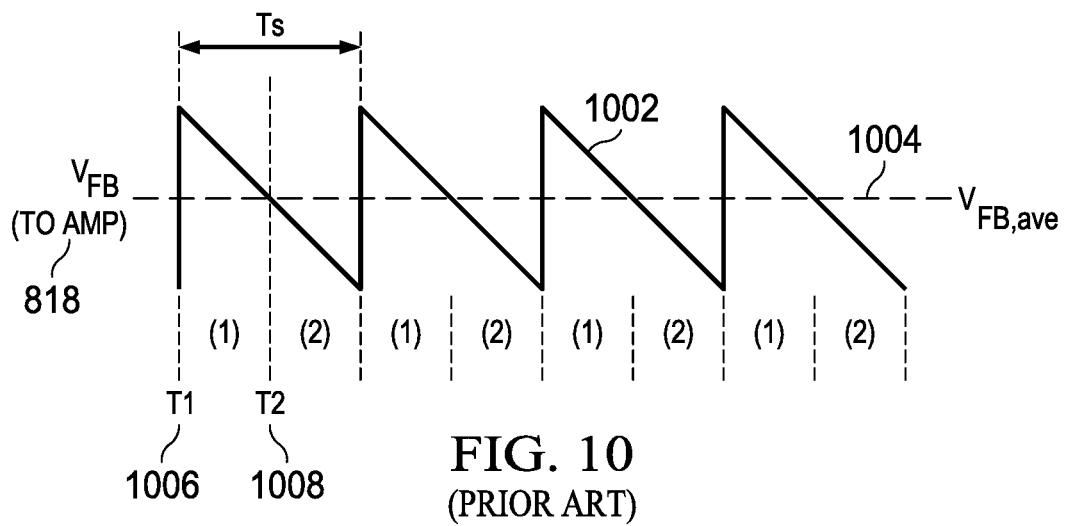
FIG. 10 depicts an example output voltage waveform associated with the F2V converter of FIG. 8.

FIG. 10 depicts an example output voltage waveform 1002 associated with the third F2V converter 800 of FIG. 8. The output voltage waveform 1002 of FIG. 10 can correspond to the second F2V output signal 818 of FIG. 8. Further depicted in FIG. 10 is an example average output voltage (VFBAVE) waveform 1004.

In the illustrated example of FIG. 10, at a first example time (T1) 1006, the output voltage waveform 1002 increases in response to the first clock signal 814 being de-asserted (e.g., opening the first switch 802 of FIG. 8) and the second clock signal 816 being asserted (e.g., closing the second switch 806 of FIG. 8) to transfer the voltage from the first capacitor 804 to the second capacitor 810 of FIG. 8. The output voltage waveform 1002 decreases from the first time until a second example time (T2) 1008 because the resistor 808 discharges the second F2V output signal 818 relatively slowly.

At the second time 1008, the first clock signal 814 is asserted (e.g., closing the first switch 802) and the second clock signal 816 is de-asserted (e.g., opening the second switch 806). At the second time 1008, DVDD 812 charges the first capacitor 804 while the second capacitor 810 discharges and, thus, causes the second F2V output signal 818 to decrease. However, the ripples (e.g., the voltages above and below the average output voltage 1004) can be transmitted to an amplifier and, thus, cause distortion and/or otherwise cause instability in a FLL circuit, such as the FLL circuit 110A, 110B of FIGS. 1 and/or 2.

Figure 11:
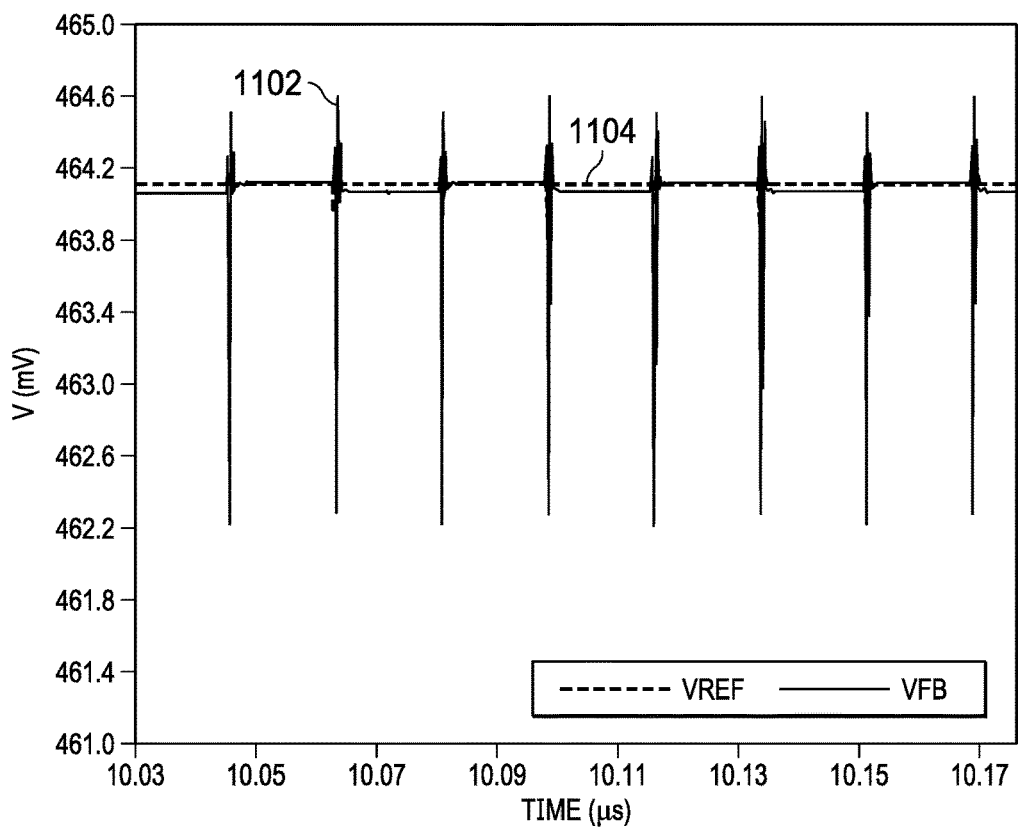
FIG. 11 depicts a graph of example voltage waveforms associated with the F2V converter of FIG. 3.

FIG. 11 depicts a graph 1100 of a first set of example voltage waveforms 1102, 1104 associated with the second F2V converter 300 of FIG. 3. The first set of the voltage waveforms 1102, 1104 include a first example voltage waveform 1102 and a second example voltage waveform 1104. In FIG. 11, the first voltage waveform 1102 can correspond to a waveform of the F2V output signal 232 of FIGS. 2 and/or 3. In FIG. 11, the second voltage waveform 1104 can correspond to a waveform of the reference voltage 220 of FIG. 2.

Figure 12:
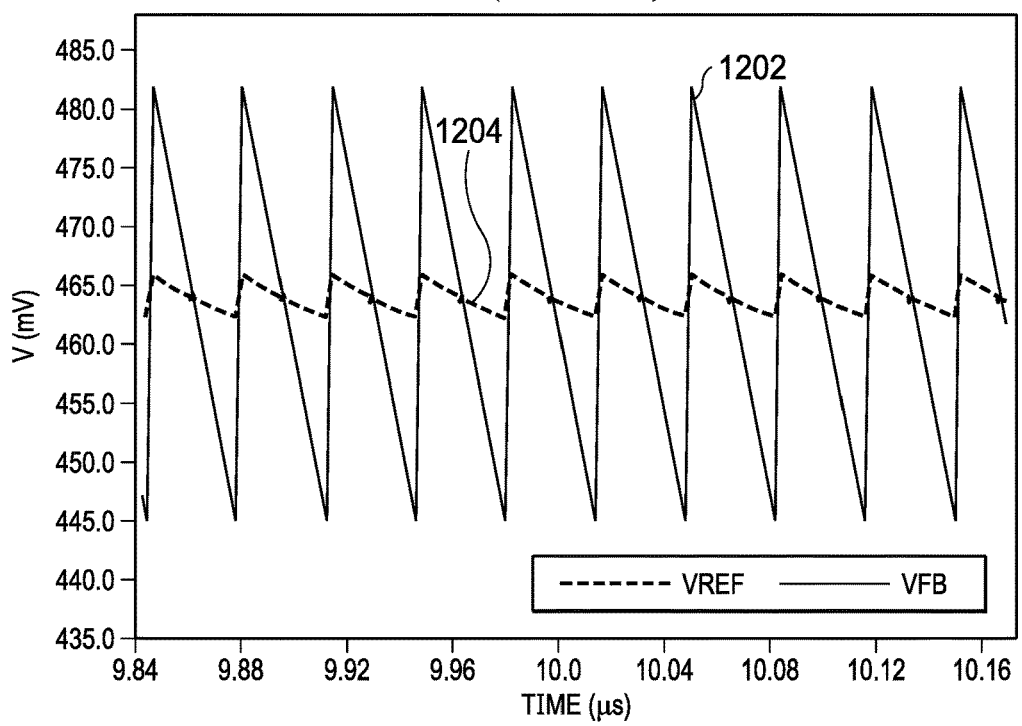
FIG. 12 depicts a graph of example voltage waveforms associated with the F2V converter of FIG. 8.

FIG. 12 depicts a graph 1200 of a second set of example voltage waveforms 1202, 1204 associated with the third F2V converter 800 of FIG. 8. The second set of the voltage waveforms 1202, 1204 include a third example voltage waveform 1202 and a fourth example voltage waveform 1204. In FIG. 12, the third voltage waveform 1202 can correspond to a waveform of the second F2V output signal 818 of FIG. 8. In FIG. 12, the fourth voltage waveform 1204 can correspond to a waveform of the reference voltage 220 of FIG. 2.

Advantageously, the second F2V converter 300 of FIG. 3 can generate the F2V output signal 232 without any substantial ripples and/or otherwise without ripples. For example, when compared to the substantial ripples generated by the third F2V converter 800 as depicted in FIG. 12, the second F2V converter 300 can generate the F2V output signal 232 without ripples. Advantageously, the lack of ripples generated by the second F2V converter 300, as depicted in the example of FIG. 11, does not perturb and/or otherwise invoke perturbation of the reference voltage 220 in response to generating the F2V output signal 232. For example, when compared to the substantial perturbations of the reference voltage 220 caused by the third F2V converter 800, as depicted in FIG. 12, the second F2V converter 300 can generate the F2V output signal 232 without distorting and/or otherwise adversely affecting the reference voltage 220.

Figure 13:
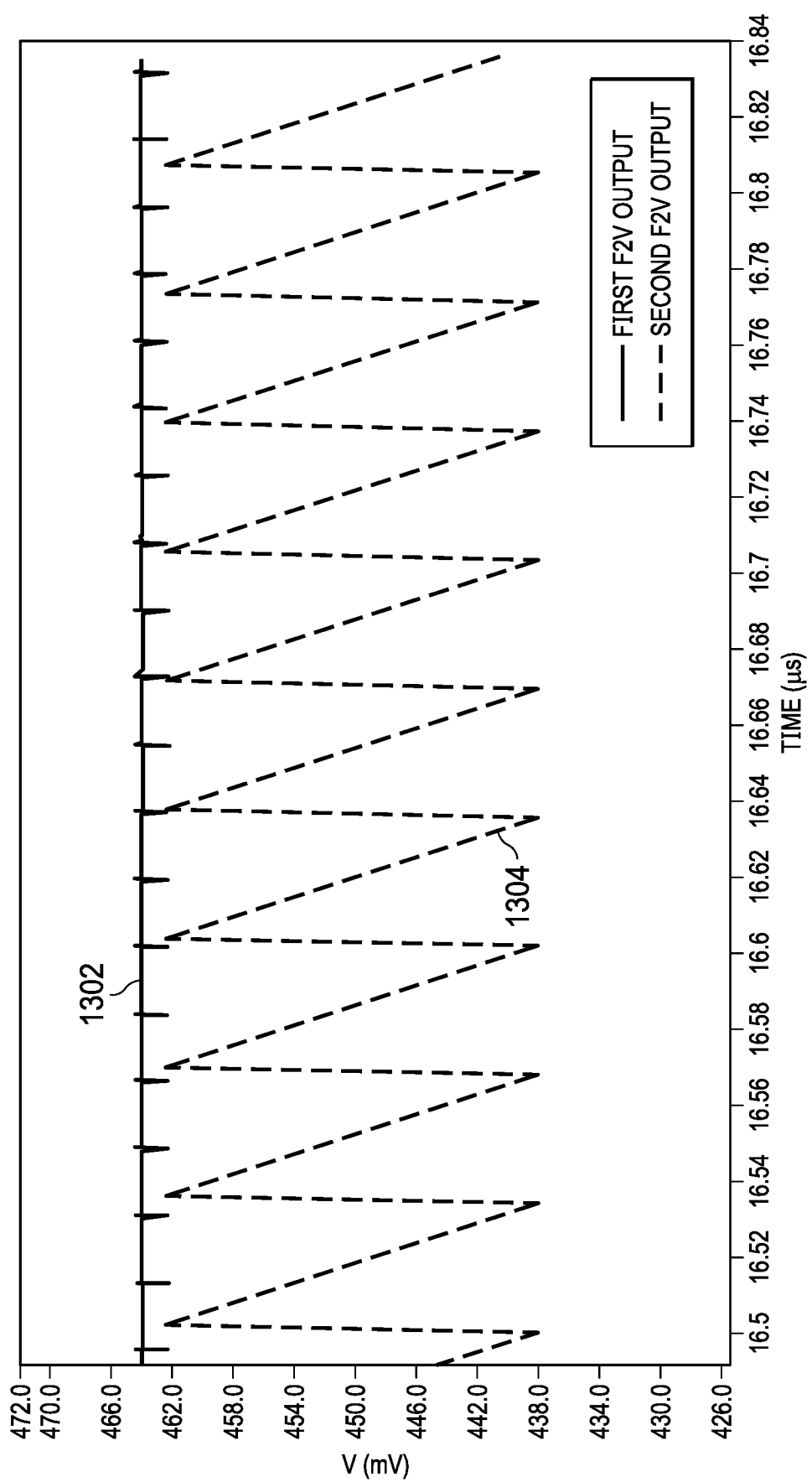
FIG. 13 depicts a graph of example output voltage waveforms associated with the F2V converter of FIGS. 3 and 8.

FIG. 13 depicts a graph 1300 of example output voltage waveforms 1302, 1304 associated with the second F2V converter 300 of FIG. 3 and the third F2V converter 800 of FIG. 8. In FIG. 13, the output voltage waveforms 1302, 1304 include a first example output voltage waveform 1302 and a second example output voltage waveform 1304. In FIG. 13, the first output voltage waveform 1302 can correspond to a waveform of the F2V output signal 232 of FIGS. 2 and/or 3. In FIG. 13, the second output voltage waveform 1304 can correspond to a waveform of the second F2V output signal 818 of FIG. 8. Advantageously, the second F2V converter 300 can generate the first output voltage waveform 1302 without the ripples generated by the third F2V converter 800, as depicted in the second output voltage waveform 1304 of FIG. 13.

Figure 14:
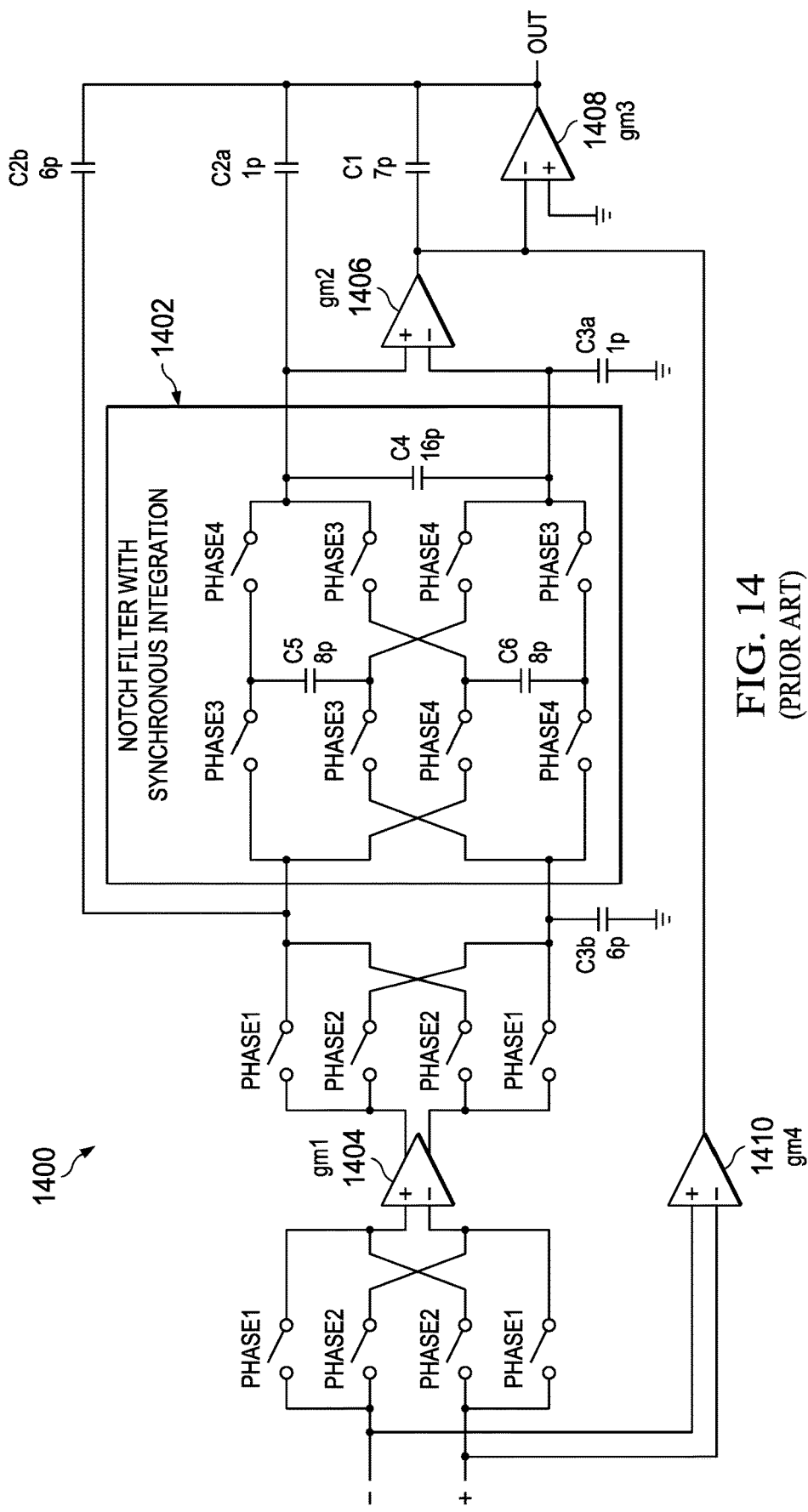
FIG. 14 is a schematic illustration of an example three-stage amplifier including an example switched capacitor circuit.

FIG. 14 is a schematic illustration of a three-stage amplifier 1400 including a switched capacitor circuit 1402. The three-stage amplifier 1400 includes a first amplifier (gm1) 1404, a second amplifier (gm2) 1406, a third amplifier (gm3) 1408, and a fourth amplifier (gm4) 1410. The three-stage amplifier 1400 includes a high-gain three-stage op-amp, gm1 1404, gm2 1406, gm3 1408, in parallel with a wider bandwidth two-stage op-amp, gm3 1408, gm4 1410.

In FIG. 14, the three-stage amplifier 1400 includes the switched capacitor circuit 1402 to add basic chopper stabilization to the input stage, gm1 1404, in the DC path. In FIG. 14, the switched capacitor circuit 1402 integrates the output of gm1 1404 synchronous to the chopping before transferring the signal to the next stage, gm2 1406. In FIG. 14, the switched capacitor circuit 1402 implements a notch filter to reduce ripples generated by gm1 1404. Advantageously, the switched capacitor circuits 302, 304, 306, 308 can convert frequency information to voltage information and, thus, are an improvement over the switched capacitor circuit 1402 of FIG. 14 that does not convert frequency information to voltage information.

Advantageously, the switched capacitor circuits 302, 304, 306, 308 of FIG. 3 are included in the second F2V converter 300 of FIG. 3 rather than in an amplifier, such as the three-stage amplifier 1400 of FIG. 14. For example, the switched capacitor circuits 302, 304, 306, 308 can reduce and/or otherwise eliminate ripples being delivered to an input of an amplifier, such as the amplifier 204 of FIG. 2, to improve stability control of the FLL circuit 110A, 110B of FIGS. 1 and/or 2. The three-stage amplifier 1400 of FIG. 14 does not reduce and/or otherwise eliminate ripples being delivered to an input of an amplifier because the three-stage amplifier 1400 can correspond to, in some examples, the amplifier 204. Accordingly, the three-stage amplifier 1400 may not reduce ripples at an input of the three-stage amplifier 1400 because the switched capacitor circuit 1402 of FIG. 14 is coupled between gm1 1404 and gm2 1406 and, thus, not at the input of the three-stage amplifier 1400.

Figure 15A:
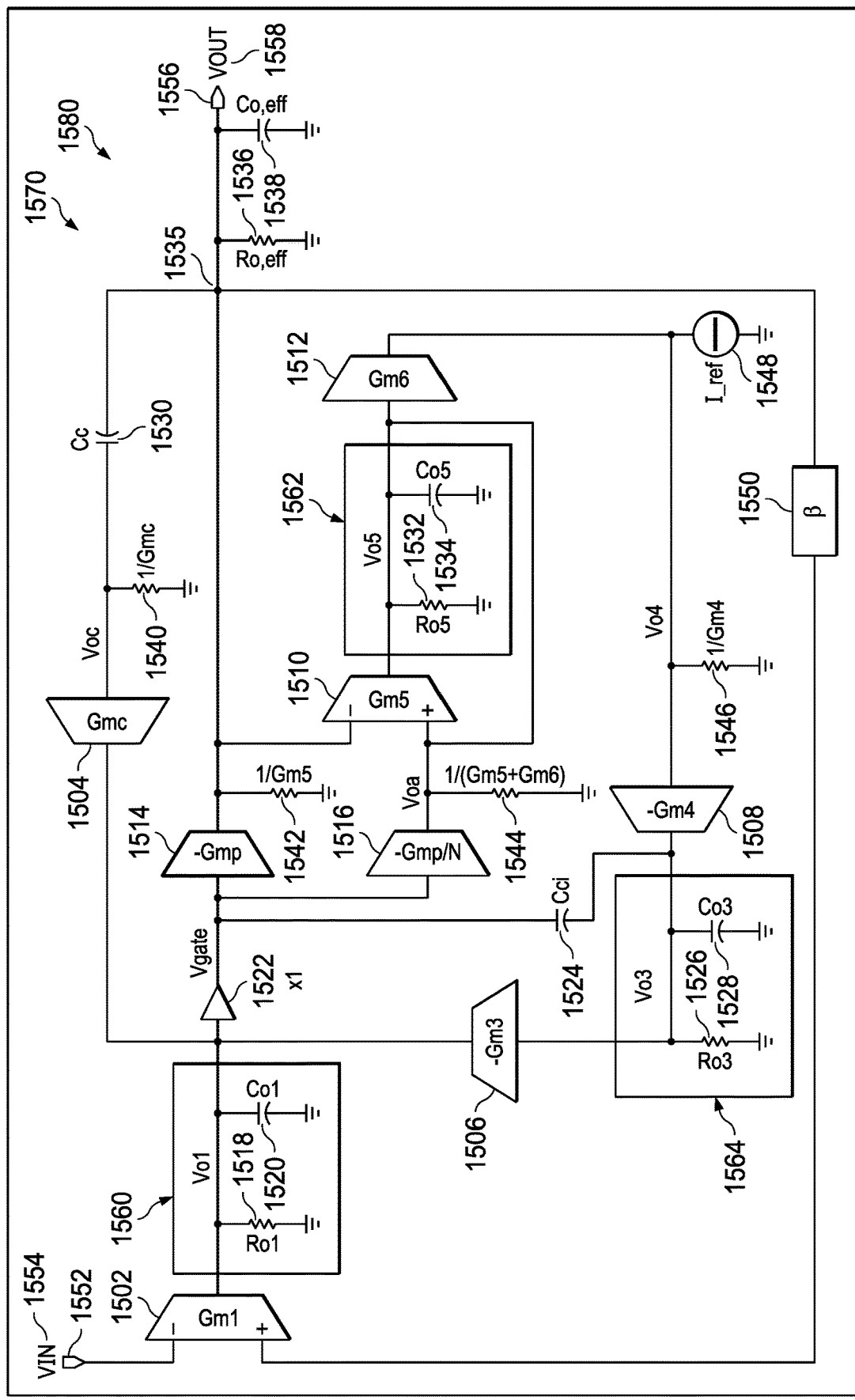
FIGS. 15A, 15B, and 15C are schematic illustrations of an example implementation of the LDO circuit of FIG. 1.

FIG. 15A is a schematic illustration of an example implementation of the LDO circuit 148 of FIG. 1. In FIG. 15A, the LDO circuit 148 includes a first example amplifier (Gm1) 1502, a second example amplifier (Gmc) 1504, a third example amplifier (−Gm3) 1506, a fourth example amplifier (−Gm4) 1508, a fifth example amplifier (Gm5) 1510, a sixth example amplifier (Gm6) 1512, a seventh example amplifier (−Gmp) 1514, an eighth example amplifier (−Gmp/N) 1516, a first example resistor (Ro1) 1518, a first example capacitor (Co1) 1520, an example buffer (x1) 1522, a second example capacitor (CcI) 1524, a third example resistor (Ro3) 1526, a third example capacitor (Co3) 1528, a fourth example capacitor (Cc) 1530, a fifth example resistor (Ro5) 1532, a fifth example capacitor (Co5) 1534, a sixth example resistor (Ro,eff) 1536, a sixth example capacitor (Co,eff) 1538, a first example impedance (1/Gmc) 1540, a second example impedance (1/Gm5) 1542, a third example impedance (1/(Gm5+Gm6)) 1544, a fourth example impedance (1/Gm4) 1546, an example reference current (I_ref) 1548, and an example beta (β) (e.g., a beta circuit, a feedback circuit, etc.) 1550. Alternatively, the LDO circuit 148 of FIG. 15A may not include the sixth resistor 1536 and/or the sixth capacitor 1538.

In the illustrated example of FIG. 15A, although the first resistor 1518, the third resistor 1526, the fifth resistor 1532, and the sixth resistor 1536 are depicted as discrete elements (e.g., resistors), alternatively, one or more of the first resistor 1518, the third resistor 1526, the fifth resistor 1532, and/or the sixth resistor 1536 may be representative of a resistance, an impedance, etc., and, thus, may not be discrete element(s). For example, one or more of the first resistor 1518, the third resistor 1526, the fifth resistor 1532, and/or the sixth resistor 1536 can be a resistance associated with a semiconductor substrate, a conductive element (e.g., a wire trace), or one or more circuit components, such as a transistor.

In the illustrated example of FIG. 15A, although the first capacitor 1520, the second capacitor 1524, the third capacitor 1528, the fourth capacitor 1530, and/or the fifth capacitor 1534 are depicted as discrete elements (e.g., capacitors), alternatively, one or more of the first capacitor 1520, the second capacitor 1524, the third capacitor 1528, the fourth capacitor 1530, and/or the fifth capacitor 1534 may be representative of a capacitance, an impedance, etc., and, thus, may not be discrete element(s). For example, one or more of the first capacitor 1520, the second capacitor 1524, the third capacitor 1528, the fourth capacitor 1530, and/or the fifth capacitor 1534 can be a capacitance associated with a semiconductor substrate, a conductive element (e.g., a wire trace), or one or more circuit components, such as a transistor.

In the illustrated example of FIG. 15A, −Gm3 1506, −Gm4 1508, −Gmp 1514, and −Gmp/N 1516 are inverting gain stages. For example, one or more of −Gm3 1506, −Gm4 1508, −Gmp 1514, and/or −Gmp/N 1516 can be implemented with one or more MOSFETs having a gate coupled to a respective drain. In the example of FIG. 15, Gm1 1502, Gmc 1504, Gm5 1510, and Gm6 1512 are positive gain stages. Alternatively, one or more of Gm1 1502, Gmc 1504, −Gm3 1506, −Gm4 1508, Gm5 1510, Gm6 1512, −Gmp 1514, and/or −Gmp/N 1516 may be a different type of gain stage.

In the illustrated example of FIG. 15A, a first input of Gm1 1502 (designated by a '−' symbol) is coupled to a first example terminal 1552, at which an example input voltage (VIN) 1554 can be present and/or otherwise available. In FIG. 15A, a second input of Gm1 1502 (designated by a '+' symbol) is coupled to beta 1550, an output of −Gmp 1514, a first input of Gm5 1510 (designated by a '+' symbol), the fourth capacitor 1530, the sixth resistor 1536, the sixth capacitor 1538, and a second example terminal 1556, at which an example output voltage (VOUT) 1558 can be present and/or otherwise available. VOUT 1558 can be used to generate an LDO output and can be used to generate Miller compensation to achieve a large capacitance without a physically large capacitor implementation (e.g., to achieve Miller compensation). In FIG. 15A, the fourth capacitor 1530, beta 1550, −Gmp 1514, and Gm5 1510 are coupled at an example node 1535. In FIG. 15A, the first terminal 1552 and the second terminal 1556 are electrical conductors or contacts, such as a leg, a pin, a via, etc., of an integrated circuit.

In the illustrated example of FIG. 15A, the current flowing through Gm1 1502 and Gmc 1504 is coupled with the first resistor 1518 and the second capacitor 1520 to generate DC gain and Miller compensation feedback. In the example of FIG. 15A, the signal outputs of Gm1 1502, Gmc 1504, and −Gm3 1506 are accumulated in the current domain on the net input of the buffer 1522. In the example of FIG. 15A, the buffer 1522 is and/or otherwise is representative of a non-inverting buffer having a gain of 1V/V. For example, the buffer 1522 can be used to buffer an input voltage to the buffer 1522 onto Vgate with a lower impedance than RO1 1518. In such examples, the loading effect from the input of the buffer 1522 and the output of the buffer 1522 are decoupled. In some such examples, the buffer 1522 can be implemented with a source-follower FET.

In the illustrated example of FIG. 15A, an output of Gm1 1502 is coupled to the first resistor 1518, the first capacitor 1520, an input of the buffer 1522, an output of Gmc 1504, and an output of Gm3 1506. In FIG. 15A, the buffer 1522 is coupled to the second capacitor 1524, an input of −Gmp 1514, and an input of −Gmp/N 1516. In FIG. 15A, an output of −Gmp/N 1516 is coupled to a first input of Gm5 1510 (designated by a '−' symbol), an output of Gm5 1510, the fifth resistor 1532, the fifth capacitor 1534, and an input of Gm6 1512. In FIG. 15A, an output of −Gmp 1514 is coupled to a second input of Gm5 1510 (designated by a '+' symbol), the fourth capacitor 1530, beta 1550, the second input of Gm1 1502, the sixth resistor 1536, the sixth capacitor 1538, and the second terminal 1556.

In the illustrated example of FIG. 15A, an output of Gm6 1512 is coupled to the reference current 1548 and an input of −Gm4 1508. In FIG. 15A, an output of −Gm4 1508 is coupled to the second capacitor 1524, the third resistor 1526, the third capacitor 1528, and an input of −Gm3 1506. In FIG. 15A, Gm1 1502, Gmc 1504, −Gm3 1506, −Gm4 1508, Gm5 1510, Gm6 1512, −Gmp 1514, and −Gmp/N 1516 are transconductance amplifiers. Alternatively one or more of Gm1 1502, Gmc 1504, −Gm3 1506, −Gm4 1508, Gm5 1510, Gm6 1512, −Gmp 1514, −Gmp/N 1516 may be a different type of amplifier.

In the illustrated example of FIG. 15A, although the first impedance 1540, the second impedance 1542, the third impedance 1544, and the fourth impedance 1546 are depicted as resistors, or resistive elements, the impedances 1540, 1542, 1544, 1546 are not physical elements, but instead representative of an electrical impedance at the respective nodes of the LDO circuit 148. Alternatively, one or more of the impedances 1540, 1542, 1544, 1546 may be replaced with one or more resistive elements, such as a resistor or other component (e.g., discrete component).

In the illustrated example of FIG. 15A, the LDO circuit 148 includes two regulation loops (e.g., regulation control loops) 1570, 1580. The two regulation loops 1570, 1580 include an example voltage regulation loop 1570 depicted in further detail in the illustrated example of FIG. 15B, and an example current regulation loop 1580 depicted in further detail in the illustrated example of FIG. 15C. In the example of FIGS. 15A and/or 15B, the voltage regulation loop 1570 can correspond to a main regulation loop, or a main LDO error amplifier. In FIGS. 15A and/or 15C, the current regulation loop 1580 can correspond to a current limit loop, or a current limit amplifier.

In the illustrated example of FIGS. 15A and/or 15B, the voltage regulation loop 1570 includes Gm1 1502, −Gmp 1514, and Gmc 1504. For example, the voltage regulation loop 1570 can correspond to Gm1 1502, a first RC network 1560 including the first resistor 1518 and the second capacitor 1520, the buffer 1522, −Gmp 1514, the fourth capacitor 1530, and Gmc 1504.

In the illustrated example of FIGS. 15A and/or 15B, the LDO circuit 148 includes the voltage regulation loop 1570 to generate an LDO output (e.g., VOUT 1558) based on a voltage comparison. For example, the voltage regulation loop 1570 can generate VOUT 1558 based on a comparison (e.g., a voltage comparison) by Gm1 1502 of VIN 1554 and VOUT 1558. In such examples, Gm1 1502 can adjust a voltage output (Vo1) of Gm1 1502 based on the comparison.

In the illustrated example of FIGS. 15A and/or 15C, the current regulation loop 1580 includes −Gmp 1514, −Gmp/N 1516, Gm5 1510, Gm6 1512, −Gm4 1508, and −Gm3 1506. For example, the current regulation loop 1580 can correspond to −Gmp 1514, −Gmp/N 1516, Gm5 1510, a second RC network 1562 including the fifth resistor 1532 and the fifth capacitor 1534, Gm6 1512, the reference current 1548, −Gm4 1508, the second capacitor 1524, a third RC network

1564 including the third resistor 1526 and the third capacitor 1528, −Gm3 1506, and the buffer 1522.

In the illustrated example of FIGS. 15A and/or 15C, the LDO circuit 148 includes the current regulation loop 1580 to generate an LDO output (e.g., VOUT 1558) based on a current comparison. For example, the current regulation loop 1580 can generate VOUT 1558 based on a comparison (e.g., a current comparison) of a current output by Gm6 1512 and the reference current 1548. In such examples, the current output by Gm6 1512 is based on a current output of the LDO circuit 148. For example, −Gmp 1514 receives a first voltage (Vgate) and amplifies the first voltage to generate VOUT 1558, which is delivered to the first input of Gm5 1510. −Gmp/N 1516, which is a scaled version of −Gmp 1514, receives Vgate and generates a second voltage (VOA), which is delivered to the second input of Gm5 1510. Gm5 1510 outputs a first current based on the comparison of the VOUT 1558 and VOA. Gm6 1512 receives the first current and amplifies the first current to generate a second current, which is delivered to −Gm4 1508.

In example operation, the LDO circuit 148 of FIG. 15A can operate in a voltage regulation mode (e.g., a voltage regulation control mode, a voltage regulation loop mode, etc.) or a current regulation mode (e.g., a current regulation control mode, a current regulation loop mode, etc.). During the voltage regulation mode, Gm1 1502 drives the first RC network 1560, which drives the buffer 1522, which drives −Gmp 1514 and, thus, generate VOUT 1558 based on a voltage difference or voltage comparison of VIN 1554 and VOUT 1558 at Gm1 1502. During the voltage regulation mode, −Gmp 1514 drives Gmc 1504, which can be operative as a compensation amplifier for the voltage regulation loop 1570.

In example operation, during the voltage regulation mode, −Gmp/N 1516 can sense current being delivered to the second terminal 1556. In example operation, the sensed current can be amplified by Gm5 1510, which can be operative as a gain stage (e.g., a gain stage amplifier). In example operation, Gm5 1510 can drive Gm6 1512 to output an amplified current based on the sensed current by −Gmp/N 1516. In example operation, the LDO circuit 148 can transition from the voltage regulation mode to the current regulation mode in response to the current generated by Gm6 1512 being greater than the reference current 1548. Advantageously, the second capacitor 1524 can cause a smooth transition from the voltage regulation mode to the current regulation mode. For example, during the voltage regulation mode, −Gm4 1508 is not active (e.g., the current from Gm6 1512 is less than the reference current 1548) and, thus, the second capacitor 1524 can decouple the current regulation loop 1580 from the voltage regulation loop 1570. In other examples, in response to the transition from the voltage regulation mode to the current regulation mode, −Gm4 1508 can become active and/or otherwise generate a non-zero output (e.g., the current from Gm6 1512 is greater than the reference current 1548) and, thus, the second capacitor 1524 can couple the output of −Gm4 1508 to the input of −Gmp 1514 to effectuate control of VOUT 1558 based on regulating a current output of the LDO circuit 148.

Figure 15B:
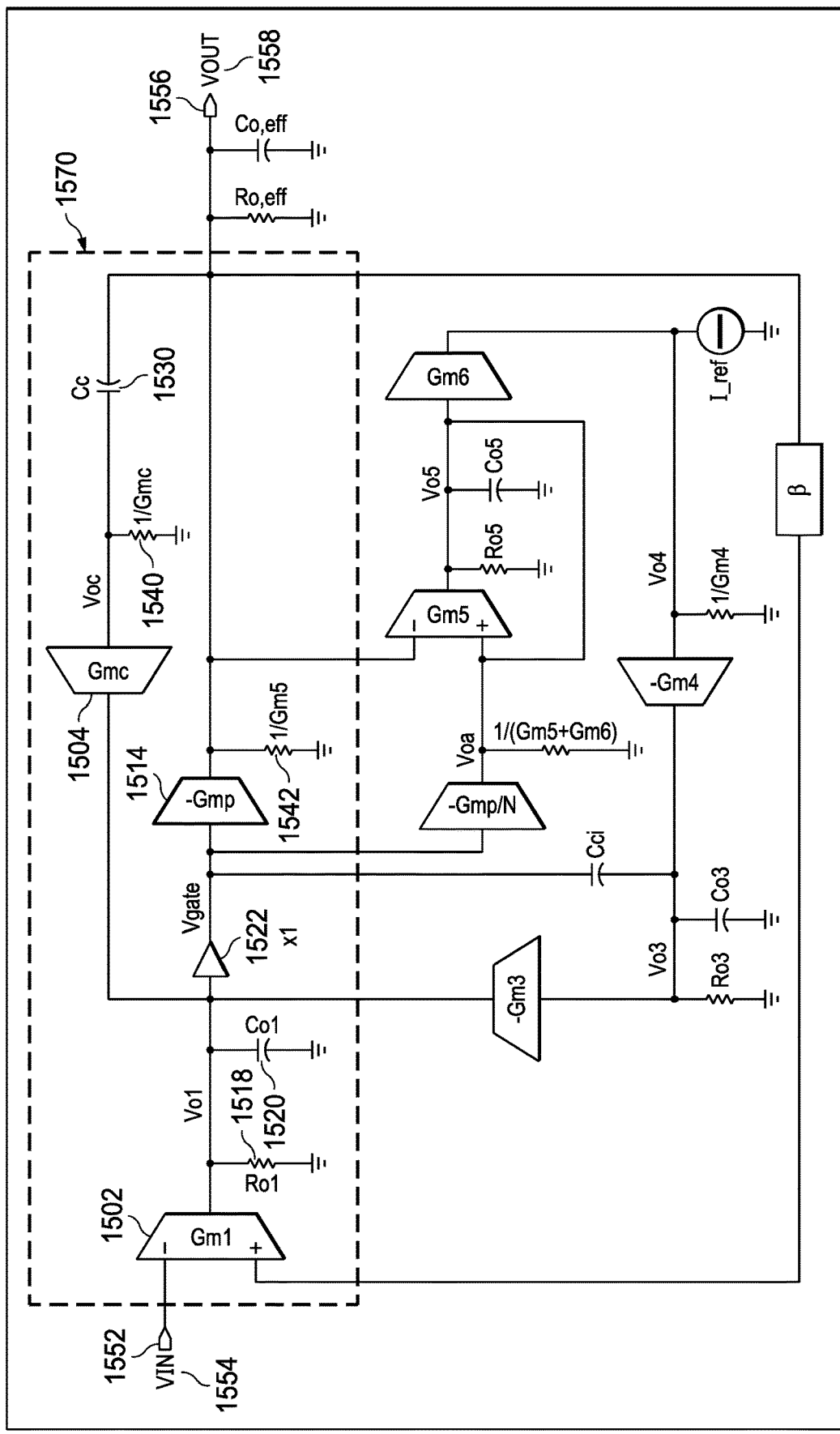
Figure 16A:
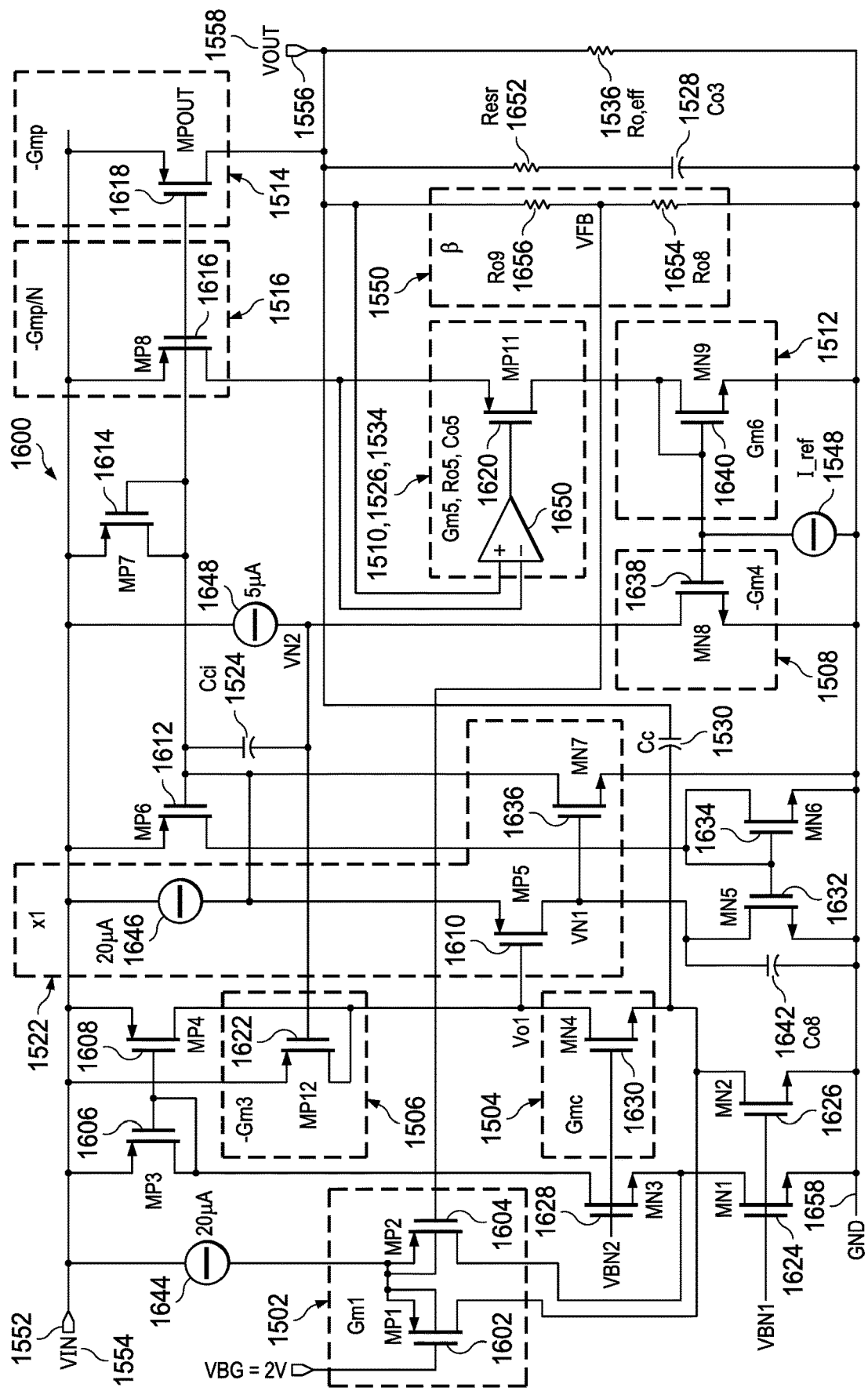
FIGS. 16A, 16B, and 16C is a schematic illustration of an example implementation of the LDO circuit of FIGS. 1 and/or 15A-15C.

FIG. 16A is a schematic illustration of a second example LDO circuit 1600. The second LDO circuit 1600 is an example implementation of the LDO circuit 148 of FIGS. 1 and/or 15A-15C. In FIG. 16A, the second LDO circuit 1600 includes the second capacitor 1524, the third capacitor 1528, the fourth capacitor 1530, the sixth resistor 1536, and the reference current 1548 of FIGS. 15A, 15B, and/or 15C.

In the illustrated example of FIG. 16A, the second LDO circuit 1600 includes a first example PMOS transistor (MP1) 1602, a second example PMOS transistor (MP2) 1604, a third example PMOS transistor (MP3) 1606, a fourth example PMOS transistor (MP4) 1608, a fifth example PMOS transistor (MP5) 1610, a sixth example PMOS transistor (MP6) 1612, a seventh example PMOS transistor (MP7) 1614, an eighth example PMOS transistor (MP8) 1616, a ninth example PMOS transistor (MPOUT) 1618, an eleventh example PMOS transistor (MP11) 1620, and a twelfth example PMOS transistor (MP12) 1622.

In the illustrated example of FIG. 16A, the second LDO circuit 1600 includes a first example NMOS transistor (MN1) 1624, a second example NMOS transistor (MN2) 1626, a third example NMOS transistor (MN3) 1628, a fourth example NMOS transistor (MN4) 1630, a fifth example NMOS transistor (MN5) 1632, a sixth example NMOS transistor (MN6) 1634, a seventh example NMOS transistor (MN7) 1636, an eighth example NMOS transistor (MN8) 1638, a ninth example NMOS transistor (MN9) 1640, an eighth example capacitor (Co8) 1642, a first example current source 1644, a second example current source 1646, a third example current source 1648, an example amplifier 1650, a seventh example resistor (Resr) 1652, an eighth example resistor (Ro8) 1654, and a ninth example resistor (Ro9) 1656.

In the illustrated example of FIG. 16A, although the seventh resistor 1652, the eighth resistor 1654, and the ninth resistor 1656 are depicted as discrete elements (e.g., resistors), alternatively, one or more of the seventh resistor 1652, the eighth resistor 1654, and the ninth resistor 1656 may be representative of a resistance, an impedance, etc., and, thus, may not be discrete element(s). For example, one or more of the seventh resistor 1652, the eighth resistor 1654, and the ninth resistor 1656 can be a resistance associated with a semiconductor substrate, a conductive element (e.g., a wire trace), or one or more circuit components, such as a transistor.

In the illustrated example of FIG. 16A, the first current source 1644 and the second current source 1646 are 20 micro-Ampere (μA) current sources, and the third current source 1648 is a 5 μA. Alternatively, one or more of the first current source 1644, the second current source 1646, and/or the third current source 1648 may be different. In FIG. 16A, the first current source 1644, the second current source 1646, and the third current source 1648 are PMOS devices (e.g., PMOS transistors, PMOS drain devices, etc.). Alternatively, one or more of the first current source 1644, the second current source 1646, and/or the third current source 1648 may be a different type of current source, such as a resistor (e.g., a variable resistor).

Figure 15C:
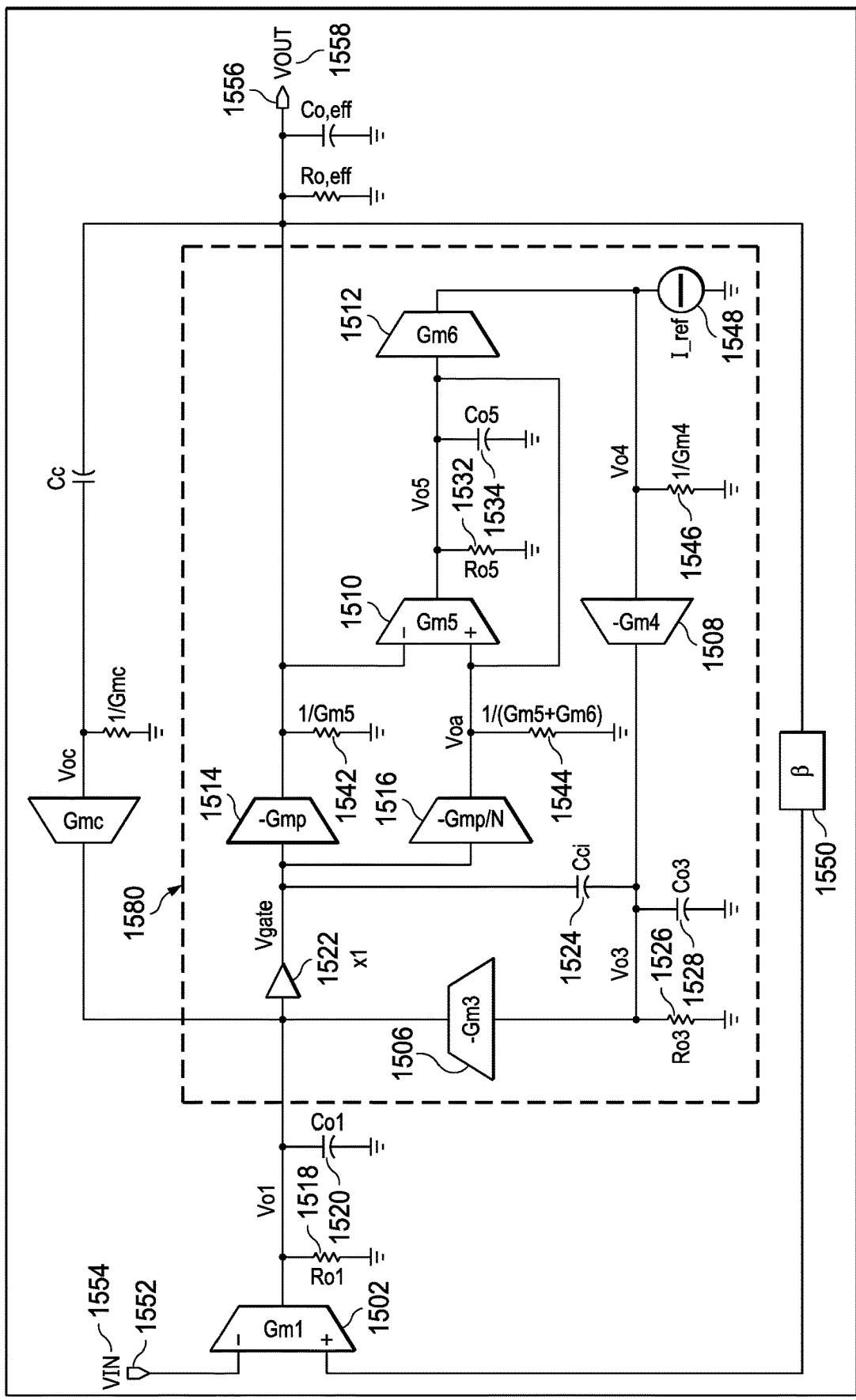

In the illustrated example of FIG. 16A, MP1 1602 and MP2 1604 can correspond to and/or otherwise be an example implementation of Gm1 1502 of FIGS. 15A-15C. In the example of FIG. 16A, MP12 1622 can correspond to and/or otherwise be an example implementation of −Gm3 1506 of FIGS. 15A-15C. In FIG. 16A, MN8 1638 can correspond to and/or otherwise be an example implementation of −Gm4 1508 of FIGS. 15A-15C. In FIG. 16A, the amplifier 1650 and MP11 1620 can correspond to and/or otherwise be an example implementation of at least one of Gm5 1510, the fifth resistor 1532, or the fifth capacitor 1534 of FIGS. In FIG. 16A, the amplifier 1650 is a current sense amplifier (CSA), such as an operational transconductance amplifier (OTA) op-amp. For example, the OTA op-amp can force the drain voltage of MP8 1616 to be equal (e.g., approximately equal, equal within a range of −0.05 V to 0.05

V, etc.) to the drain voltage of MPOUT 1618. Alternatively, the amplifier 1650 may be implemented with a folded cascade or with any other type of amplifier (e.g., a 2-stage transconductance amplifier). In FIG. 16A, the MN9 1640 can correspond to and/or otherwise be an example implementation of Gm6 1512 of FIGS. 15A-15C. In FIG. 16A, MPOUT 1618 can correspond to and/or otherwise be an example implementation of −Gmp 1514 of FIGS. 15A-15C. In FIG. 16A, MP8 1616 can correspond to and/or otherwise be an example implementation of −Gmp/N 1516 of FIGS. 15A-15C. In FIG. 16A, MN4 1630 can correspond to and/or otherwise be an example implementation of Gmc 1610.

In the illustrated example of FIG. 16A, MP5 1610, MN7 1637, and the second current source 1646 can correspond to and/or otherwise be an example implementation of the buffer 1522 of FIGS. 15A-15C. In FIG. 16A, the eighth resistor 1654 and the ninth resistor 1656 can correspond to and/or otherwise be an example implementation of the beta 1550 of FIGS. 15A-15C.

Figure 16B:
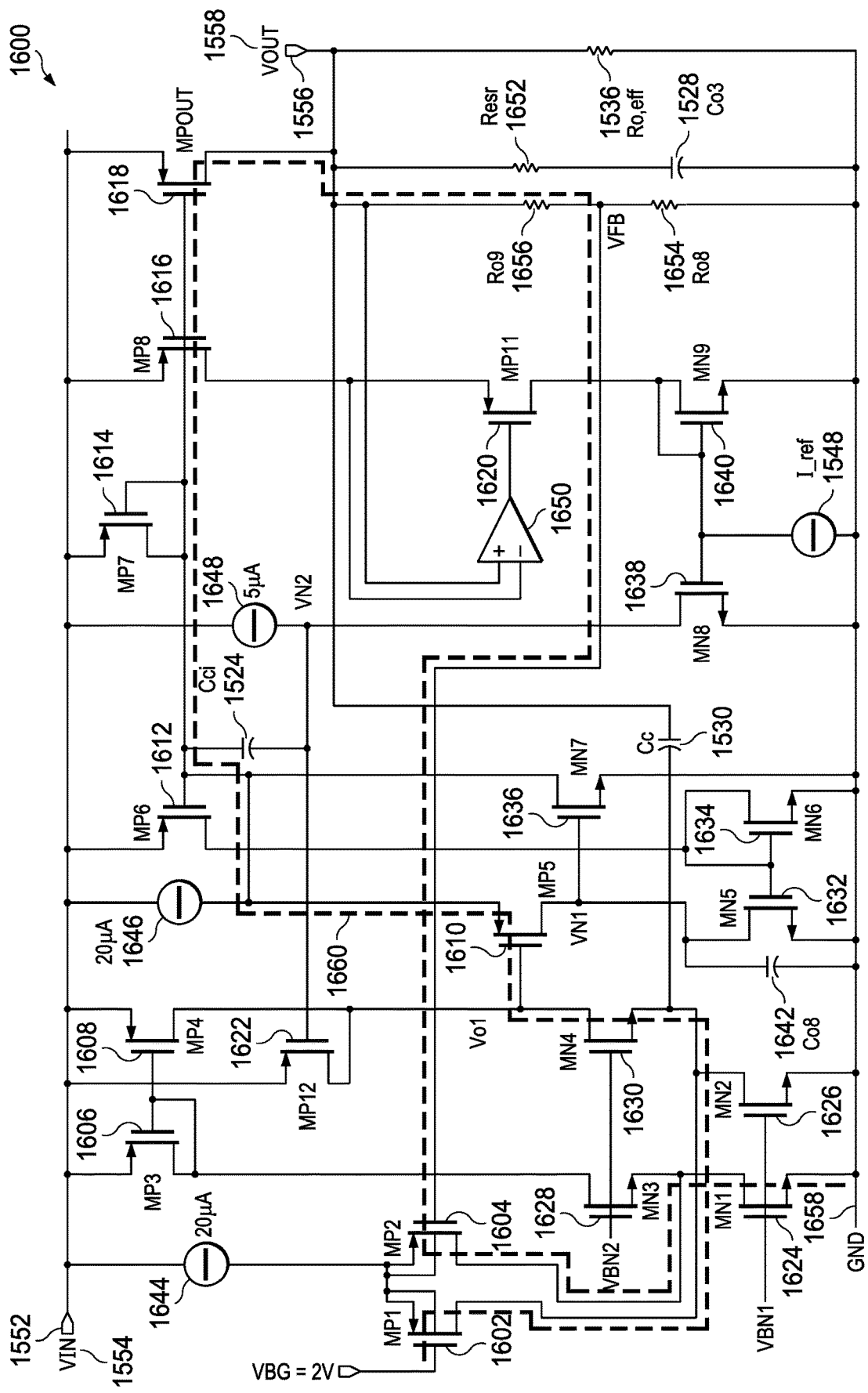
Figure 16C:
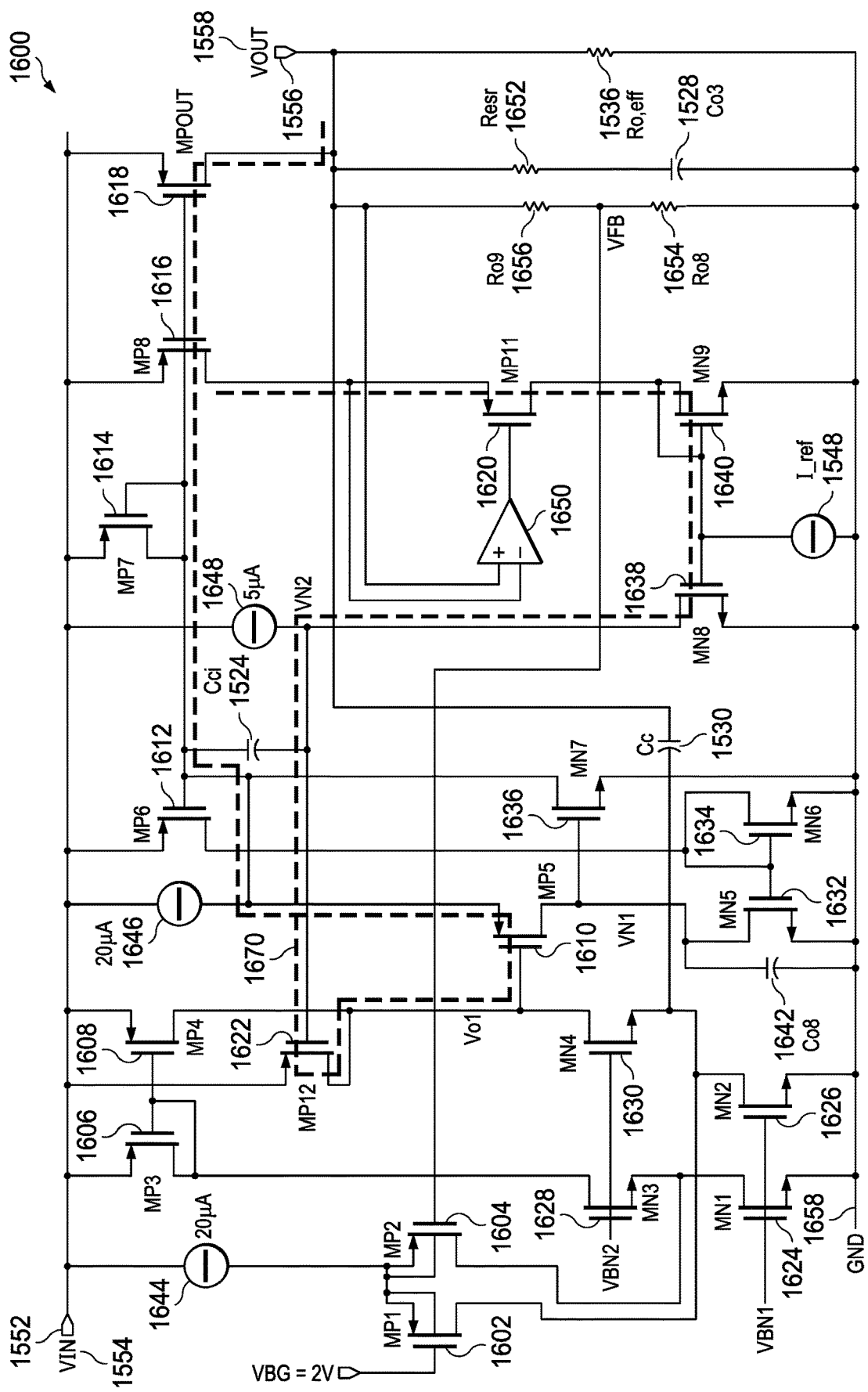

In the illustrated example of FIG. 16A, first current terminals, such as source terminals (e.g., source current terminals), of MP1 1602 and MP2 1604 are coupled to each other and are coupled to the first current source 1644. A second current terminal, such as a drain terminal (e.g., a drain current terminal) of MP1 1602 is coupled to a source terminal of MN4 1630, a drain terminal of MN2 1626, and the fourth capacitor 1530. A drain terminal of MN4 1630 is coupled to a gate (e.g., a gate terminal) of MP5 1610. A source terminal of MP5 1610 is coupled to the second current source 1646, a drain terminal of MN7 1636, a gate terminal of MP6 1612, the second capacitor 1524, a drain terminal and a gate terminal of MP7 1614, a gate terminal of MP8 1616, and a gate terminal of MPOUT 1618. A drain terminal of MPOUT 1618 is coupled to the fourth capacitor 1530, the second terminal 1556, the ninth resistor 1656, and a first input (designated with a '+' symbol) of the amplifier 1650. The ninth resistor 1656 is coupled to the eighth resistor 1654 and a gate terminal of MP2 1604. A drain terminal of MP2 1604 is coupled to a source terminal of MN3 1628 and a drain terminal of MN1 1624. A source terminal of MN1 1624 is coupled to a reference rail 1658 (e.g., a reference voltage rail, a ground rail, a ground voltage rail, etc.).f In the illustrated example of FIG. 16A, a drain terminal of MP8 1616 is coupled to a second input (designated with a '−' symbol) of the amplifier 1650 and a source terminal of MP11 1620. In FIG. 16, a drain terminal of MP11 1620 is coupled to a drain terminal of MN9 1640, a gate terminal of MN9 1640, the reference current 1548, and a gate of MN8 1638. In FIG. 16, a source terminal of MN8 1638 is coupled to the reference rail 1658. In FIG. 16, a drain terminal of MN8 1638 is coupled to the third current source 1648, the second capacitor 1524, and a gate terminal of MP12 1622. In FIG. 16, a drain terminal of MP12 1622 is coupled to a gate terminal of MP5 1610. Additional functional and/or structural relationships between components of the second LDO circuit 1600 are depicted in the illustrated examples of FIGS. 16A-16C.

FIG. 16B depicts an example voltage regulation loop 1660 of the second LDO circuit 1600 of FIG. 16. In FIG. 16B, the voltage regulation loop 1660 is represented as a dashed line that begins at MP1 1602 and ends at MN1 1624. In FIG. 16B, the voltage regulation loop 1660 can be an example implementation of, and/or otherwise correspond to, the voltage regulation loop 1570 of FIGS. 15A-15C. For example, the voltage regulation loop 1660 of FIG. 16B can include, be representative of, and/or otherwise correspond to, at least one of MP1 1602, MN4 1630, MP5 1610, MPOUT 1618, the ninth resistor 1656, MP2 1604, or MN1 1624.

FIG. 16C depicts an example current regulation loop 1670 of the second LDO circuit 1600 of FIG. 16. In FIG. 16C, the current regulation loop 1670 is represented as a dashed line that begins and ends at MP5 1610. In FIG. 16C, the current regulation loop 1670 can be an example implementation of, and/or otherwise correspond to, the current regulation loop 1580 of FIGS. 15A-15C. For example, the current regulation loop 1670 of FIG. 16C can include, be representative of, and/or otherwise correspond to, at least one of of FIG. 16C can include and/or otherwise correspond to at least one of MP5 1610, MP8 1616, MP11 1620, MN8 1638, or MP12 1622.

Turning back to FIG. 16A, the second LDO circuit 1600 executes current sensing based on MP8 1616 and MPOUT 1618 being sized in a radiometric manner. For example, the second LDO circuit 1600 can sense current with MP8 1616, which can be a factor of N (e.g., N=2, N=4, N=8, etc.) times smaller than MPOUT 1618. In example operation, MP11 1620 and the amplifier 1650 can force a drain-to-source voltage (VDS) of MP8 1616 and MPOUT 1618 to be substantially the same (e.g., each VDS within a range of −0.05 V to 0.05 V to each other). In example operation, the sensed current by MP8 1616 can flow to MN9 1640 by flowing through MP11 1620.

In example operation, as current increases so that VOUT 1558 decreases, MP2 1604 can have more tail current than MP1 1602. As current increases to a threshold (e.g., a current threshold), MP3 1606 and MP4 1608 conduct less current until MP3 1606 and MP4 1608 no longer conduct current. As the conducted current by MP3 1606 and MP4 1608 decrease, the second LDO circuit 1600 transitions from the voltage regulation loop to the current regulation loop.

In example operation, the amplifier 1650 can compare a first current at the first input of the amplifier 1650 to a second current at the second input of the amplifier 1650. In such examples, the first current can be generated by MP8 1616 and the second current can be generated by MPOUT 1618, where the second current is N times greater than the first current.

In example operation, the amplifier 1650 can generate a voltage at an output of the amplifier 1650 based on a difference between the first current and the second current. In some examples, in response to the difference between the first current and the second current being greater than a threshold (e.g., a current threshold), the amplifier 1650 can cause MN9 to not conduct by generating a voltage output at the gate of MN9 to cause MN9 to turn off. In such examples, the voltage regulation loop of the second LDO circuit 1600 can be operative and/or otherwise be dominant over the current regulation loop. With MN9 1640 and MN8 1638 turned off, the voltage regulation loop will generate and/or otherwise control VOUT 1558.

In some examples, in response to the difference between the first current and the second current being less than the threshold, the amplifier 1650 can invoke MN8 1620 to turn on by generating a voltage output at the gate of MN8 to cause MN8 to begin conducting. In such examples, the second LDO circuit 1600 can transition, switch, and/or otherwise change from (1) the voltage regulation loop being dominant over the current regulation loop and/or otherwise being operative to (2) the current regulation loop being dominant over the voltage regulation loop and/or otherwise being operative. For example, in response to MN9 1640 and MN8 1638 turned on and, thus, can effectuate the current regulation loop to generate and/or otherwise control VOUT 1558. In such examples, MN8 1638 can be a first stage of the current regulation loop (e.g., a current limit amplifier that corresponds to the current regulation loop), where MN8 1638 can have a relatively high output impedance. The first stage can drive MP12 1622, which can be a second stage of the current regulation loop. In response to MP12 1622 being driven, MP12 1622 can provide and/or otherwise deliver a quantity of current (e.g., a quantity of current from VLDO) to drive MP5 1610 and, thus, the remaining portion(s) of the current regulation loop.

Advantageously, the second LDO circuit 1600 includes the second capacitor 1524 to transition (e.g., smoothly transition) between regulation loops (e.g., from the voltage regulation loop to the current regulation loop, from the current regulation loop to the voltage regulation loop, etc.). For example, during voltage regulation mode, the second capacitor 1524 can decouple and/or otherwise electrically separate components associated with the current regulation loop (e.g., the current regulation loop depicted in the example of FIG. 16C) from components associated with the voltage regulation loop (e.g., the voltage regulation loop depicted in the example of FIG. 16B) in response to MN9 1640 and MN8 1638 being turned off. In other examples, during current regulation mode, the second capacitor 1524 can couple components associated with the current regulation loop (e.g., the current regulation loop depicted in the example of FIG. 16C) to components associated with the voltage regulation loop (e.g., the voltage regulation loop depicted in the example of FIG. 16B) in response to MN9 1640 and MN8 1638 being turned on.

FIG. 17 depicts a graph 1700 of an example LDO output voltage waveform 1702 associated with the LDO circuit 148 of FIGS. 1 and/or 15A-15C and/or the second LDO circuit 1600 of FIGS. 16A-16C. In FIG. 17, prior to an example current limit 1704 of 13.5 milliamps (mA), the LDO output voltage waveform 1702 is in steady state. In FIG. 17, advantageously, in response to the current limit 1704 being met, the LDO output voltage waveform 1702 decreases in a substantially linear manner.

In some examples, in response to a load current (e.g., a current delivered to the second terminal 1554) of the second LDO circuit 1600 of FIGS. 16A-16C meeting and/or otherwise satisfying the current limit 1704 (e.g., the load current being 13.5 mA or greater), the second LDO circuit 1600 can transition from the voltage regulation mode to the current regulation mode. In such examples, the amplifier 1650 can determine that a difference between the first current at the first input and the second current at the second input is less than a threshold and, thus, generate a gate voltage to turn on MN9 1640. In response to turning on MN9 1640, the second LDO circuit 1600 can be invoked to current regulation mode, as depicted in FIG. 17 in response to the meeting of the current limit 1704.

Figure 18:
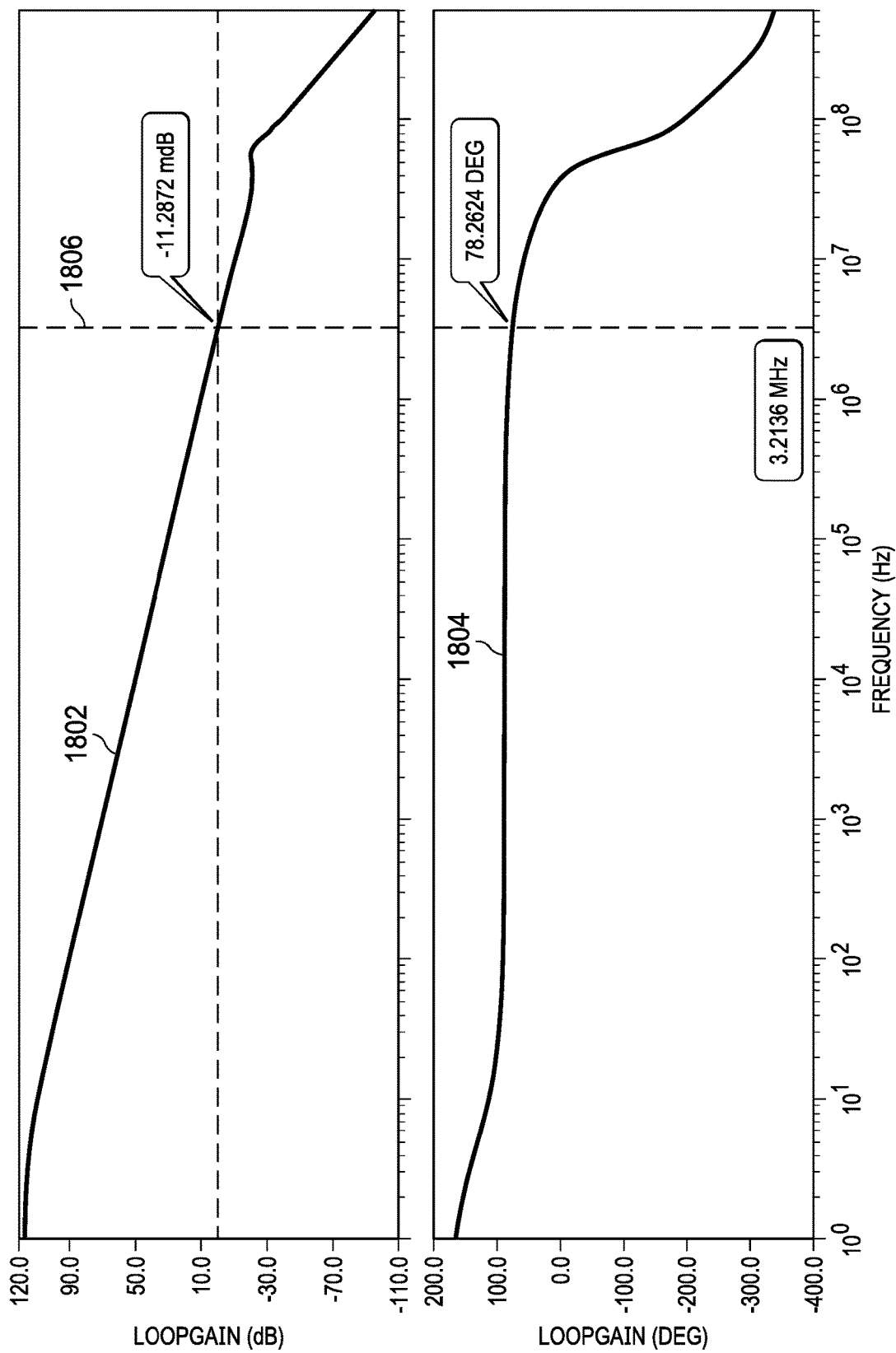
FIG. 18 depicts a bode plot of example frequency responses associated with the LDO circuit of FIGS. 1, 15A-15C, and/or 16A-16C.

FIG. 18 depicts a bode plot 1800 of example frequency responses 1802, 1804 associated with the LDO circuit 148 of FIGS. 1 and/or 15A-15C and/or the second LDO circuit 1600 of FIGS. 16A-16C. The frequency responses 1802, 1804 of the example of FIG. 18 correspond to and/or are otherwise representative of frequency response(s) of the current regulation loop 1580 of FIGS. 15A-15C and/or the current regulation loop depicted in FIG. 16C. In FIG. 18, the frequency responses 1802, 1804 include a first example frequency response 1802 and a second example frequency response 1804.

In the illustrated example of FIG. 18, the frequency responses 1802, 1804 have an example unity gain bandwidth 1806 of 3.2136 MHz. Advantageously, the unity gain bandwidth 1806 can be controlled and/or otherwise configured based on a capacitance of the second capacitor 1524 of FIGS. 15A-15C and/or 16A-16C. For example, a change in the capacitance of the second capacitor 1524 can cause a chance in the unity gain bandwidth 1806 depicted in FIG. 18.

Figure 19:
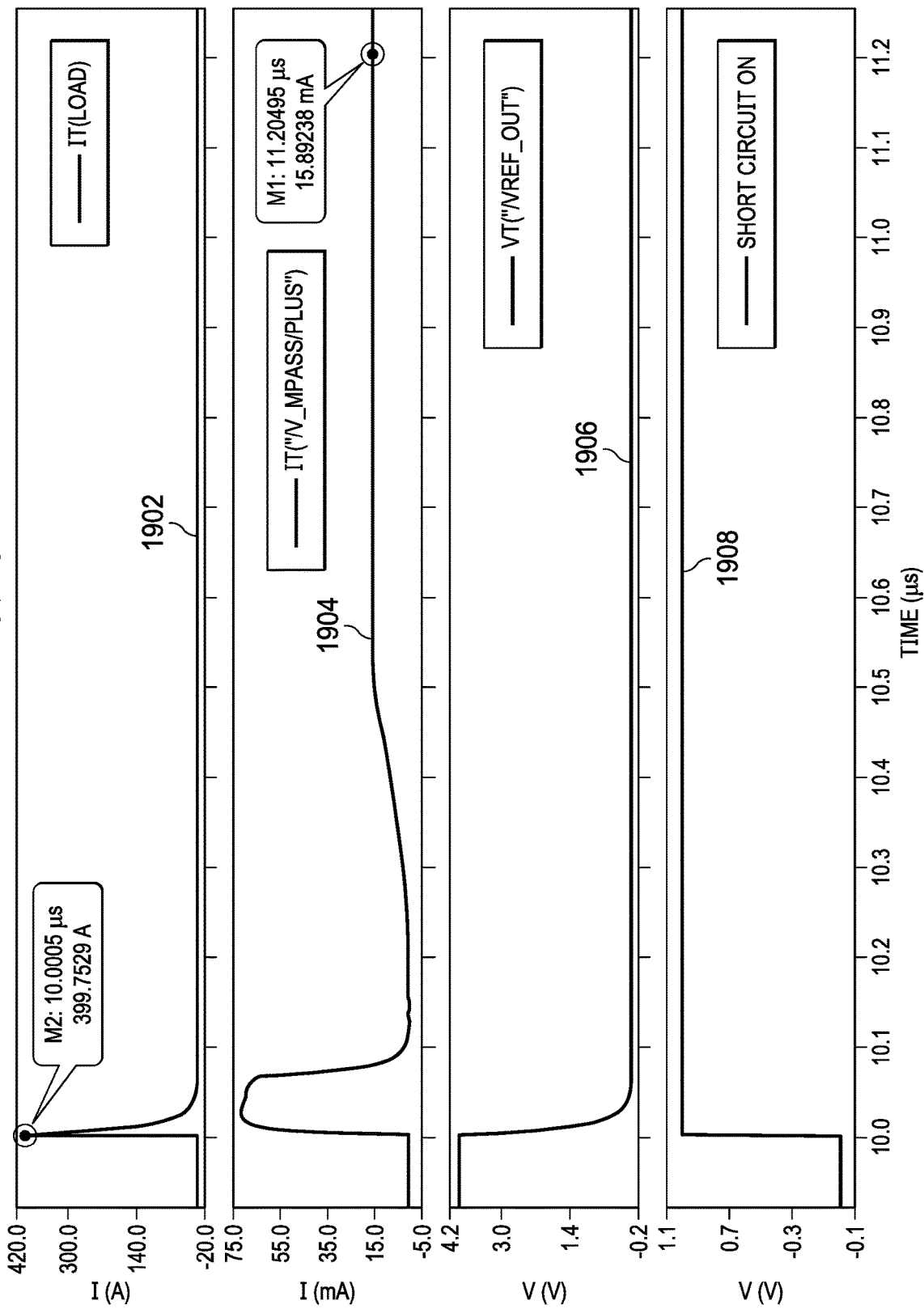
FIG. 19 depicts example waveforms associated with the LDO circuit of FIGS. 1, 15A-15C, and/or 16A-16C during a first example short-circuit operation.

FIG. 19 depicts example waveforms 1902, 1904, 1906, 1908 associated with the LDO circuit 148 of FIGS. 1 and/or 15A-15C and/or the second LDO circuit 1600 of FIGS. 16A-16C during a first example short-circuit operation. In FIG. 19, the waveforms 1902, 1904, 1906, 1908 are simulated waveforms. For example, the first short-circuit condition can correspond to a simulated hard-short condition, such as coupling the second terminal 1556 of FIGS. 15A-15C to a resistor having a relatively small resistance of 10 milliohms (mΩ) with the resistor being coupled to a ground voltage rail.

In the illustrated example of FIG. 19, the waveforms 1902 include a first example waveform 1902, a second example waveform 1904, a third example waveform 1906, and a fourth example waveform 1908. In FIG. 19, the first waveform 1902 corresponds to a load current, such as a current flowing to the second terminal 1556 of FIGS. 15A-15C. In FIG. 19, the second waveform 1904 corresponds to a pass-gate current, such as a current at the node 1535 of FIGS. 15A-15C. In FIG. 19, the third waveform 1906 corresponds to an LDO output voltage, such as VOUT 1558 of FIGS. 15A-15C. In FIG. 19, the fourth waveform 1908 corresponds to a digital signal generated by detecting current limit condition when LDO is under current-limit state.

In the illustrated example of FIG. 19, the first short-circuit condition occurs at approximately 10 microseconds (μs). Prior to the first short-circuit condition, the LDO circuit 148, 1600 is controlled using a voltage regulation loop. Advantageously, in response to the first short-circuit condition, the LDO circuit 148, 1600 transitions from the voltage regulation loop to a current regulation loop to effectuate safe operation of the LDO circuit 148, 1600. Advantageously, the transition from the voltage regulation loop to the current regulation loop does not generate oscillatory behavior (e.g., an oscillatory waveform) in response to transitioning from the voltage regulation loop (e.g., prior to the first short-circuit at 10 μs) to the current regulation loop (e.g., at 10 μs, after 10 μs, etc.) and, thus, improve operation of the LDO circuit 148, 1600 during various operating conditions.

Figure 20:
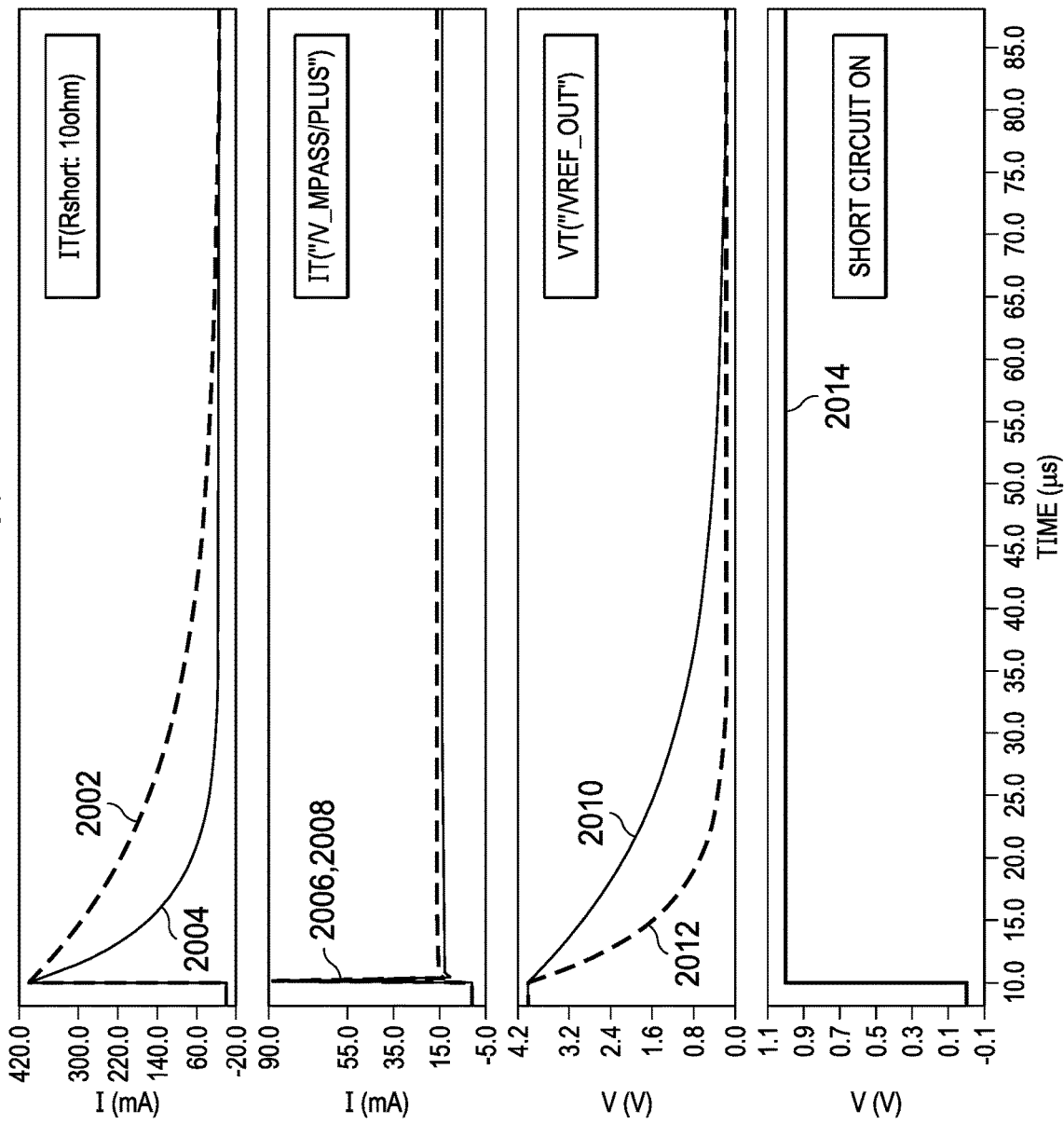
FIG. 20 depicts example waveforms associated with the LDO circuit of FIGS. 1, 15A-15C, and/or 16A-16C during a second example short-circuit operation.

FIG. 20 depicts example waveforms 2002, 2004, 2006, 2008, 2010, 2012, 2014 associated with the LDO circuit 148 of FIGS. 1 and/or 15A-15C and/or the second LDO circuit 1600 of FIGS. 16A-16C during a second example short-circuit operation. In FIG. 20, the waveforms 2002, 2004, 2006, 2008, 2010, 2012, 2014 are simulated waveforms. For example, the second short-circuit condition can correspond to a simulated soft-short condition, such as coupling the second terminal 1556 of FIGS. 15A-15C to a resistor having a relatively small resistance of 10 ohms (Ω) with the resistor being coupled to a ground voltage rail.

In the illustrated example of FIG. 20, the waveforms 2002, 2004, 2006, 2008, 2010, 2012, 2014 include a first example waveform 2002, a second example waveform 2004, a third example waveform 2006, a fourth example waveform 2008, a fifth example waveform 2010, a sixth example waveform 2012, and a seventh example waveform 2014. In FIG. 20, the first waveform 2002 corresponds to a first load current, such as a current flowing to the second terminal 1556 of FIGS. 15A-15C. For example, the first waveform 2002 can correspond to operation of the LDO circuit 148 of FIGS. 15A-15C during a soft-short condition when the third capacitor 1528 of FIGS. 15A-15C has a first example capacitance of 1.5 microfarads (μF). In FIG. 20, the second waveform 2004 corresponds to a second load current, such as a current flowing to the second terminal 1556 of FIGS. 15A-15C. For example, second waveform 2004 can correspond to operation of the LDO circuit 148 of FIGS. 15A-15C during a soft-short condition when the third capacitor 1528 of FIGS. 15A-15C has a second example capacitance of 0.5 microfarads (μF).

In the illustrated example of FIG. 20, the third waveform 2006 corresponds to a first pass-gate current waveform, such as a current at the node 1535 of FIGS. 15A-15C. For example, the third waveform 2006 can correspond to and/or otherwise be associated with the first waveform 2002 of FIG. 20. In FIG. 20, the fourth waveform 2008 corresponds to a second pass-gate current waveform, such as a current at the node 1535 of FIGS. 15A-15C. For example, the fourth waveform 2008 can correspond to and/or otherwise be associated with the second waveform 2004 of FIG. 20.

In the illustrated example of FIG. 20, the fifth waveform 2010 corresponds to a first LDO output voltage, such as VOUT 1558 of FIGS. 15A-15C. For example, the fifth waveform 2010 can correspond to and/or otherwise be associated with the first waveform 2002 and the third waveform 2006 of FIG. 20. In FIG. 20, the sixth waveform 2012 corresponds to a second LDO output voltage, such as VOUT 1558 of FIGS. 15A-15C. For example, the sixth waveform 2012 can correspond to and/or otherwise be associated with the second waveform 2004 and the fourth waveform 2008 of FIG. 20.

In the illustrated example of FIG. 20, the seventh waveform 2014 corresponds to a digital signal generated by detecting current limit condition when LDO is under current-limit state. In FIG. 20, the second short-circuit condition occurs at approximately 10 μs. Prior to the second short-circuit condition, the LDO circuit 148, 1600 is controlled using a voltage regulation loop (e.g., the voltage regulation loop 1570 of FIGS. 15A-15C). Advantageously, in response to the second short-circuit condition, the LDO circuit 148, 1600 transitions from the voltage regulation loop to a current regulation loop (e.g., the current regulation loop 1580 of FIGS. 15A-15C, the current regulation loop depicted in FIG. 16C, etc.) to effectuate safe operation of the LDO circuit 148, 1600. Advantageously, the transition from the voltage regulation loop to the current regulation loop does not generate oscillatory behavior (e.g., an oscillatory waveform) in response to transitioning from the voltage regulation loop (e.g., prior to the second short-circuit at 10 μs) to the current regulation loop (e.g., at 10 μs, after 10 μs, etc.) and, thus, improve operation of the LDO circuit 148, 1600 during various operating conditions.

Figure 21A:
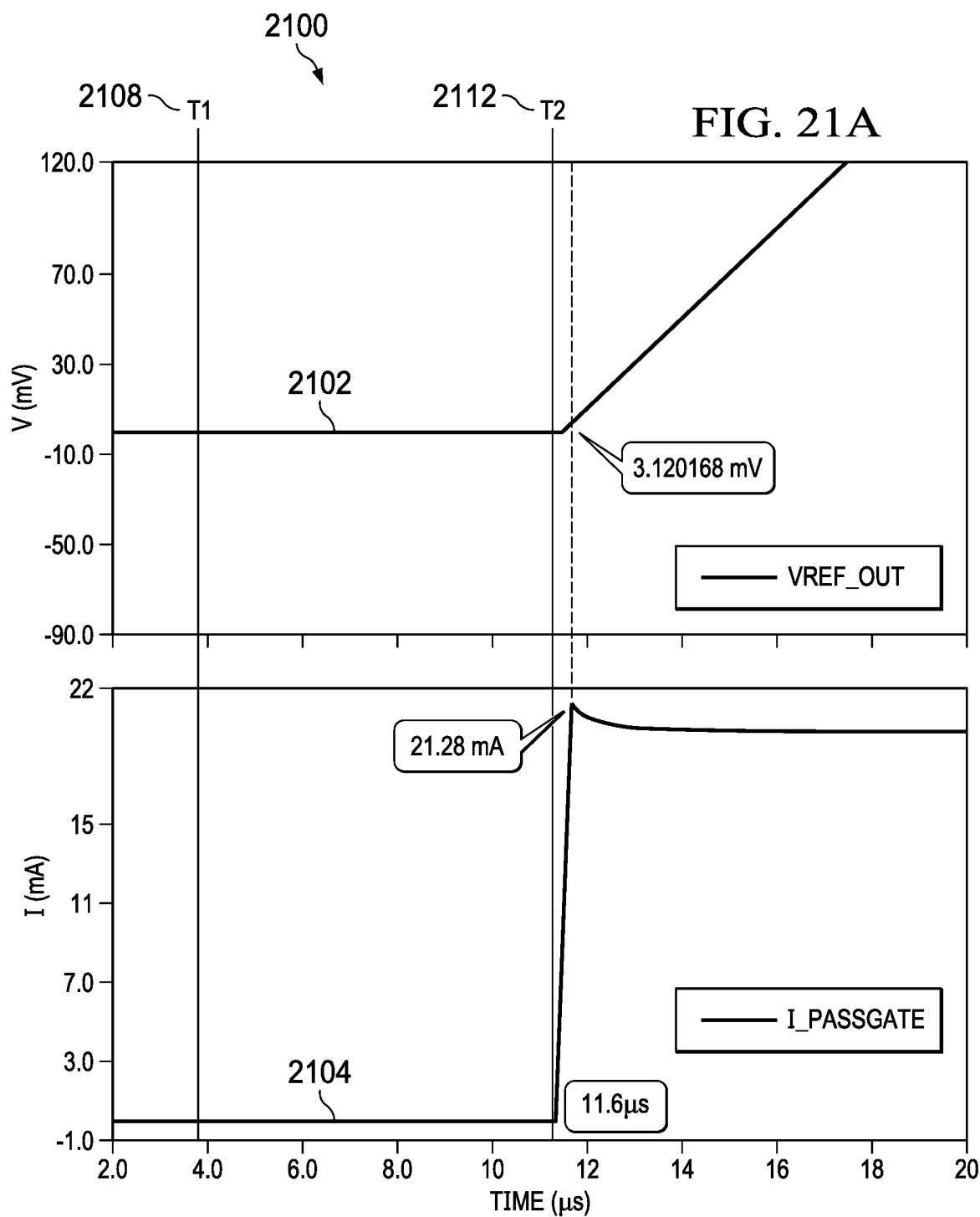

FIG. 21A depicts a first graph 2100 of an example voltage waveform 2102 and an example current waveform 2104 associated with the LDO circuit 148 of FIGS. 1 and/or 15A-15C and/or the second LDO circuit 1600 of FIGS. 16A-16C during an example transition operation. FIG. 21B depicts a second graph 2110 including the voltage waveform 2102 and the current waveform 2104 of FIG. 21A. Further depicted in FIG. 21B is an example current regulation loop indicator waveform 2106. The first graph 2100 of FIG. 21A is a zoomed-in portion of the second graph 2110.

In the illustrated examples of FIGS. 21A-21B, the voltage waveform 2102 is an LDO output voltage, such as VOUT 1558 of FIGS. 15A-15C. In the illustrated examples of FIGS. 21A-21B, the current waveform 2104 is a pass-gate current, such as a current at the node 1535 of FIGS. 15A-15C.

In the illustrated examples of FIGS. 21A-21B, the LDO circuit 148, 1600 is turned off and/or otherwise disabled prior to a first example time (T1) 2108. At a second example time (T2) 2112, the LDO circuit 148, 1600 is turned on and/or otherwise enabled. Advantageously, the current regulation loop (e.g., the current regulation loop 1580 of FIGS. 15A-15C, the current regulation loop depicted in FIG. 16C, etc.) is engaged substantially immediately in response to turning on and/or otherwise enabling the LDO circuit 148, 1600. Advantageously, the LDO circuit 148, 1600 engaging the current regulation loop at the second time 2112 does not generate oscillatory behavior and, thus, does not generate spikes in voltage (e.g., a spike in the voltage waveform 2102) and/or current (e.g., a spike in the current waveform 2104).

At the second time 2112, the LDO circuit 148, 1600 is in current regulation mode because the output voltage is not in steady state. The LDO circuit 148, 1600 is in current regulation mode from the second time 2112 until a third example time (T3) 2114, in response to the LDO output voltage meeting and/or otherwise satisfying an LDO output threshold. Advantageously, the hand-off, transition, etc., from the current regulation mode (e.g., the current regulation loop 1580 of FIGS. 15A-15C, the current regulation loop depicted in FIG. 16C, etc., being operative) to the voltage regulation mode (e.g., the voltage regulation loop 1570 of FIGS. 15A-15C, the voltage regulation loop depicted in FIG. 16B, etc., being operative) at the third time 2114 does not generate oscillatory behavior and, thus, does not generate spikes in voltage (e.g., a spike in the voltage waveform 2102) and/or current (e.g., a spike in the current waveform 2104).

Figure 22:
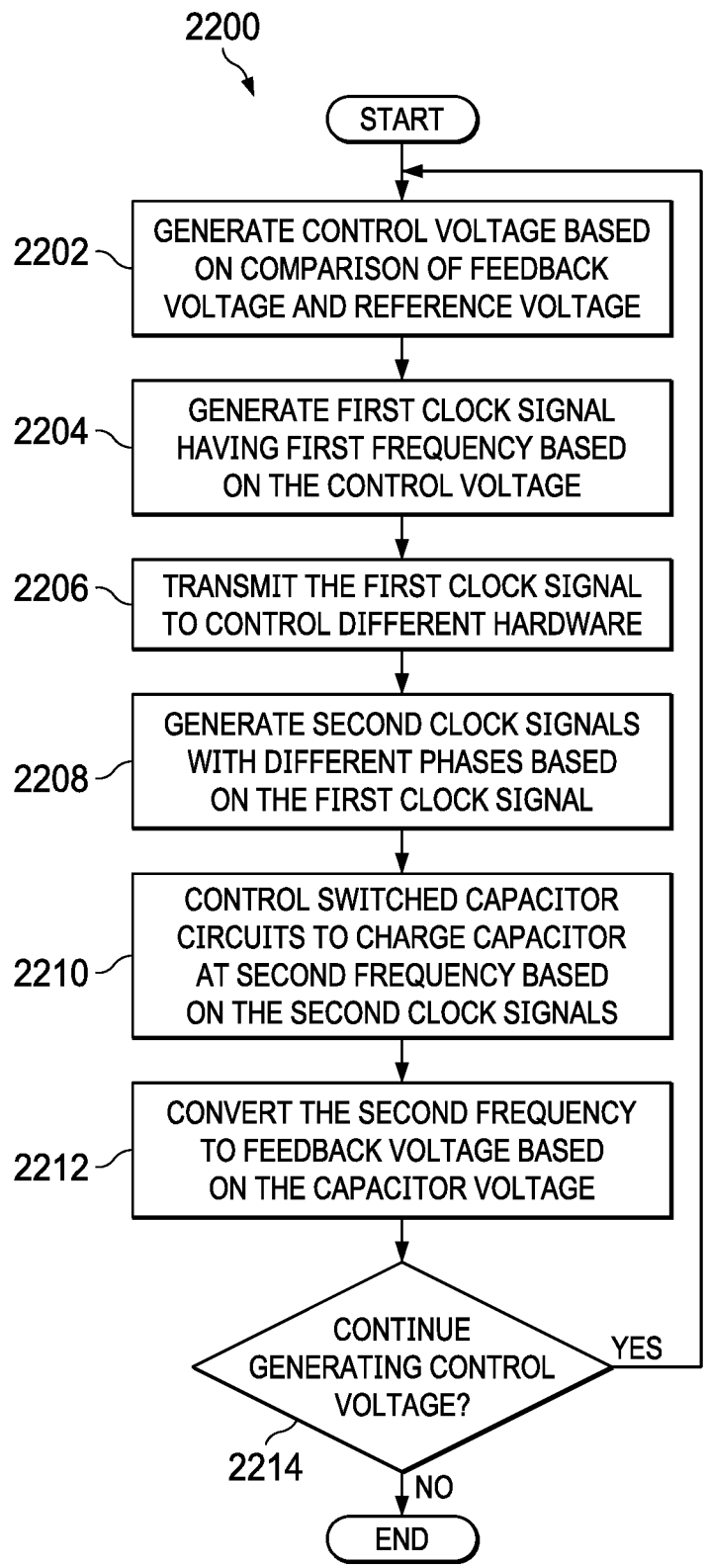
FIG. 22 is a flowchart representative of an example process that may be carried out while utilizing machine readable instructions that can be executed and/or hardware configured to implement the example FLL circuit of FIGS. 1 and/or 2 to generate an example clock signal.

Flowcharts representative of example processes that may be carried out while utilizing example hardware logic, example machine readable instructions (e.g., hardware readable instructions), example hardware implemented state machines, and/or any combination thereof for implementing the example FLL circuit 110A, 110B of FIGS. 1 and/or 2, and/or the example LDO circuit 148 of FIGS. 1, 15A-15C, and/or the second example LDO circuit 1600 of FIGS. 16A-16C are shown in FIGS. 22 and/or 23. The example machine readable instructions may be one or more executable programs or portion(s) of an executable program for execution by programmable processor(s), programmable controller(s), GPU(s), DSP(s), ASIC(s), PLD(s), and/or FPLD(s). The program may be embodied in software stored on a non-transitory computer readable storage medium such as a non-volatile memory, volatile memory, etc., but the entire program and/or parts thereof could alternatively be executed by any other device (e.g., programmable device) and/or embodied in firmware or dedicated hardware. Further, although the example program is described with reference to the flowcharts illustrated in FIGS. 22 and/or 23, many other methods of implementing the example FLL circuit 110A, 110B of FIGS. 1 and/or 2, and/or the example LDO circuit 148 of FIGS. 1, 15A-15C, and/or the second example LDO circuit 1600 of FIGS. 16A-16C may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 22-23 may be implemented using executable instructions (e.g., computer, machine, and/or hardware readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 22 is a flowchart representative of an example process 2200 that may be carried out while utilizing machine readable instructions that can be executed and/or hardware configured to implement the FLL circuit 110A, 110B of FIGS. 1 and/or 2 to generate the FLL output signal 226 of FIG. 2. The example process 2200 of FIG. 22 begins at block 2202, at which the FLL circuit 110A, 110B generates a control voltage based on a comparison of a feedback voltage and a reference voltage. For example, the amplifier 204 (FIG. 2) can generate the control voltage 222 (FIG. 2) based on a comparison of VREF 220 (FIG. 2) and VFB 232 (FIG. 2).

At block 2204, the FLL circuit 110A, 110B generates a first clock signal having a first frequency based on the control voltage. For example, the VCO 206 (FIG. 2) can generate the VCO output signal 224 (FIG. 2) having a first frequency (e.g., fvco) based on the control voltage 222.

At block 2206, the FLL circuit 110A, 110B transmits the first clock signal to control different hardware. For example, the clock divider circuit 208 (FIG. 2) can transmit the VCO output signal 224 as the FLL output signal 226 to control and/or otherwise invoke operation of a different component of the isolated gate driver integrated device 100 of FIG. 1.

At block 2208, the FLL circuit 110A, 110B generates second clock signals with different phases based on the first clock signal. For example, the clock divider circuit 208 can generate the clock signals 230A-D of FIG. 2 based on the VCO output signal 224 and/or the FLL output signal 226.

At block 2210, the FLL circuit 110A, 110B controls switched capacitor circuits to charge a capacitor at a second frequency based on the second clock signals. For example, the F2V converter 210 (FIG. 2) can control one(s) of the switched capacitor circuits 302, 304, 306, 308 of FIG. 3 to charge the fifth capacitor 350 of FIG. 3 at a second frequency greater than the first frequency. In such examples, the second frequency can be at least double the first frequency.

At block 2212, the FLL circuit 110A, 110B converts the second frequency to a feedback voltage based on the capacitor voltage. For example, at least one of the third switched capacitor circuit 306 or the fourth switched capacitor circuit 308 can convert the second frequency associated with one(s) of the clock signals 230A-D to generate VFB 232 based on Vx 325 (FIG. 3).

At block 2214, the FLL circuit 110A, 110B determines whether to continue generating the control voltage. For example, the FLL circuit 110A, 110B can determine to continue generating the control voltage 222 to cause generation of the FLL output signal 226. If, at block 2214, the FLL circuit 110A, 110B determines to continue generating the control voltage, control returns to block 2202 to generate the control voltage based on the comparison of the feedback voltage and the reference voltage. If, at block 2214, the FLL circuit 110A, 110B determines not to continue generating the control voltage, the example process 2200 of FIG. 22 concludes.

Figure 23:
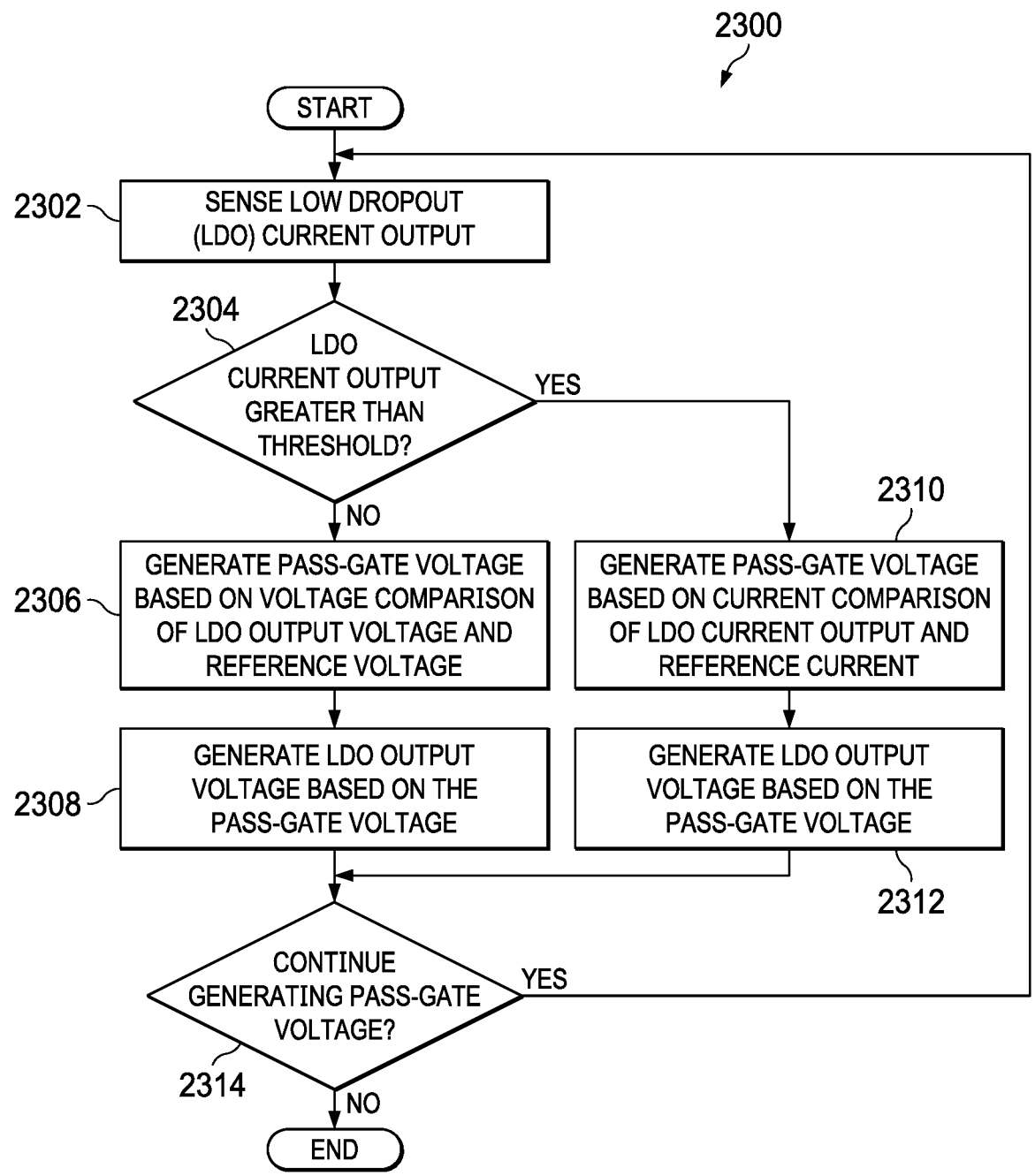
FIG. 23 is a flowchart representative of an example process that may be carried out while utilizing machine readable instructions that can be executed and/or hardware configured to implement the example LDO circuit of FIGS. 1, 15A-15C, and/or the second example LDO circuit of FIGS. 16A-16C to regulate a voltage.

FIG. 23 is a flowchart representative of an example process 2300 that may be carried out while utilizing machine readable instructions that can be executed and/or hardware configured to implement the example LDO circuit 148 of FIGS. 1, 15A-15C, and/or the second example LDO circuit 1600 of FIGS. 16A-16C to regulate a voltage. The example process 2300 of FIG. 23 begins at block 2302, at which the LDO circuit 148, 1600 senses a low dropout (LDO) current output. For example, at least one of −Gmp 1514, −Gmp/N 1516, or Gm5 1510 can sense a current delivered to the second terminal 1556 of FIGS. 15A-15C.

At block 2304, the LDO circuit 148, 1600 determines whether the LDO current output is greater than a threshold. For example, Gm5 1510 compare a first current from −Gmp 1514 and a second current from −Gmp/N 1516. In such examples, Gm6 1512 can generate a current based on the comparison. In some such examples, −Gm4 1508 can be activated and/or otherwise enabled in response to the current from Gm6 1512 being greater than the reference current 1548 (FIGS. 15A-15C).

If, at block 2304, the LDO circuit 148, 1600 determines that the LDO current output is not greater than the threshold, then, at block 2306, the LDO circuit 148, 1600 generates a pass-gate voltage based on a voltage comparison of the LDO output voltage and the reference voltage. For example, the LDO circuit 148 can generate Vgate of FIGS. 15A-15C using the voltage regulation loop 1570 of FIGS. 15A-15C.

In response to generating the pass-gate voltage based on the voltage comparison at block 2306, the LDO circuit 148, 1600 generates an LDO output voltage based on the pass-gate voltage at block 2308. For example, the LDO circuit 148, 1600 can generate VOUT 1558 (FIGS. 15A-15C) based on Vgate. In response to generating the LDO output voltage based on the pass-gate voltage, control proceeds to block 2314 to determine whether to continue generating the pass-gate voltage.

If, at block 2304, the LDO circuit 148, 1600 determines that the LDO current output is greater than the threshold, control proceeds to block 2310 to generate the pass-gate voltage based on a current comparison of the LDO current output and a reference current. For example, the LDO circuit 148 can generate Vgate of FIGS. 15A-15C using the current regulation loop 1580 of FIGS. 15A-15C.

In response to generating the pass-gate voltage based on the current comparison at block 2310, the LDO circuit 148, 1600 generates an LDO output voltage based on the pass-gate voltage at block 2312. For example, the LDO circuit 148, 1600 can generate VOUT 1558 (FIGS. 15A-15C) based on Vgate. In response to generating the LDO output voltage based on the pass-gate voltage, control proceeds to block 2314 to determine whether to continue generating the pass-gate voltage. For example, the LDO circuit 148, 1600 can determine whether to continue generating Vgate. If, at block 2314, the LDO circuit 148, 1600 determines to continue generating the pass-gate voltage, control returns to block 2302 to sense the LDO current output (e.g., the LDO current output based on an adjusted or modified pass-gate voltage), otherwise the example process 2300 of FIG. 23 concludes.

From the foregoing, it will be appreciated that example system, methods, apparatus, and articles of manufacture have been disclosed that reduce and/or otherwise eliminate ripples from inputs of amplifiers in a FLL circuit. Example FLL circuits described herein include an example F2V converter that increases an effective switching frequency generated by the FLL circuits and uses an example switched capacitor notch filter to reduce and/or otherwise remove all harmonics of ripples generated by the FLL circuits. Example FLL circuits described herein generate inputs to amplifiers that substantially only include a DC component. Example FLL circuits described herein include fewer filtering components, capacitors, etc., and thus, have a reduced area (e.g., silicon area, semiconductor area, etc.) compared to prior FLL circuits. Advantageously, example FLL circuits described herein do not require a large decoupling capacitor on the reference node. Advantageously, example FLL circuits described herein do not require a relatively large op-amp output capacitor or need to add a resistor to generate a zero for compensation and/or low-pass filtering.

Example FLL circuits described herein effectuate improved loop compensation due to a higher non-dominant pole in response to the F2V converters described herein increasing the effective frequency generated by the FLL circuits. Example FLL circuits described herein include an example F2V converter that can improve DC stability by eliminating ripples delivered to amplifier inputs. Example FLL circuits described herein do not require relatively large filtering at an input of a voltage-controlled oscillator compared to prior FLL circuits. Example FLL circuits described herein effectuate faster loop dynamics, such as start-up time, in response to smaller RC times (e.g., in response to smaller reference capacitances and higher loop bandwidths) described herein.

From the foregoing, it will be appreciated that example system, methods, apparatus, and articles of manufacture have been disclosed that improve operation of an LDO circuit by effectuating a smooth transition between a voltage regulation loop and a current regulation loop. Example LDO circuits described herein use a pole-splitting method to compensate two high impedance nodes in the current regulation loop while using a portion of the voltage regulation loop to create a second stage of an amplifier included in the LDO circuits. Advantageously, example LDO circuits can use the pole-splitting method to minimize and/or otherwise reduce an interaction between the voltage regulation loop and the current regulation loop. Advantageously, by minimizing and/or otherwise reducing the interaction, the stability of each loop can be independently controlled.

Example frequency lock loop circuits, low voltage dropout regulator circuits, and related methods are disclosed herein. Further examples and combinations thereof include the following:

Example 1 includes a gate driver integrated circuit comprising a first die including a frequency lock loop (FLL) circuit, the FLL circuit to generate a first clock signal having a first phase and a first frequency, a second clock signal having a second phase and the first frequency, the first phase different from the second phase, and control a plurality of switching networks to increase the first frequency to a second frequency and generate a feedback voltage based on the second frequency, and a second die coupled to the first die, the second die including a low dropout circuit and a driver, the driver configured to control a transistor based on the first frequency, the second die configured to be coupled to the transistor, the low dropout circuit to generate an output voltage based on a pass-gate voltage, the low dropout circuit to generate the pass-gate voltage in response to an output current satisfying a current threshold.

Example 2 includes the gate driver integrated circuit of example 1, wherein the plurality of the switching networks includes a first switching network, a second switching network, a third switching network, and a fourth switching network, and the FLL circuit includes a clock divider circuit configured to generate the first clock signal and the second clock signal, and a frequency-to-voltage (F2V) circuit including the plurality of the switching networks, the F2V circuit configured to generate the feedback voltage by controlling the first switching network and the second switching network to increase the first frequency to the second frequency, and controlling the third switching network and the fourth switching network to generate the feedback voltage based on the first frequency and the second frequency, and an amplifier configured to generate a control signal based on the feedback voltage, the clock divider circuit to generate the first clock signal and the second clock signal based on the control signal.

Example 3 includes the gate driver integrated circuit of example 2, wherein the first switching network includes a first switch configured to switch in response to the first clock signal, a second switch coupled to the first switch, the second switch configured to switch in response to the second clock signal, and a first capacitor coupled to the first switch and the second switch, the first capacitor to deliver charge to a second capacitor in response to turning off the first switch and turning on the second switch.

Example 4 includes the gate driver integrated circuit of example 1, wherein the low dropout circuit includes a voltage regulation loop including a first amplifier having a first input, a second input, and a first output, the first input coupled to a reference voltage, a buffer coupled to the first output, a second amplifier having a third input and a second output, the third input coupled to the buffer, a capacitor coupled to the second output, a third amplifier having a fourth input and a third output, the fourth input coupled to the capacitor, the third output coupled to the buffer, and a beta circuit coupled to the second input.

Example 5 includes the gate driver integrated circuit of example 1, wherein the low dropout circuit includes a current regulation loop including a first amplifier having a first input, a second input, and a first output, a second amplifier having a third input and a second output, the second output coupled to the first input, a third amplifier having a fourth input and a third output, the fourth input coupled to the third input, the third output coupled to the second input, a fourth amplifier having a fifth input and a fourth output, the fifth input coupled to the first output and the third output, a fifth amplifier having a sixth input and a fifth output, the sixth input coupled to the fourth output, a sixth amplifier having a seventh input and a sixth output, the seventh input coupled to the fifth output, a buffer having an eighth input and a seventh output, the eighth input coupled to the sixth output, and a capacitor coupled to the third input, the fourth input, the fifth output, and the seventh output.

Example 6 includes a frequency lock loop circuit comprising an amplifier having an amplifier input and an amplifier output, an oscillator coupled to the amplifier, the oscillator having an oscillator input and an oscillator output, the oscillator input coupled to the amplifier output, a clock divider circuit coupled to the oscillator, the clock divider circuit having a clock divider circuit input and one or more clock divider circuit outputs, the clock divider circuit input coupled to the oscillator output, and a frequency-to-voltage (F2V) converter coupled to the clock divider circuit and the amplifier, the F2V converter having an F2V converter input and an F2V converter output, the F2V converter input coupled to the one or more clock divider circuit outputs, the F2V converter output coupled to the amplifier input.

Example 7 includes the frequency lock loop circuit of example 6, wherein the F2V converter includes a first switching network, a second switching network coupled to the first switching network, a third switching network coupled to the first switching network and the second switching network, a fourth switching network coupled to the first switching network, the second switching network, and the third switching network, a resistor coupled to the first through fourth switching networks, and a capacitor coupled to the resistor and the first through fourth switching networks.

Example 8 includes the frequency lock loop circuit of example 7, wherein the capacitor is a first capacitor, and the first switching network includes a first switch coupled to a first clock divider circuit output of the one or more the clock divider circuit outputs, a second switch coupled to the first switch, the resistor, and the first capacitor, and a second capacitor coupled to the first switch and the second switch.

Example 9 includes the frequency lock loop circuit of example 8, wherein the first switch is configured to switch in response to a first clock signal having a first phase, and the second switch is configured to switch in response to a second clock signal having a second phase different from the first phase, the first clock signal from the first clock divider circuit output, the second clock signal from a second clock divider circuit output.

Example 10 includes the frequency lock loop circuit of example 7, wherein the capacitor is a first capacitor, and wherein the first switching network includes a first switch configured to switch in response to a first clock signal having a first phase, a second switch coupled to the first switch, the second switch configured to switch in response to a second clock signal having a second phase different from the first phase, and a second capacitor coupled to the first switch and the second switch, the second capacitor to deliver charge to the first capacitor in response to turning off the first switch and turning on the second switch.

Example 11 includes the frequency lock loop circuit of example 10, wherein the second switching network includes a third switch configured to switch in response to the second clock signal, a fourth switch coupled to the third switch, the fourth switch configured to switch in response to the first clock signal, and a third capacitor coupled to the third switch and the fourth switch, the third capacitor to deliver charge to the first capacitor in response to turning off the third switch and turning on the fourth switch.

Example 12 includes the frequency lock loop circuit of example 7, wherein the first switching network includes a first switch and a second switch, the second switch coupled to the first switch, the resistor, and the capacitor, the second switching network includes a third switch and a fourth switch, the fourth switch coupled to the second switch, the third switch, the resistor, and the capacitor, the third switching network includes a fifth switch and a sixth switch, the fifth switch coupled to the second switch, the fourth switch, the resistor, and the capacitor, and the fourth switching network includes a seventh switch and an eighth switch, the seventh switch coupled to the eighth switch, the second switch, the fourth switch, the fifth switch, the resistor, and the capacitor.

Example 13 includes the frequency lock loop circuit of example 12, wherein the capacitor is a first capacitor, and further including a second capacitor coupled to the sixth switch, the eighth switch, and the amplifier input.

Example 14 includes a low dropout circuit comprising a voltage regulation loop configured to be coupled to a terminal of an integrated circuit, the voltage regulation loop to generate a pass-gate voltage based on a comparison of a reference voltage and an output voltage of the low dropout circuit, and a current regulation loop configured to be coupled to the terminal, a portion of the current regulation loop included in the voltage regulation loop, the current regulation loop to generate the pass-gate voltage in response to an output current of the low dropout circuit satisfying a current threshold, the output voltage based on the pass-gate voltage.

Example 15 includes the low dropout circuit of example 14, wherein the voltage regulation loop includes a first amplifier having a first input, a second input, and a first output, the first input coupled to a reference voltage, a buffer coupled to the first output, a second amplifier having a third input and a second output, the third input coupled to the buffer, the second output configured to be coupled to the terminal, a capacitor coupled to the second output, a third amplifier having a fourth input and a third output, the fourth input coupled to the capacitor, the third output coupled to the buffer, and a beta circuit coupled to the second input and configured to be coupled to the terminal.

Example 16 includes the low dropout circuit of example 15, wherein the buffer and the second amplifier are included in the current regulation loop.

Example 17 includes the low dropout circuit of example 15, wherein the first amplifier includes a first PMOS transistor coupled to a second PMOS transistor, the second amplifier includes a third PMOS transistor, the third amplifier includes a first NMOS transistor, the first NMOS transistor coupled to the first PMOS transistor, the beta circuit includes a first resistor coupled to a second resistor, the first resistor coupled to the third PMOS transistor, the second PMOS transistor coupled to the first resistor and the second resistor, and the buffer includes a first current source, a fourth PMOS transistor, and a second NMOS transistor, the first current source coupled to the second NMOS transistor and the third PMOS transistor, the fourth PMOS transistor coupled to the first NMOS transistor.

Example 18 includes the low dropout circuit of example 14, wherein the current regulation loop includes a first amplifier having a first input, a second input, and a first output, the first input configured to be coupled to the terminal, a second amplifier having a third input and a second output, the second output coupled to the first input and configured to be coupled to the terminal, a third amplifier having a fourth input and a third output, the fourth input coupled to the third input, the third output coupled to the second input, a fourth amplifier having a fifth input and a fourth output, the fifth input coupled to the first output and the third output, a fifth amplifier having a sixth input and a fifth output, the sixth input coupled to the fourth output, a sixth amplifier having a seventh input and a sixth output, the seventh input coupled to the fifth output, a buffer having an eighth input and a seventh output, the eighth input coupled to the sixth output, and a capacitor coupled to the third input, the fourth input, the fifth output, and the seventh output.

Example 19 includes the low dropout circuit of example 18, wherein the first amplifier includes a current amplifier and a first PMOS transistor, the current amplifier having a first input, a second input, and an output, the output coupled to a first gate terminal of the first PMOS transistor, the second amplifier includes a second PMOS transistor, a first drain terminal of the second PMOS transistor coupled to the first input, the third amplifier includes a third PMOS transistor, a second gate terminal of the second PMOS transistor coupled to a third gate terminal of the third PMOS transistor, a second drain terminal of the third PMOS transistor coupled to the second input and a first source terminal of the first PMOS transistor, and the fourth amplifier includes an NMOS transistor, a fourth gate terminal of the NMOS transistor coupled to a third drain terminal of the NMOS transistor, the third drain terminal coupled to the first drain terminal.

Example 20 includes the low dropout circuit of example 18, wherein the fifth amplifier includes a first NMOS transistor having a first drain terminal, the sixth amplifier includes a first PMOS transistor having a first source terminal, a second drain terminal, and a first gate terminal, the first gate terminal coupled to the first drain terminal, and the buffer includes a current source, a second PMOS transistor having a second gate terminal, a second source terminal, and a third drain terminal, the second gate terminal coupled to the second drain terminal, the second source terminal coupled to the current source, and a second NMOS transistor having a third gate terminal and a fourth drain terminal, the third gate terminal coupled to the third drain terminal, the fourth drain terminal coupled to the current source and the second source terminal.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A gate driver integrated circuit comprising:
    a first die including a frequency lock loop (FLL) circuit, the FLL circuit including:
    clock divider circuitry producing a first clock signal having a first phase and a first frequency, and a second clock signal having a second phase and the first frequency, the first phase different from the second phase; and
    capacitor switching networks to increase the first frequency to a second frequency, and generate a feedback voltage based on the second frequency; and
    a second die coupled to the first die, the second die including:
        driver circuitry having an output adapted to be coupled to a pass-gate transistor and configured to control the pass gate transistor based on the first frequency; and
        a low dropout circuit, the low dropout circuit to generate a pass-gate voltage based on an output voltage of the pass-gate transistor, the low dropout circuit to generate the pass-gate voltage in response to an output current of the pass-gate transistor satisfying a current threshold.

2. The gate driver integrated circuit of claim 1, in which the capacitor switching networks include a first switching network, a second switching network, a third switching network, and a fourth switching network, and the FLL circuit includes:
a clock divider circuit configured to generate the first clock signal and the second clock signal, and
a frequency-to-voltage (F2V) circuit including the capacitor switching networks, the F2V circuit configured to generate the feedback voltage by:
controlling the first switching network and the second switching network to increase the first frequency to the second frequency; and
controlling the third switching network and the fourth switching network to generate the feedback voltage based on the first frequency and the second frequency; and
an amplifier configured to generate a control signal based on the feedback voltage, the clock divider circuit to generate the first clock signal and the second clock signal based on the control signal.

3. The gate driver integrated circuit of claim 2, in which the first switching network includes:
a first switch configured to switch in response to the first clock signal;
a second switch coupled to the first switch, the second switch configured to switch in response to the second clock signal; and
a first capacitor coupled to the first switch and the second switch, the first capacitor to deliver charge to a second capacitor in response to turning off the first switch and turning on the second switch.

4. The gate driver integrated circuit of claim 1, in which the low dropout circuit includes a voltage regulation loop including:
a first amplifier having a first input, a second input, and a first output, the first input coupled to a reference voltage;
a buffer coupled to the first output;
a second amplifier having a third input and a second output, the third input coupled to the buffer;
a capacitor coupled to the second output;
a third amplifier having a fourth input and a third output, the fourth input coupled to the capacitor, the third output coupled to the buffer; and
a beta circuit coupled to the second input.

5. The gate driver integrated circuit of claim 1, in which the low dropout circuit includes a current regulation loop including:
a first amplifier having a first input, a second input, and a first output;
a second amplifier having a third input and a second output, the second output coupled to the first input;
a third amplifier having a fourth input and a third output, the fourth input coupled to the third input, the third output coupled to the second input;
a fourth amplifier having a fifth input and a fourth output, the fifth input coupled to the first output and the third output;
a fifth amplifier having a sixth input and a fifth output, the sixth input coupled to the fourth output;
a sixth amplifier having a seventh input and a sixth output, the seventh input coupled to the fifth output;
a buffer having an eighth input and a seventh output, the eighth input coupled to the sixth output; and
a capacitor coupled to the third input, the fourth input, the fifth output, and the seventh output.

6. The gate driver integrated circuit of claim 1, in which the FLL includes:
reference generator circuitry having a reference voltage output;
comparator circuitry having an inverting input coupled to the reference voltage output, having a non-inverting feedback input, and having a control voltage output;
voltage controlled oscillator circuitry having an input coupled to the control voltage output and having an oscillator output;
clock divider circuitry having a first clock output, a second clock output, a third clock output, and a fourth clock output; and
frequency to voltage circuitry having inputs coupled to the clock outputs and having a feedback output coupled to the feedback input.

7. The gate driver integrated circuit of claim 6, in which the frequency to voltage circuitry includes the capacitor switching networks.

8. The gate driver integrated circuit of claim 7, in which the capacitor switching networks include:
a first network having a first output coupled to a node;
a second network having a second output coupled to the node;
a third network having a third input coupled to the node; and
a fourth network having a fourth input coupled to the node.

9. The gate driver integrated circuit of claim 8, including a resistor and capacitor network coupled to the node.

10. The gate driver integrated circuit of claim 8, in which the first network includes:
a first switch coupled to the first clock output;
a second switch coupled to the second clock output;
the first and second switches being coupled between a voltage rail and the first output; and
a first capacitor having a first terminal coupled to between the first switch and the second switch and to a reference voltage rail.

11. The gate driver integrated circuit of claim 10, in which the second network includes:
a third switch coupled to the second clock output;
a fourth switch coupled to the first clock output;
the third and fourth switches being coupled between the voltage rail and the second output; and
a second capacitor having a first terminal coupled to between the third switch and the fourth switch and to the reference voltage rail.

12. The gate driver integrated circuit of claim 11, in which the third network includes:
a fifth switch coupled to the third clock output;
a sixth switch coupled to the fourth clock output;
the fifth and sixth switches being coupled between the node and the feedback output; and
a third capacitor having a first terminal coupled to between the fifth switch and the sixth switch and to the reference voltage rail.

13. The gate driver integrated circuit of claim 12, in which the fourth network includes:
a seventh switch coupled to the fourth clock output;
an eighth switch coupled to the third clock output;
the seventh and eighth switches being coupled between the node and the feedback output; and a fourth capacitor having a first terminal coupled to between the seventh switch and the eighth switch and to the reference voltage rail.

14. The gate driver integrated circuit of claim 13, in which the first and second clock outputs carry clock signals that are of the same clock frequency and are 180 degrees out of phase with each other.

15. The gate driver integrated circuit of claim 14, in which the third and fourth clock outputs carry clock signals that are of the same clock frequency, are 180 degrees out of phase with each other, and are shifted on phase from the first and second clock signals.

16. The gate driver integrated circuit of claim 1, in which the capacitor switching networks generate a direct current feedback voltage.

* * * * *